(12) United States Patent
Tokutomi et al.

(10) Patent No.: US 12,068,044 B2
(45) Date of Patent: *Aug. 20, 2024

(54) MEMORY SYSTEM INCLUDING SEMICONDUCTOR MEMORY AND CONTROLLER CAPABLE OF DETERMINING NECESSARY SHIFTED BOUNDARY READ VOLTAGES IN A SHORT PERIOD OF TIME

(71) Applicant: KIOXIA CORPORATION, Tokyo (JP)

(72) Inventors: Tsukasa Tokutomi, Kanagawa (JP); Masanobu Shirakawa, Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/312,696

(22) Filed: May 5, 2023

(65) Prior Publication Data

US 2023/0274784 A1 Aug. 31, 2023

Related U.S. Application Data

(63) Continuation of application No. 17/696,339, filed on Mar. 16, 2022, now Pat. No. 11,682,464, which is a (Continued)

(30) Foreign Application Priority Data

Sep. 18, 2018 (JP) .................................. 2018-174175

(51) Int. Cl.
*G11C 16/04* (2006.01)
*G06F 11/10* (2006.01)
(Continued)

(52) U.S. Cl.
CPC .......... *G11C 16/34* (2013.01); *G06F 11/1068* (2013.01); *G11C 11/5628* (2013.01);
(Continued)

(58) Field of Classification Search
CPC . G11C 16/34; G11C 11/5628; G11C 11/5642; G11C 16/10; G11C 16/26;
(Continued)

(56) References Cited

U.S. PATENT DOCUMENTS 7,805,660 B2    9/2010   Hazama
7,859,932 B2   12/2010   Mokhlesi
(Continued)

FOREIGN PATENT DOCUMENTS

JP    2007-323731 A    12/2007
JP    2013-122804       6/2013
(Continued)

*Primary Examiner* — Tha-O H Bui
(74) *Attorney, Agent, or Firm* — Oblon, McClelland, Maier & Neustadt, L.L.P.

(57) ABSTRACT

According to one embodiment, a controller is configured to write four-bit data in each of memory cells, and read first data item from the memory cells through application of a first voltage to a word line. The controller is configured to read second data items by repeating a first operation of reading data including data of respective first bits of the memory cells through application of two voltages to the word line at different timings while changing the two voltages in each first operation from the two voltages in another first operation. The controller is configured to mask part of each of the second data items using the first data.

12 Claims, 37 Drawing Sheets

Related U.S. Application Data continuation of application No. 16/892,817, filed on Jun. 4, 2020, now Pat. No. 11,315,643, which is a continuation of application No. 16/291,281, filed on Mar. 4, 2019, now Pat. No. 10,714,192.

(51) Int. Cl.
| | | |
|---|---|---|
| *G11C 11/56* | (2006.01) | |
| *G11C 16/10* | (2006.01) | |
| *G11C 16/26* | (2006.01) | |
| *G11C 16/34* | (2006.01) | |
| *G11C 29/52* | (2006.01) | |

(52) U.S. Cl.
CPC .......... *G11C 11/5642* (2013.01); *G11C 16/10* (2013.01); *G11C 16/26* (2013.01); *G11C 29/52* (2013.01); *G11C 16/0483* (2013.01)

(58) Field of Classification Search
CPC ................ G11C 29/52; G11C 16/0483; G11C 2029/0411; G11C 7/1009; G11C 16/08; G11C 16/32; G06F 11/1068; G06F 11/1048
USPC .................................................... 365/185.03
See application file for complete search history.

(56) References Cited

U.S. PATENT DOCUMENTS

| | | | | |
|---|---|---|---|---|
| 8,027,208 | B2* | 9/2011 | Kim ...................... | G11C 16/08 |
| | | | | 365/189.16 |
| 8,031,530 | B2* | 10/2011 | Joo ........................ | G11C 16/26 |
| | | | | 365/185.25 |
| 8,848,453 | B2 | 9/2014 | Shen et al. | |
| 9,111,626 | B2 | 8/2015 | Kim et al. | |
| 9,564,240 | B2* | 2/2017 | Harada ................. | G11C 16/10 |
| 9,728,278 | B2* | 8/2017 | Muchherla ............. | G11C 29/42 |
| 10,381,096 | B2* | 8/2019 | Maejima ........... | G11C 16/3459 |
| 10,714,192 | B2 | 7/2020 | Tokutomi | |
| 2011/0007565 | A1 | 1/2011 | Hazama | |
| 2013/0148436 | A1 | 6/2013 | Kurosawa | |
| 2018/0138241 | A1 | 5/2018 | Pellizzer | |

FOREIGN PATENT DOCUMENTS

| | | |
|---|---|---|
| JP | 2014-086128 | 5/2014 |
| JP | 5638537 | 12/2014 |
| JP | 5992623 | 9/2016 |
| JP | 2018-110043 A | 7/2018 |

* cited by examiner

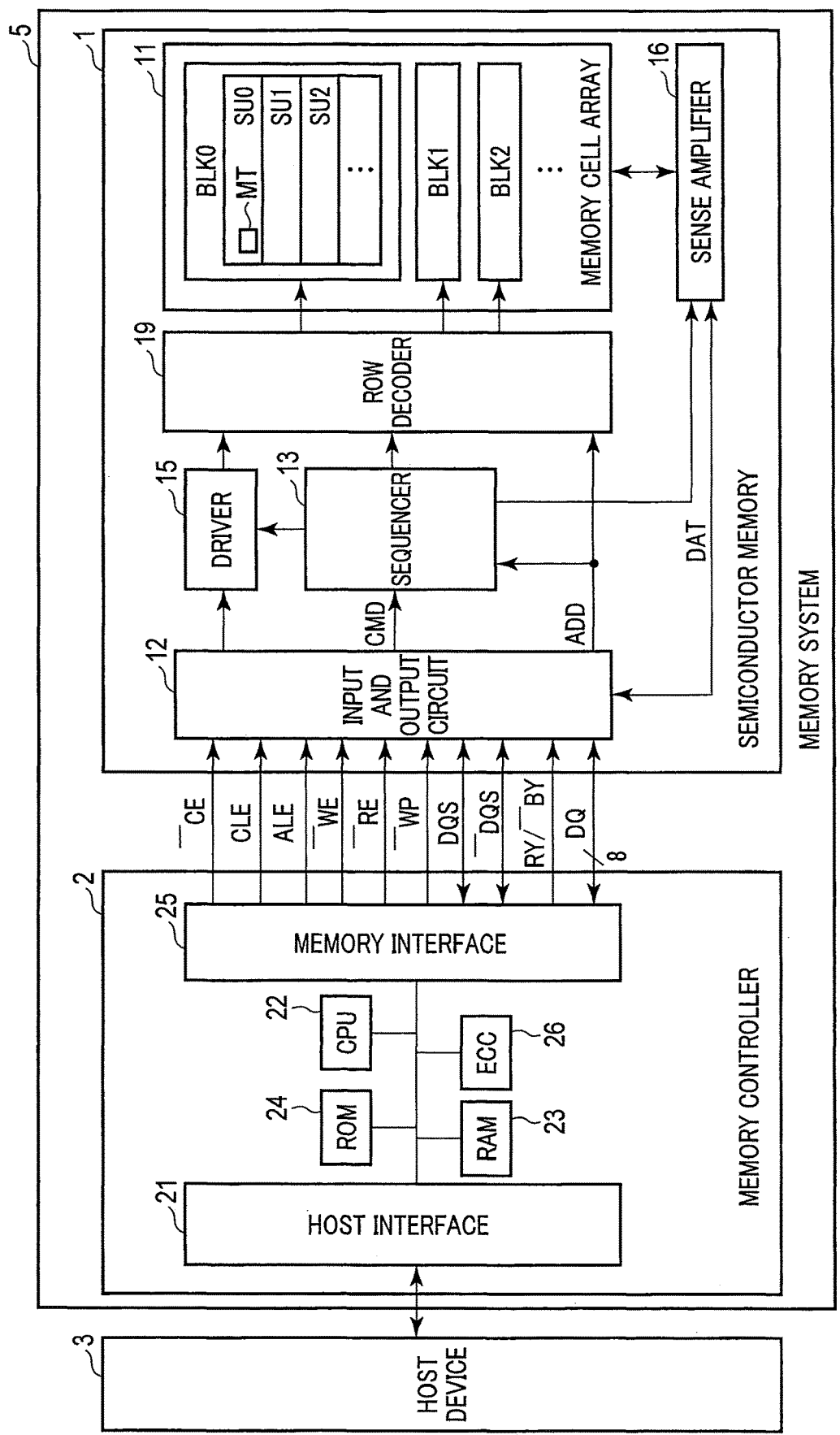
F I G. 1

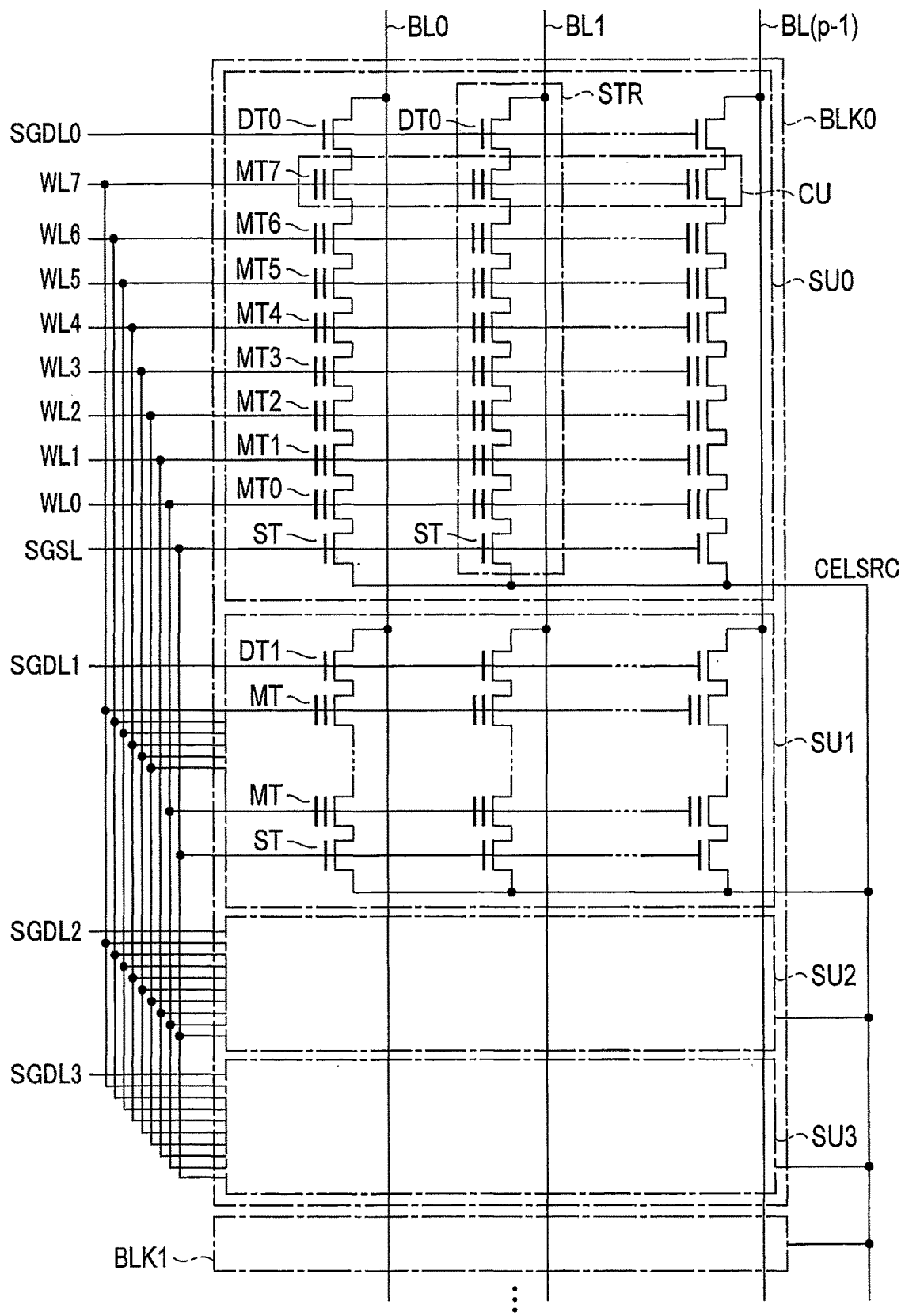
F I G. 2

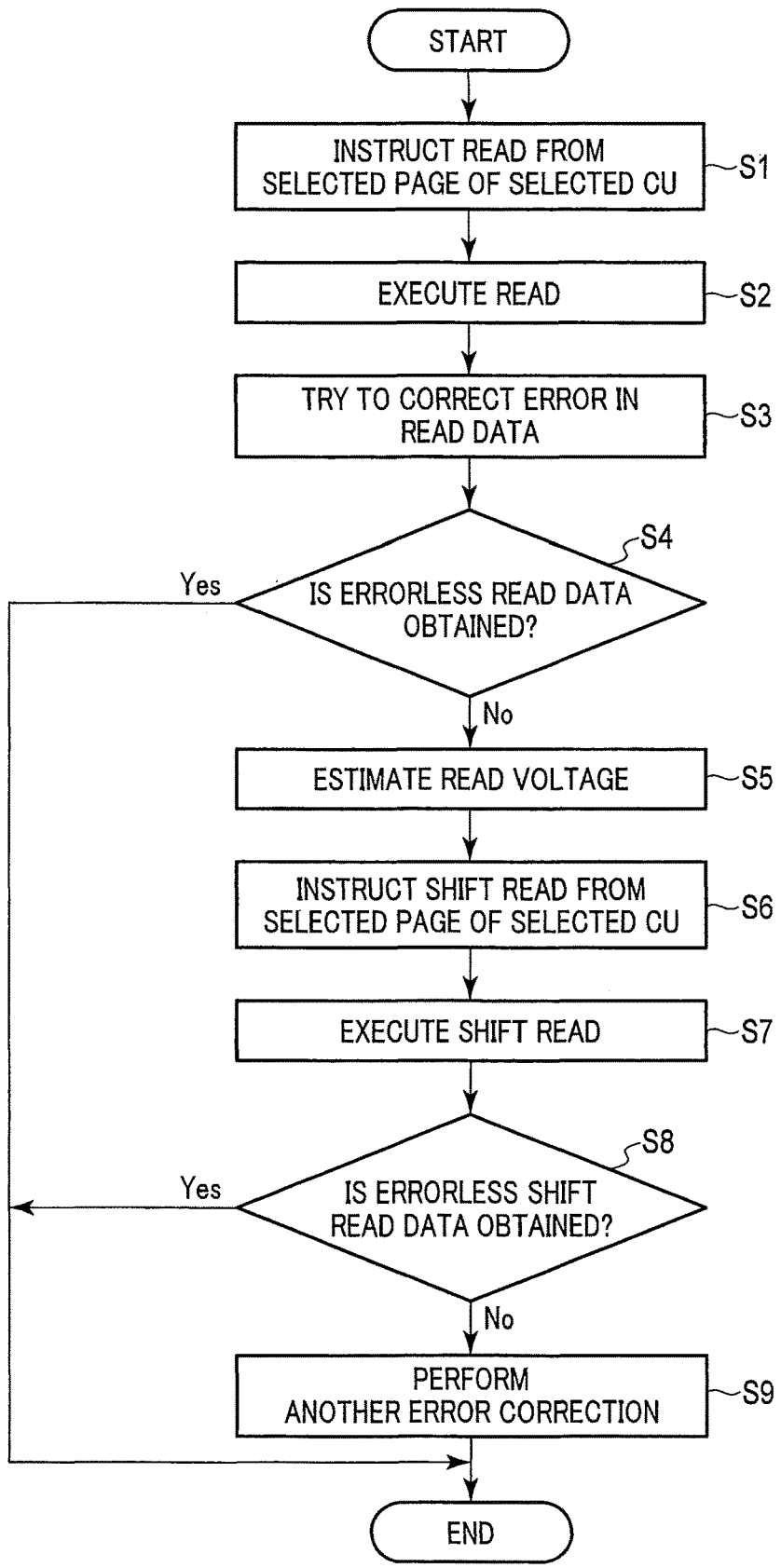
F I G. 5

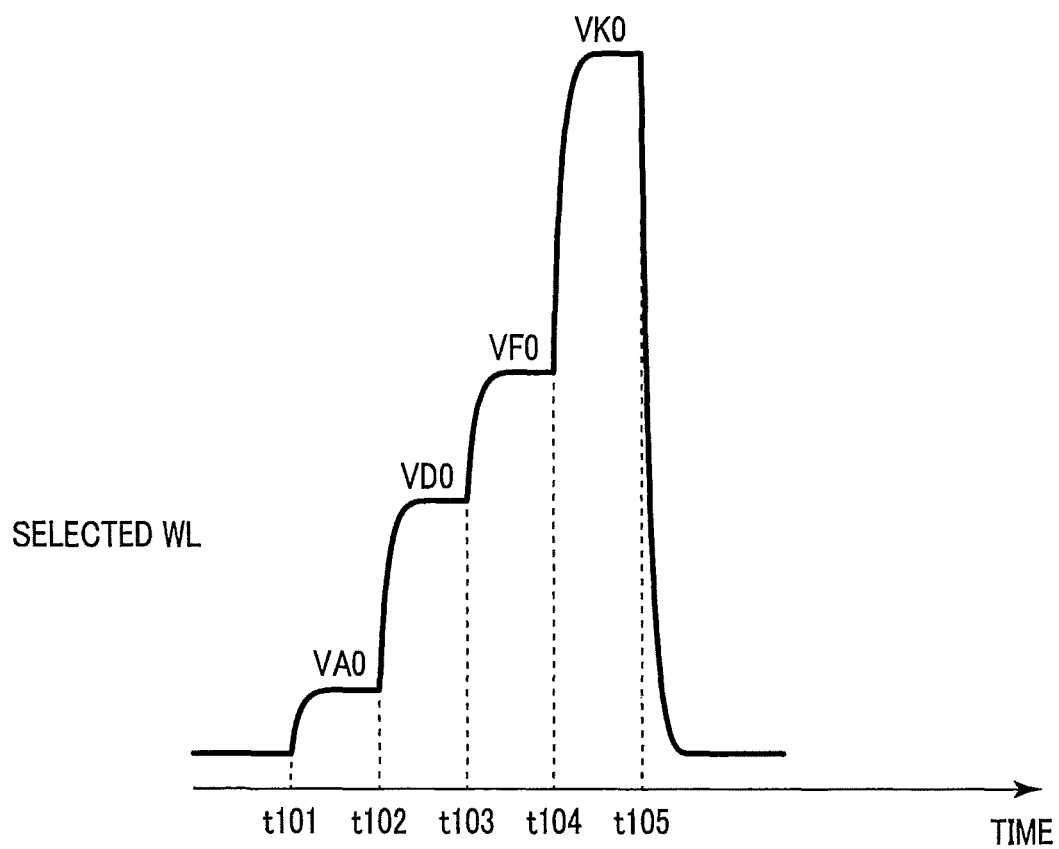
F I G. 6

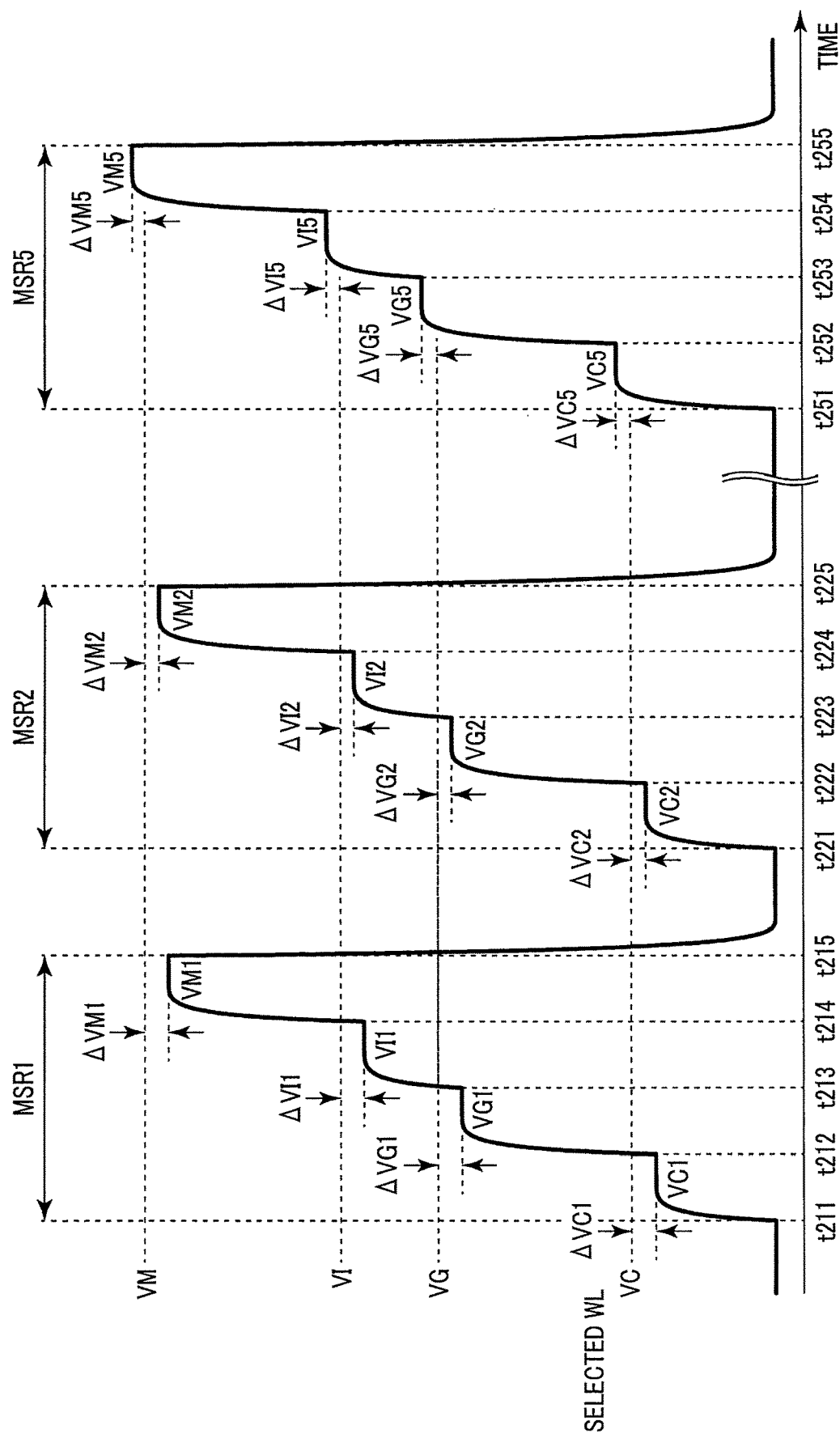
F I G. 19

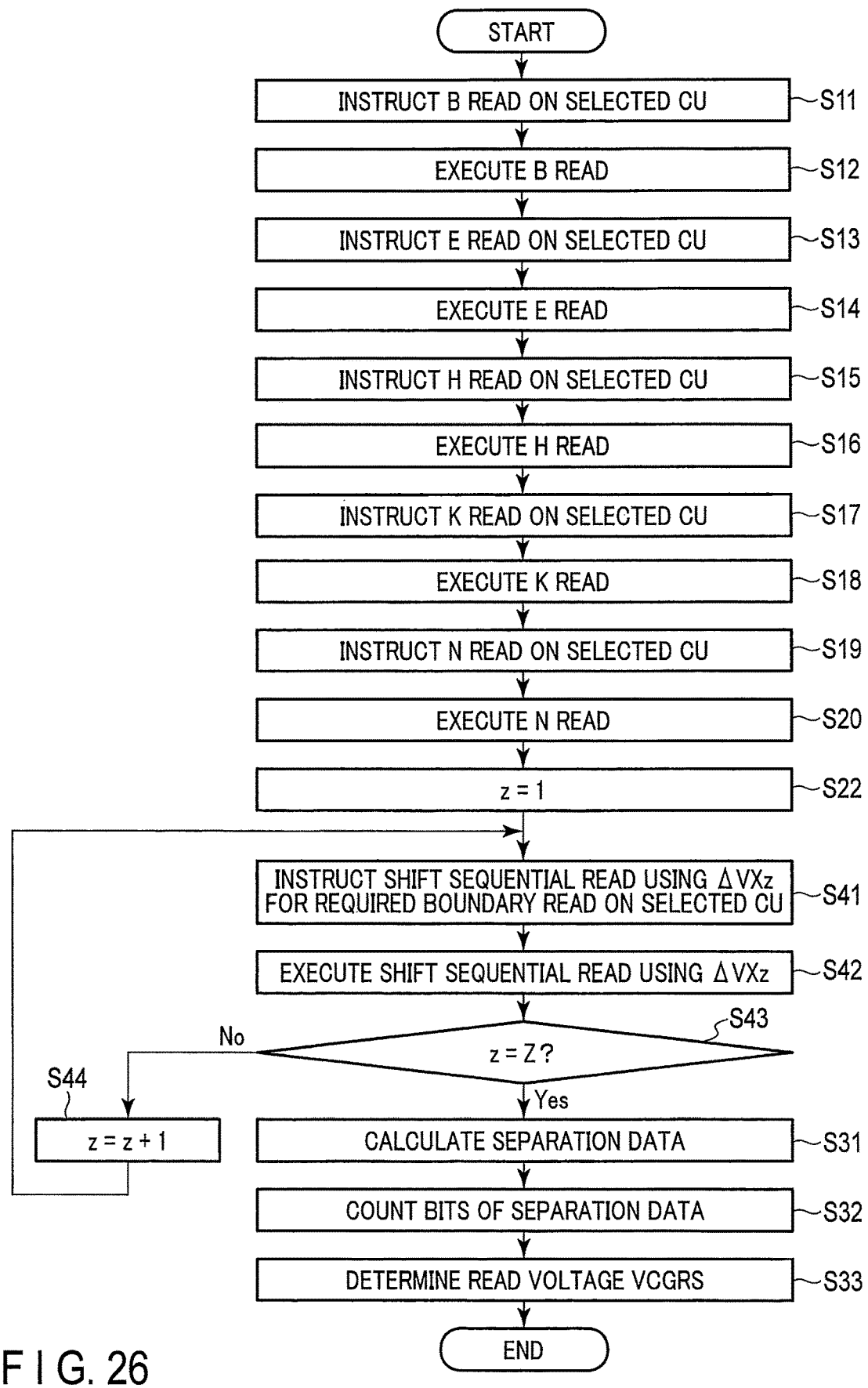
F I G. 26

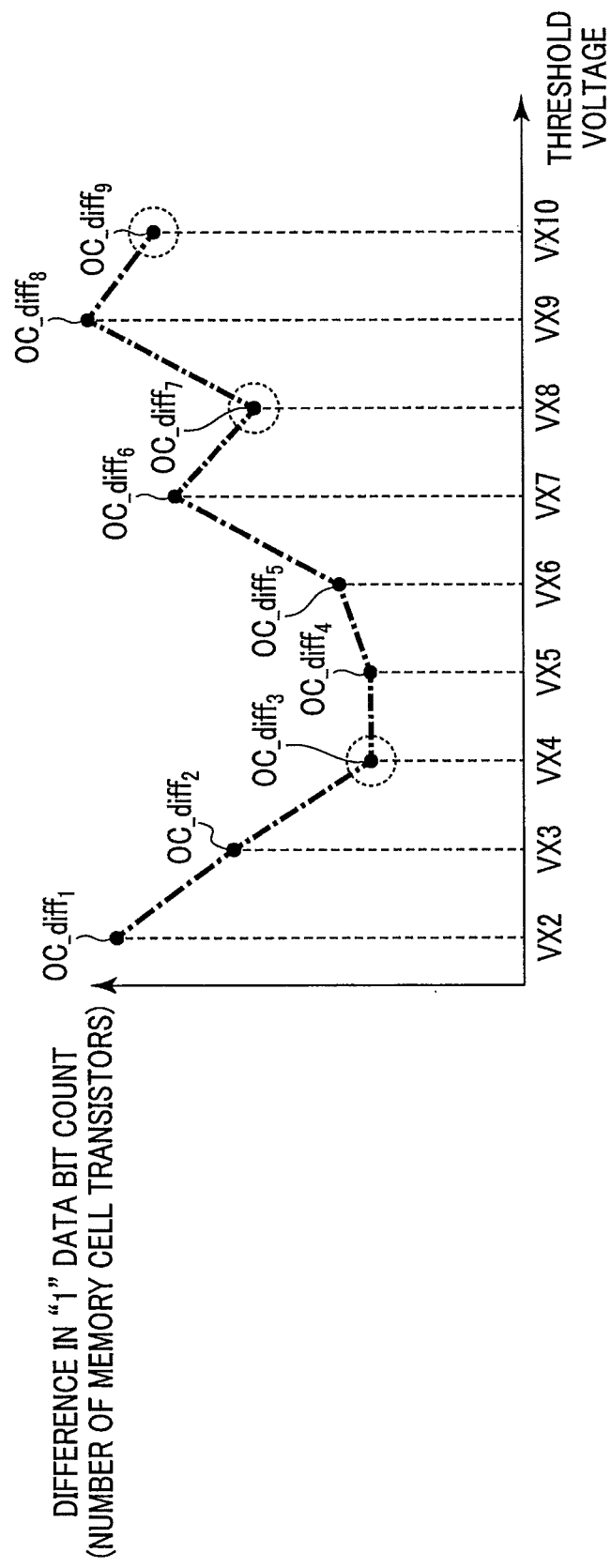
F I G. 31

| WORD LINE GROUP | B READ SHIFT AMOUNT | E READ SHIFT AMOUNT | H READ SHIFT AMOUNT |
|---|---|---|---|
| WLG0 | $\Delta VBg0$ | $\Delta VEg0$ | $\Delta VHg0$ |
| WLG1 | $\Delta VBg1$ | $\Delta VEg1$ | $\Delta VHg1$ |
| WLG2 | $\Delta VBg2$ | $\Delta VEg2$ | $\Delta VHg2$ |
| WLG3 | $\Delta VBg3$ | $\Delta VEg3$ | $\Delta VHg3$ |

FIG. 35

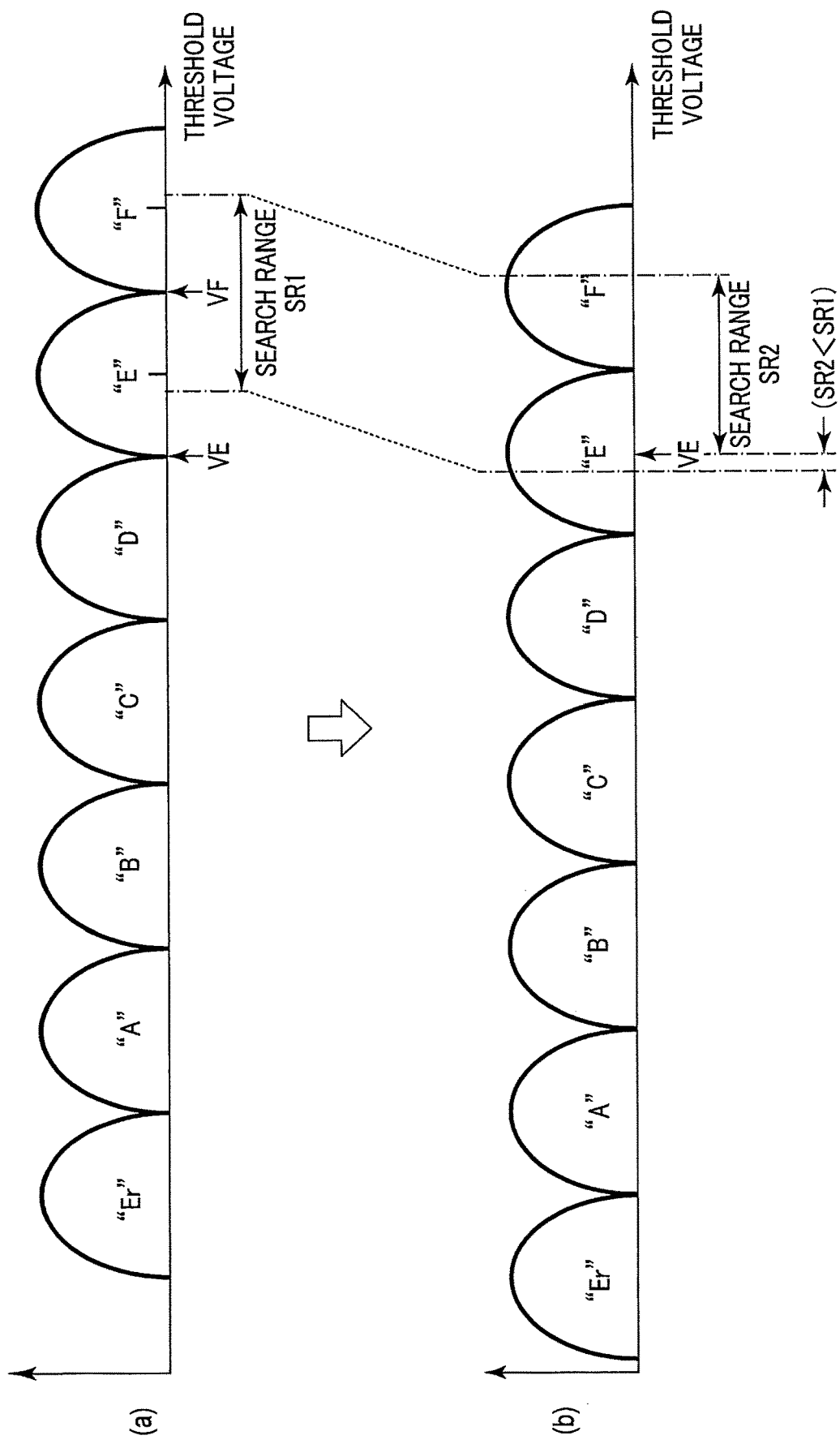
F I G. 36

MEMORY SYSTEM INCLUDING SEMICONDUCTOR MEMORY AND CONTROLLER CAPABLE OF DETERMINING NECESSARY SHIFTED BOUNDARY READ VOLTAGES IN A SHORT PERIOD OF TIME

CROSS-REFERENCE TO RELATED APPLICATIONS

This application is a continuation of and claims benefit under 35 U.S.C. § 120 to U.S. application Ser. No. 17/696,339, filed on Mar. 16, 2022, which is a continuation of and claims benefit under 35 U.S.C. § 120 to U.S. application Ser. No. 16/892,817 (now U.S. Pat. No. 11,315,643), filed on Jun. 4, 2020, which is a continuation of and claims benefit under 35 U.S.C. § 120 to U.S. application Ser. No. 16/291,281 (now U.S. Pat. No. 10,714,192), filed Mar. 4, 2019, which is based upon and claims the benefit of priority under 35 U.S.C. § 119 to Japanese Patent Application No. 2018-174175, filed Sep. 18, 2018, the entire contents of each of which are incorporated herein by reference.

FIELD

Embodiments described herein relate generally to a memory system.

BACKGROUND

A memory system including a semiconductor memory and a controller that controls the semiconductor memory is known.

BRIEF DESCRIPTION OF THE VIEWS OF THE DRAWINGS

FIG. 1 shows components and connections in a memory system according to a first embodiment and associated components;

FIG. 2 shows an example of several components and connections in a memory cell array according to the first embodiment;

FIG. 5 is a flowchart showing an operation according to the first embodiment;

FIG. 6 shows voltages applied to a selected word line along the time when a lower page is selected according to the first embodiment;

FIG. 19 shows voltages applied to a selected word along the time during shift read from a middle page according to the first embodiment;

FIG. 26 is a flowchart showing an operation according to the third embodiment;

FIG. 31 shows a relationship between differences in "1" data bit count and threshold voltages obtained according to the fourth embodiment;

FIG. 35 shows data used in the fifth embodiment;

FIG. 36 shows search ranges for reference; and

DETAILED DESCRIPTION

Figure 3:
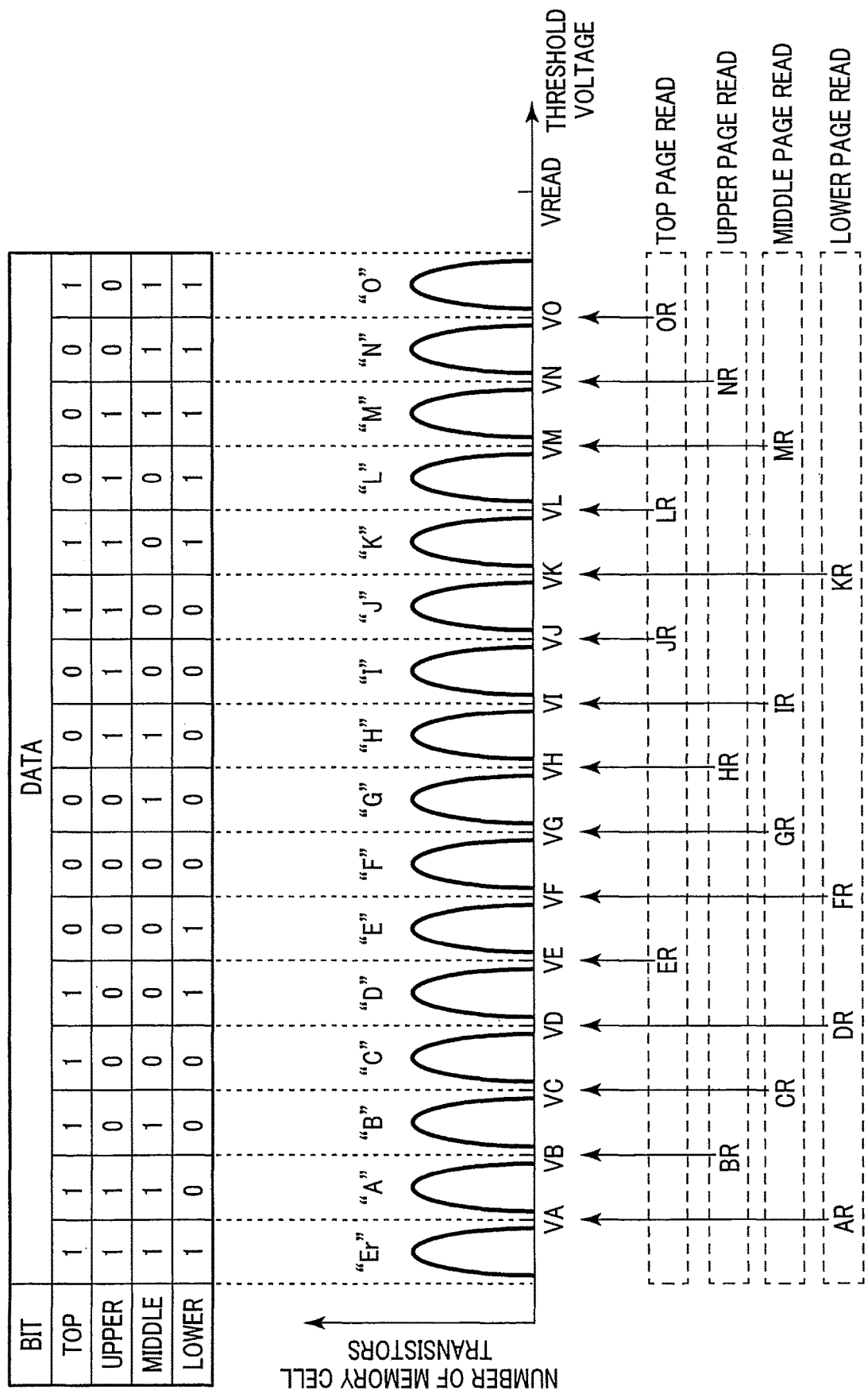
FIG. 3 shows the distribution of the threshold voltages of memory cell transistors each configured to store four-bit data according to the first embodiment.

According to one embodiment, a memory system includes a semiconductor memory and a controller. The semiconductor memory includes memory cells and a word line coupled to the memory cells. The controller is configured to write four-bit data in each of the memory cells, and read first data item from the memory cells through application of a first voltage to the word line. The controller is further configured to read a plurality of second data items by repeating a first operation of reading data including data of respective first bits of the memory cells through application of two voltages to the word line at different timings while changing the two voltages in each first operation from the two voltages in another first operation. The controller is further configured to mask part of each of the second data items using the first data.

Embodiments will now be described with reference to the figures. In the following description, components with substantially the same functionalities and configurations will be referred to with the same reference numerals, and repeated descriptions may be omitted. The entire description for a particular embodiment also applies to another embodiment unless it is explicitly mentioned otherwise or obviously eliminated.

Each functional block can be implemented as hardware, computer software, or combination of the both. For this reason, in order to clearly illustrate that each block can be any of hardware, software or combination, descriptions will be made in terms of their functionalities in general. It is not necessary that functional blocks are distinguished as in the following examples. For example, some of the functions may be implemented by functional blocks different from those illustrated below. Furthermore, an illustrated functional block may be divided into functional sub-blocks.

Moreover, any step in a flow of a method of an embodiment is not limited to any illustrated order, and can occur in an order different from an illustrated order and/or can occur concurrently with another step.

In the specification and the claims, a phrase of a particular first component being "coupled" to another second component includes the first component being coupled to the second component either directly or via one or more components which are always or selectively conductive.

First Embodiment

<1.1. Structure (Configuration)>

FIG. 1 shows components and connections in a memory system according to the first embodiment and associated components. As shown in FIG. 1, a memory system 5 is controlled by a host device 3 and includes a semiconductor memory 1 and a memory controller 2 which are. The memory system 5 can be, for example, an solid state drive (SSD) or SD™ card.

The memory controller 2 controls the semiconductor memory 1. The memory controller 2 receives instructions from the host device 3, and controls the semiconductor memory 1 based on the received instructions.

<1.1.1. Memory Controller>

The memory controller 2 includes a host interface 21, a central processing unit (CPU) 22, a random access memory (RAM) 23, a read only memory (ROM) 24, a memory interface 25, and an error correction code (ECC) circuit 26. The memory controller 2 executes various operations and some of the functions of the host interface 21 and the memory interface 25 by causing the CPU 22 to execute firmware (or, programs) stored in the ROM 24 and loaded in the RAM 23. The RAM 23 further temporarily stores data and functions as a buffer memory and a cash memory.

The host interface 21 is connected to the host device 3 via a bus and controls communications between the memory controller 2 and the host device 3. The memory interface 25 is connected to the semiconductor memory 1 and controls communications between the memory controller 2 and the semiconductor memory 1.

The ECC circuit 26 performs processing required to detect and correct errors in data written in the semiconductor memory 1 and data read from the semiconductor memory 1. More specifically, the ECC circuit 26 generates redundant data for correcting an error in data to be written in the semiconductor memory 1 (or, substantial write data). The generated redundant data and the substantial write data are then written in the semiconductor memory 1. The ECC circuit 26 detects an error in data read from the semiconductor memory 1, and tries to correct an error if any.

<1.1.2. Semiconductor Memory>

The semiconductor memory 1 includes components such as a memory cell array 11, an input and output circuit 12, a sequencer 13, a driver 15, a sense amplifier 16, and a row decoder 19.

The memory cell array 11 includes memory blocks BLK such as BLK0, BLK1, .... Each block BLK is a set of string units SU such as SU0, SU1, .... Each string unit SU is a set of NAND strings STR such as STR0, STR1, ... (not shown). The string STR includes memory cell transistors MT.

The input and output circuit 12 is connected to the memory controller 2 via a NAND bus. The NAND bus transmits control signals and a signal DQ having a width of eight bits. The control signals include signals $^{31}$CE, CLE, ALE, $^{31}$WE, $^{31}$RE, and $^{31}$WP and data strobe signals DQS and $^{31}$DQS. The symbol "$^{31}$" indicates inverted logic. The input and output circuit 12 receives and receives the signal DQ. The input and output circuit 12 receives some control signals from the memory controller 2 and fetches and outputs the signal DQ based on the received control signals. The signal DQ includes a command (CMD), write or read data (DAT), address (ADD), and status (STA).

The sequencer 13 receives the command CMD and the address ADD from the input and output circuit 12, and controls driver 15, the sense amplifier 16, and the row decoder 19 based on the received command CMD and the address ADD.

The driver 15 supplies a selected one of potentials to the row decoder 19. The row decoder 19 receives various potentials from the driver 15 and the address ADD from the input and output circuit 12, and transfers the potential from the driver 15 to one block BLK selected based on the received address ADD.

The sense amplifier 16 senses a state of memory cell transistors MT, generates read data based on the sensed state, and transfers write data to the memory cell transistors MT.

<1.1.3. Memory Cell Array>

FIG. 2 shows an example of several components and connections in the memory cell array 11 according to the first embodiment, and shows components and connections in one block BLK0 and associated components. A plurality of blocks BLK, for example, all blocks BLK, each include the components and the connections shown in FIG. 2.

One block BLK includes a plurality of (for example, four) string units SU0 to SU3.

In each block BLK, each of p (where p is a natural number) bit lines BL0 to BL(p−1) is connected to one string STR from each of the string units SU0 to SU3.

Each string STR includes one select gate transistor ST, a plurality of, for example, eight memory cell transistors MT such as MT0 to MT7, and one select gate transistor DT such as DT0, DT1, DT2, or DT3. The transistors ST, MT, and DT are coupled in series in this order between a source line CELSRC and one bit line BL. A memory cell transistor MT includes a control gate electrode (word line WL) and a charge storage layer insulated from the surroundings, and can store data in a nonvolatile manner based on the amount of charge in the charge storage layer.

The strings STR respectively coupled to different bit lines BL constitute one string unit SU. In each string unit SU, the control gate electrodes of the memory cell transistors MT0 to MT7 are respectively coupled to word lines WL0 to WL7. In addition, in each block BLK, word lines WL with the same address in different string units SU are coupled to each other. A set of memory cell transistors MT sharing a word line WL in one string unit SU is referred to as a cell unit CU.

Transistors DT0 to DT3 respectively belong to the string units SU0 to SU3. In each case with α=0 to 3, the gates of respective transistors DTα of respective strings STR of a string unit SUα is coupled to a select gate line SGDLα. The gates of the transistors ST are coupled to a select gate line SGSL.

<1.1.4. Cell Transistors>

The memory cell transistors MT will be described with reference to FIG. 3. The semiconductor memory 1 can store data of two bits or more in one memory cell transistor MT. FIG. 3 shows a distribution of the threshold voltages of the memory cell transistors MT each storing four-bit data as a result of data write in the memory system 5 according to the first embodiment. The threshold voltage of each memory cell transistor MT has a value corresponding to the stored data. When storing four-bit data per memory cell transistor MT, each memory cell transistor MT can have one of $2^{4=16}$ threshold voltages. The 16 threshold voltages respectively correspond to states of storing "1111" data, "1110" data, "1010" data, "1000" data, "1001" data, "0001" data, "0000" data, "0010" data, "0110" data, "0100" data, "1100" data, "1101" data, "0101" data, "0111" data, "0011" data, and "1011" data. The memory cell transistors MT respectively storing "1111" data, "1110" data, "1010" data, "1000" data, "1001" data, "0001" data, "0000" data, "0010" data, "0110" data, "0100" data, "1100" data, "1101" data, "0101" data, "0111" data, "0011" data, and "1011" data are referred to as being in Er, A, B, C, D, E, F G, H, I, J, K, L, M, N, and O states. The memory cell transistors MT in Er, A, B, C, D, E, F G, H, I, J, K, L, M, N, and O states respectively have higher threshold voltages in this order.

Even a plurality of memory cell transistors MT that store identical four-bit data can have different threshold voltages due to variations in the characteristics of the memory cell transistors MT. Referring to FIG. 3 and subsequent drawings, although the distribution of threshold voltages is indicated by a continuous curve, the numbers of memory cell transistors MT are discrete.

In order to determine the data stored in a memory cell transistor MT as a read target, the state of the memory cell transistor MT is determined. The state determination is performed by using read voltages VA, VB, VC, VD, VE, VF, VG, VH, VI, VJ, VK, VL, VM, VN, and VO. A voltage having a magnitude to be applied to the memory cell transistor MT as a read target to determine the state of the memory cell transistor MT, including read voltages VA, VB, VC, VD, VE, VF, VG, VH, VI, VJ, VK, VL, VM, VN, and VO may be referred as a read voltage VCGR hereinafter.

The read voltage VA is higher than the highest threshold voltage of the memory cell transistor MT in Er state, and is lower than the lowest threshold voltage of the memory cell transistor MT in A state immediately after the write.

The read voltage VB is higher than the highest threshold voltage of the memory cell transistor MT in A state immediately after the write, and is lower than the lowest threshold voltage of the memory cell transistor MT in B state immediately after the write.

The read voltage VC is higher than the highest threshold voltage of the memory cell transistor MT in B state immediately after the write, and is lower than the lowest threshold voltage of the memory cell transistor MT in C state immediately after the write.

The read voltage VD is higher than the highest threshold voltage of the memory cell transistor MT in C state immediately after the write, and is lower than the lowest threshold voltage of the memory cell transistor MT in D state immediately after the write.

The read voltage VE is higher than the highest threshold voltage of the memory cell transistor MT in D state immediately after the write, and is lower than the lowest threshold voltage of the memory cell transistor MT in E state immediately after the write.

The read voltage VF is higher than the highest threshold voltage of the memory cell transistor MT in E state immediately after the write, and is lower than the lowest threshold voltage of the memory cell transistor MT in F state immediately after the write.

The read voltage VG is higher than the highest threshold voltage of the memory cell transistor MT in F state immediately after the write, and is lower than the lowest threshold voltage of the memory cell transistor MT in G state immediately after the write.

The read voltage VH is higher than the highest threshold voltage of the memory cell transistor MT in G state immediately after the write, and is lower than the lowest threshold voltage of the memory cell transistor MT in H state immediately after the write.

The read voltage VI is higher than the highest threshold voltage of the memory cell transistor MT in H state immediately after the write, and is lower than the lowest threshold voltage of the memory cell transistor MT in I state immediately after the write.

The read voltage VJ is higher than the highest threshold voltage of the memory cell transistor MT in I state immediately after the write, and is lower than the lowest threshold voltage of the memory cell transistor MT in J state immediately after the write.

The read voltage VK is higher than the highest threshold voltage of the memory cell transistor MT in J state immediately after the write, and is lower than the lowest threshold voltage of the memory cell transistor MT in K state immediately after the write.

The read voltage VL is higher than the highest threshold voltage of the memory cell transistor MT in K state immediately after the write, and is lower than the lowest threshold voltage of the memory cell transistor MT in L state immediately after the write.

The read voltage VM is higher than the highest threshold voltage of the memory cell transistor MT in L state immediately after the write, and is lower than the lowest threshold voltage of the memory cell transistor MT in M state immediately after the write.

The read voltage VN is higher than the highest threshold voltage of the memory cell transistor MT in M state immediately after the write, and is lower than the lowest threshold voltage of the memory cell transistor MT in N state immediately after the write.

The read voltage VO is higher than the highest threshold voltage of the memory cell transistor MT in N state immediately after the write, and is lower than the lowest threshold voltage of the memory cell transistor MT in O state immediately after the write.

The read voltages VA, VB, VC, VD, VE, VF, VG, VH, VI, VJ, VK, VL, VM, VN, and VO are, for example, default voltages. Read using the read voltage VX (where X is A, B, C, D, E, F, G, H, I, J, K, L, M, N, or O) is referred to as X read (XR).

A state of the memory cell transistor MT as a read target (selected memory cell transistor) is determined by determining in which range the threshold voltage of the memory cell transistor MT falls. In order to determine a range in which the threshold voltage of the selected memory cell transistor MT falls, it is determined whether the threshold voltage exceeds a read voltage VCGR. The memory cell transistor MT having a threshold voltage equal to or higher than the read voltage VCGR maintains an OFF state even while receiving the read voltage VCGR at its control gate electrode. In contrast to this, the memory cell transistor MT having a threshold voltage lower than the read voltage VCGR is turned on while receiving the read voltage VCGR at its control gate electrode. A voltage VREAD is applied to the word line WL of memory cell transistors MT of cell units CU as a non-read target, and is higher than the threshold voltages of the memory cell transistors MT in any states.

A set of data of bits at the same position (digit) of the memory cell transistors MT of one cell unit CU constitutes one page. A set of data of bits at the most significant (first digit) position of the memory cell transistors MT of each cell unit CU is referred to as a top page. A set of data of bits at the second digit from the most significant digit of the memory cell transistors MT of each cell unit CU is referred to as an upper page. A set of data of bits at the third digit from the most significant digit of the memory cell transistors MT of each cell unit CU is referred to as a middle page. A set of data of bits at the least significant (fourth digit) position of the memory cell transistors MT of each cell unit CU is referred to as a lower page.

The data of each page is determined by read using a plurality of read voltages VCGR with different magnitudes. The following is an example. Data obtained by X read is referred to as X read data XD.

Each bit of a lower page is determined as "1" data when it is determined that the threshold voltage of the selected memory cell transistor MT storing the data of that bit falls within the range of lower than the read voltage VA, the range of the read voltage VD or higher and lower than the read voltage VF, or the range of the read voltage VK or higher. Each bit of a lower page is determined as "0" data when it is determined that the threshold voltage of the selected memory cell transistor MT storing the data of the bit falls within the range of the read voltage VA or higher and lower than the read voltage VD, or the range of the read voltage VF or higher and lower than the read voltage VK. In order to determine the state of the selected memory cell transistor MT, the read voltage VCGR at the boundary between a state determined as "0" data and a state determined as "1" data is used. Lower page read uses, for example, A read, D read, F read, and K read. The state of the selected memory cell transistor MT can be determined by the logical operation of A read data AD, D read data DD, F read data FD, and K read data KD.

The same applies to other pages. Middle page data is determined by using, for example, C read, G read, I read, and M read. Upper page data is determined by using, for example, B read, H read, and N read. Top page data is determined by using, for example, E read, J read, L read, and O read.

A plurality of reads required to identify the data stored in a page, such as a set of A read, D read, F read, and K read in the case of low page read, are referred to as boundary reads required for the page.

The threshold voltage of the memory cell transistor MT can change due to factors such as disturbances from immediately after the write and/or a lapse of time. The threshold voltage of a memory cell transistor MT can be erroneously determined as being in a state different from a state intended at the time of write depending on how the threshold voltage changes.

<1.1.5. Sense Amplifier>

Figure 4:
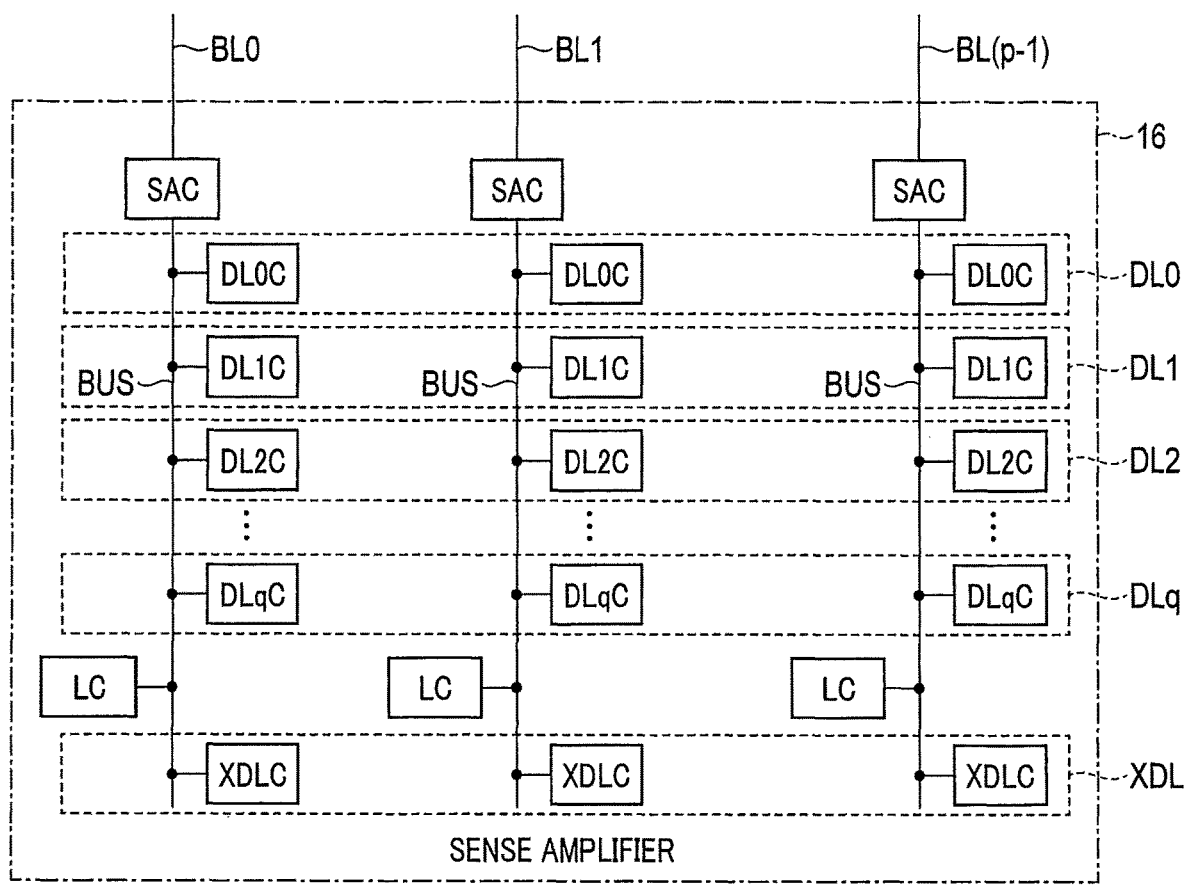
FIG. 4 shows components and connections in a sense amplifier according to the first embodiment.

FIG. 4 shows components and connections in the sense amplifier 16 according to the first embodiment. The sense amplifier 16 includes p sense amplification circuits SAC, data latches DL, such as DL0, DL1, DL2, . . . , DLq (where q is a natural number), p arithmetic circuits LC, and one data latch XDL. In each case in which β is between 0 and q, a data latch DLβ includes p data latch circuits DLβC. The data latch XDL includes p data latch circuits XDLC. The data latch circuits DLβC and XDLC temporarily store data.

Each bit line BL is coupled to one sense amplification circuits SAC, q+1 data latch circuits DL0C, DL1C, DL2C, . . . , DLqC, one arithmetic circuit LC, and one data latch circuit XDLC.

Each sense amplification circuit SAC is electrically coupled to one selected memory cell transistor MT via one bit line BL coupled to the sense amplification circuit SAC during data read. Each sense amplification circuit SAC senses a voltage of a magnitude determined based on the threshold voltage of the selected memory cell transistor MT on a node in the sense amplification circuit SAC, and determines, based on the sense result, to which one of two states the memory cell transistor MT electrically coupled to the sense amplification circuit SAC belongs. The two states of the memory cell transistor MT are respectively expressed by "0" data and "1" data. Each sense amplification circuit SAC stores information indicating that read data is "0" data or "1" data in a data latch circuit DLC coupled to the sense amplification circuit SAC.

The arithmetic circuit LC can perform a logical operation for data in the data latch circuits DLC and XDLC coupled to the arithmetic circuit LC. Logical operations include a NOT operation, a logical OR operation, a logical AND operation, an exclusive XOR operation, and an exclusive NOR operation.

<1.2. Operation>

FIG. 5 shows a flowchart for an operation of the memory system according to the first embodiment. FIG. 5, in particular, shows a flowchart concerning data read from a page in a cell unit CU of a string unit SU of a block BLK. Some of the steps will be described in detail later.

As shown in FIG. 5, in step S1, the memory controller 2 instructs the semiconductor memory 1 to perform read from a page in a cell unit CU, the memory controller 2 transmits a command set for read to the semiconductor memory 1. The read command set specifies the cell unit CU as a read target and a page as a read target. A read target cell unit CU and a read target page are respectively referred to as a selected cell unit CU and a selected page. In addition, the string unit SU including the selected cell unit CU is referred to as a selected string unit SU, and the block BLK including the selected string unit SU is referred to as a selected block BLK.

In step S2, upon receiving the read command set, the semiconductor memory 1 reads data from the selected page, and transmits the read data to the memory controller 2.

In step S3, the memory controller 2 receives the read data, and controls the ECC circuit 26 to try to correct an error in the received read data.

If no error is included or error correction has succeeded (YES branch of step S4), the data written in the selected page is obtained. Written data, i.e., data including no error or having undergone error correction, will be referred to as errorless data hereinafter. When errorless data is obtained, the flowchart in FIG. 5 comes to an end.

When the error correction fails in step S4 (NO branch of step S4), the process goes to step S5. In step S5, the memory controller 2 determines, by estimation, the read voltage VCGR to be used next. The read voltage VCGR is estimated with an expectation to acquire errorless data from the data read from the selected page by using the read voltage VCGR. The details of step S5 will be described later. For a case of storing four-bit data per memory cell transistor MT, in order to read data from one page, three or four read voltages (boundary read voltages) VCGR for three or four boundary reads are required. For this reason, step S5 includes estimating three or four boundary read voltages VCGR.

In step S6, the memory controller 2 instructs the semiconductor memory 1 to perform shift read using the read voltages VCGR estimated in step S5. Shift read is read using a read voltages VCGR differing in magnitude from a standard (for example, default) read voltage VCGR while specifying an adjustment for the standard read voltage VCGR. The read voltages VCGR used for shift read are referred to as shift read voltages VCGRS. In order to perform shift read, the memory controller 2 transmits a command set for shift read to the semiconductor memory 1. A shift read command set specifies the selected cell unit CU, a selected page, and differences ΔV between the standard read voltages VCGR and the shift read voltages VCGRS. In storing four-bit data per memory cell transistor MT, a shift read command set specifies three or four differences ΔV for three or four boundary read voltages.

In step S7, upon receiving the shift read command set, the semiconductor memory 1 reads data from the selected page by using the shift read voltages VCGRS, i.e., performs shift read with respect to the selected page, and transmits the read data to the memory controller 2. The read data obtained by shift read is referred to as shift read data.

In step S8, the memory controller 2 receives shift read data and controls the ECC circuit 26 to try to correct an error in the received data. When shift read data including no error (errorless shift read data) is obtained (YES branch of step S8), the flowchart in FIG. 5 comes to an end. When error correction fails (NO branch of step S8), the process goes to step S9.

In step S9, the memory controller 2 tries to correct an error in the data from the selected page by using another method. Upon completion of step S9, the flowchart in FIG. 5 comes to an end.

<1.2.1. Details of Step S2 (Read)>

The read in step S2 varies depending on whether a lower page, middle page, upper page, or top page is selected. Each of four cases will be described below.

<1.2.1.1. Details of Read from Lower Page>

FIG. 6 shows voltages applied to the word line (selected word line) WL coupled to the selected cell unit CU in step S2 along the time when a lower page is selected according to the first embodiment.

In the period shown in FIG. 6, the voltages required to perform read from a selected page of the selected cell unit CU are applied to associated components. For example, a voltage VSG is applied to a select gate line SGDL coupled to the selected string unit SU of the selected block BLK over the period from time t101 to time t105. The voltage VSG has a magnitude that turns on the selected gate transistor DT. In addition, the voltage VREAD is applied to unselected word lines WL among the word lines WL over the period from time t101 to time t105. With the application of such voltages, the strings STR of the selected string unit SU are electrically coupled between respective bit lines BL and the cell source line CELSRC.

As shown in FIG. 6, a read voltage VA0 is applied to the selected word line WL over the period from time t101 to time t102. Read voltages VAw, with w (where w is 0 or a natural number) representing different values, have different magnitudes. The read voltage VAw may have the same magnitude as that of a read voltage VA, or a magnitude different from that of the read voltage VA. For example, when the read voltage VA as a default voltage is used for read in step S2, the magnitude of the read voltage VA0 is the same as that of the read voltage VA.

As a result of application of the read voltage VA0, when a selected memory cell transistor MT is turned on, a current flows from the corresponding bit line BL to the source line CELSRC, and when it remains off, no such a current flows. The sense amplifier 16 determines whether this current flows. Based on this determination, it is determined whether the threshold voltage of the selected memory cell transistor MT is lower than the read voltage VA0, or equal to or higher than the read voltage VA0.

Read using a read voltage VXw is referred to as Xw read. The data obtained by A0 read is stored in a first data latch DL of the data latches DL0 to DLq. "0" data is obtained from the selected memory cell transistor MT having a threshold voltage equal to or higher than the read voltage VA0, and "1" data is obtained from the memory cell transistor MT having a threshold voltage lower than the read voltage VA0. The data obtained from each selected memory cell transistor MT is stored in the data latch circuit DLC coupled to the bit line BL coupled to the memory cell transistor MT in the first data latch DL.

A read voltage VD0 is applied to the selected word line WL over the period from time t102 to time t103 to perform D0 read and obtain D0 read data. A read voltage VF0 is applied to the selected word line WL over the period from time t103 to time t104 to perform F0 read and obtain F0 read data. A read voltage VK0 is applied to the selected word line WL over the period from time t104 to time t105 to perform K0 read and obtain K0 read data. The A0 read data, the D0 read data, the F0 read data, and the K0 read data are respectively stored in the different ones of the data latches DL0 to DLq.

Subsequently, the data of the lower page of the selected cell unit CU is obtained based on the A0 read data, the D0 read data, the F0 read data, and the K0 read data. The data read from the lower page by using the read voltages VAw, VDw, VFw, and VKw is referred to as lower page read data LDw.

<1.2.1.2. Details of Read From Middle Page>

Figure 7:
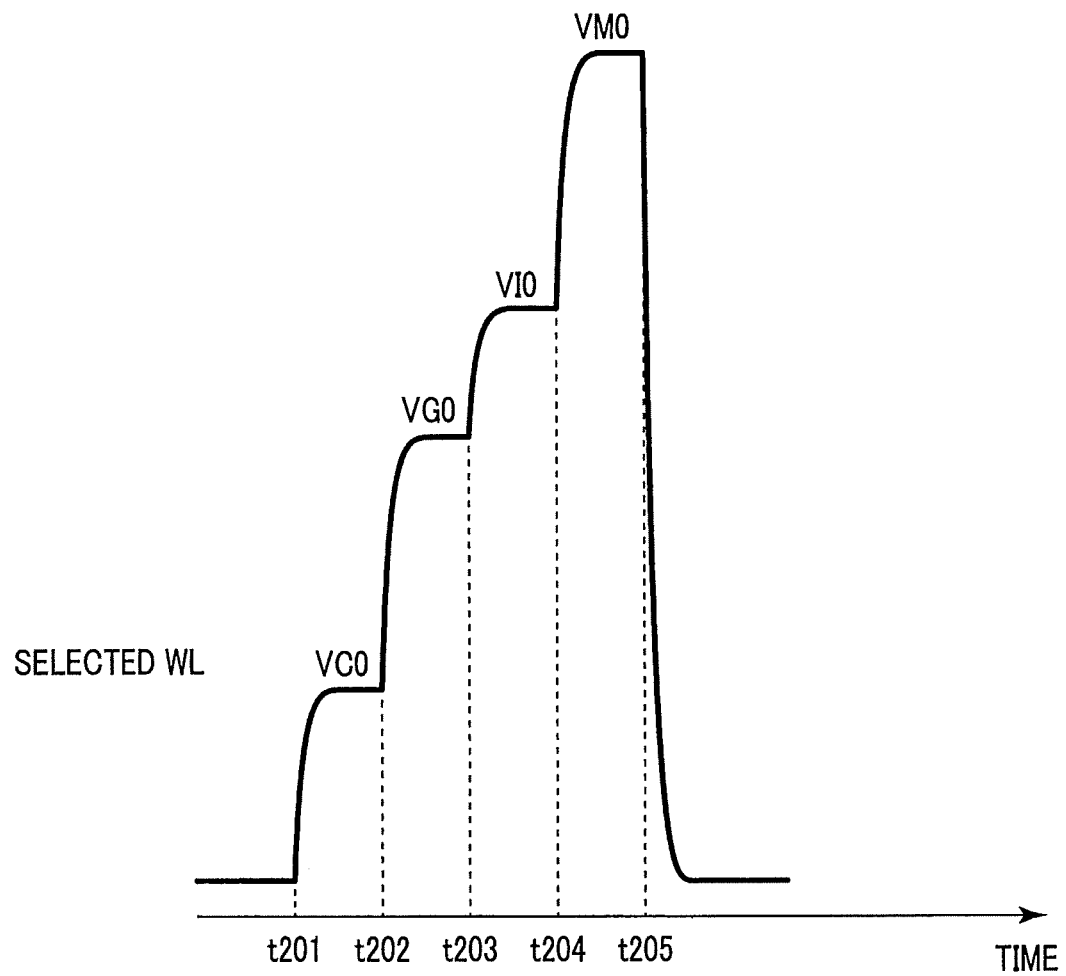
FIG. 7 shows voltages applied to a selected word line along the time when a middle page is selected according to the first embodiment.

FIG. 7 shows voltages applied to the selected word line WL along the time in step S2 when a middle page is selected according to the first embodiment.

In the period shown in FIG. 7, the voltages required to perform read from a selected page of the selected cell unit CU are applied to associated components as described with reference to FIG. 6.

As shown in FIG. 7, a read voltage VC0 is applied to the selected word line WL over the period from time t201 to time t202 to perform C0 read and obtain C0 read data. A read voltage VG0 is applied to the selected word line WL over the period from time t202 to time t203 to perform G0 read and obtain G0 read data. A read voltage VI0 is applied to the selected word line WL over the period from time t203 to time t204 to perform I0 read and obtain I0 read data. A read voltage VM0 is applied to the selected word line WL over the period from time t204 to time t205 to perform M0 read and obtain M0 read data.

Subsequently, the data of the middle page of the selected cell unit CU is obtained based on the C0 read data, the G0 read data, the IC read data, and the M0 read data. The data read from the middle page by using read voltages VCw, VGw, VIw, and VMw is referred to as middle page read data MDw.

<1.2.1.3. Details of Read from Upper Page>

Figure 8:
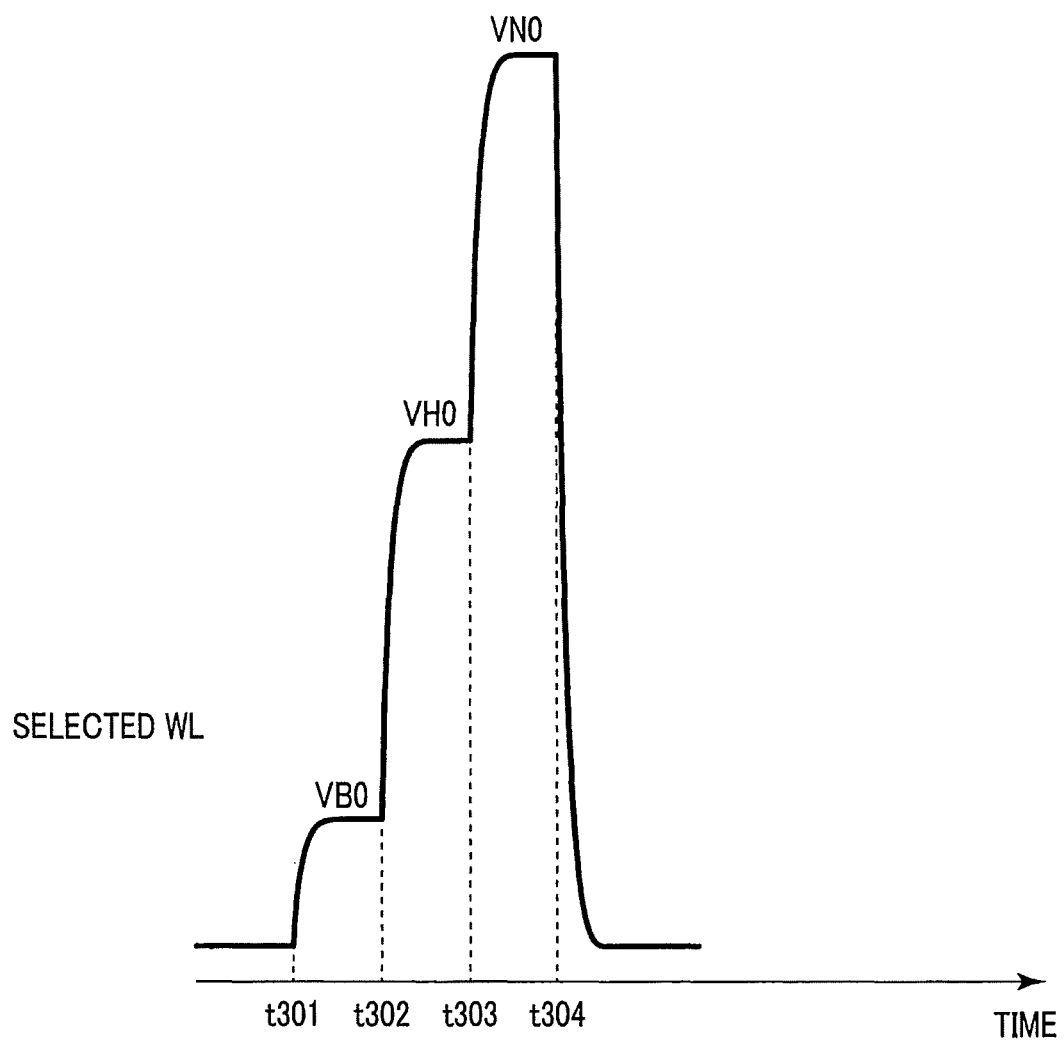
FIG. 8 shows voltages applied to a selected word line along the time when an upper page is selected according to the first embodiment.

FIG. 8 shows voltages applied to the selected word line WL along the time in step S2 when an upper page is selected according to the first embodiment.

In the period shown in FIG. 8, the voltages required to perform read from a selected page of the selected cell unit CU are applied to associated components as described with reference to FIG. 6.

As shown in FIG. 8, a read voltage VB0 is applied to the selected word line WL over the period from time t301 to time t302 to perform B0 read and obtain B0 read data. A read voltage VH0 is applied to the selected word line WL over the period from time t302 to time t303 to perform H0 read and obtain H0 read data. A read voltage VN0 is applied to the selected word line WL over the period from time t303 to time t304 to perform N0 read and obtain N0 read data.

Subsequently, the data of the upper page of the selected cell unit CU is obtained based on the B0 read data, the H0 read data, and the N0 read data. The data read from the upper page by using read voltages VBw, VHw, and VNw is referred to as upper page read data UDw.

<1.2.1.4. Details of Read from Top Page>

Figure 9:
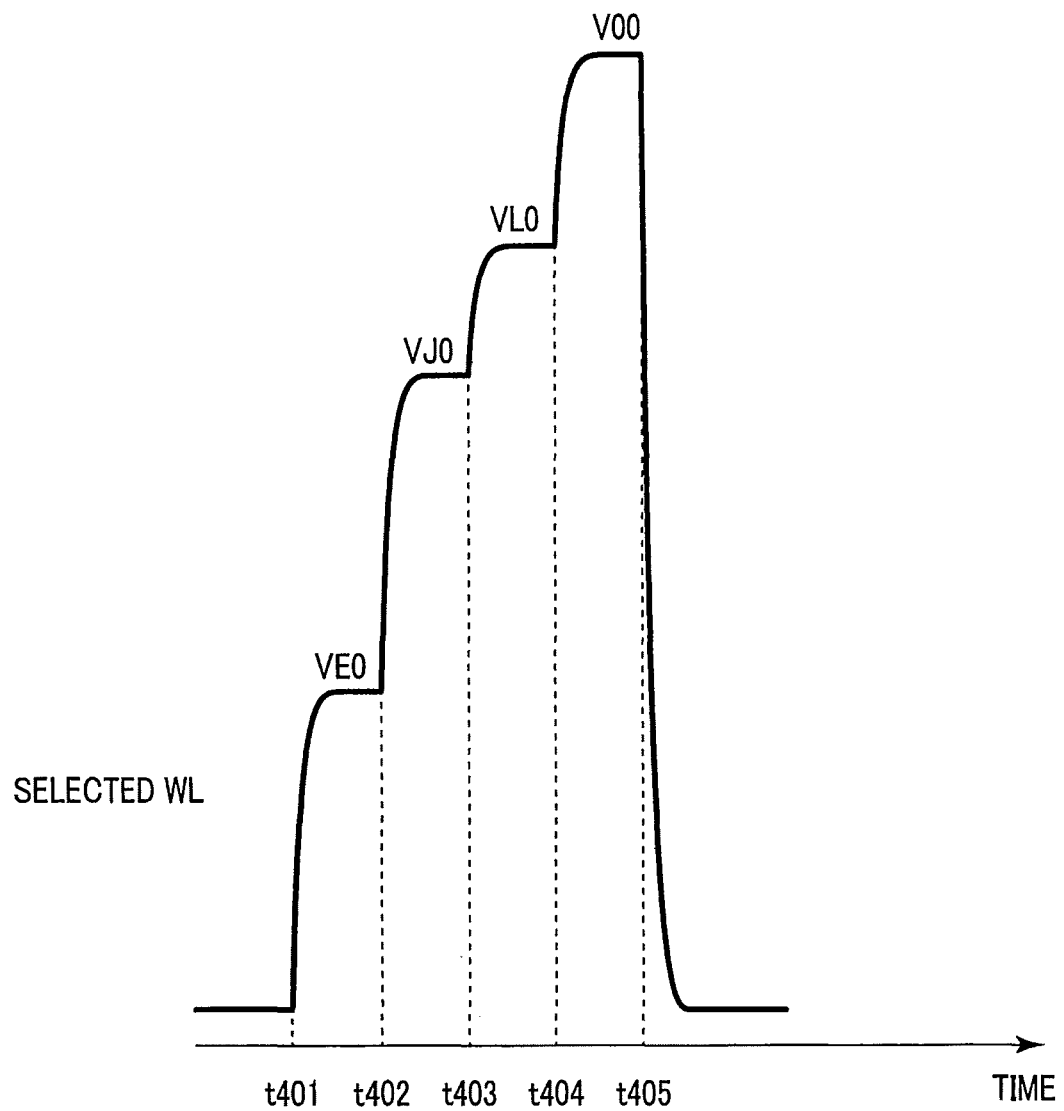
FIG. 9 shows voltages applied to a selected word line along the time when a top page is selected according to the first embodiment.

FIG. 9 shows voltages applied to the selected word line WL along the time in step S2 when a top page is selected according to the first embodiment.

In the period shown in FIG. 9, the voltages required to perform read from a selected page of the selected cell unit CU are applied to associated components as described with reference to FIG. 6.

As shown in FIG. 9, a read voltage VE0 is applied to the selected word line WL over the period from time t401 to time t402 to perform E0 read and obtain E0 read data. A read voltage VJ0 is applied to the selected word line WL over the period from time t402 to time t403 to perform J0 read and obtain J0 read data. A read voltage VL0 is applied to the selected word line WL over the period from time t403 to time t404 to perform L0 read and obtain L0 read data. A read voltage VO0 is applied to the selected word line WL over the period from time t404 to time t405 to perform O0 read and obtain O0 read data.

Subsequently, the data of the top page of the selected cell unit CU is obtained based on the E0 read data, the J0 read data, the L0 read data, and the O0 read data. The data read from the top page by using read voltages VE0, VJ0, VL0, and VO0 is referred to as top page read data TD0.

<1.2.2. Details of Step S5 (Read Voltage Estimation)>

The read voltage estimation in step S5 differs depending on which one of a lower page, a middle page, an upper page, and a top page is selected. Each of the four cases will be described below.

<1.2.2.1. When Selected Page is Lower Page>

Figure 10:
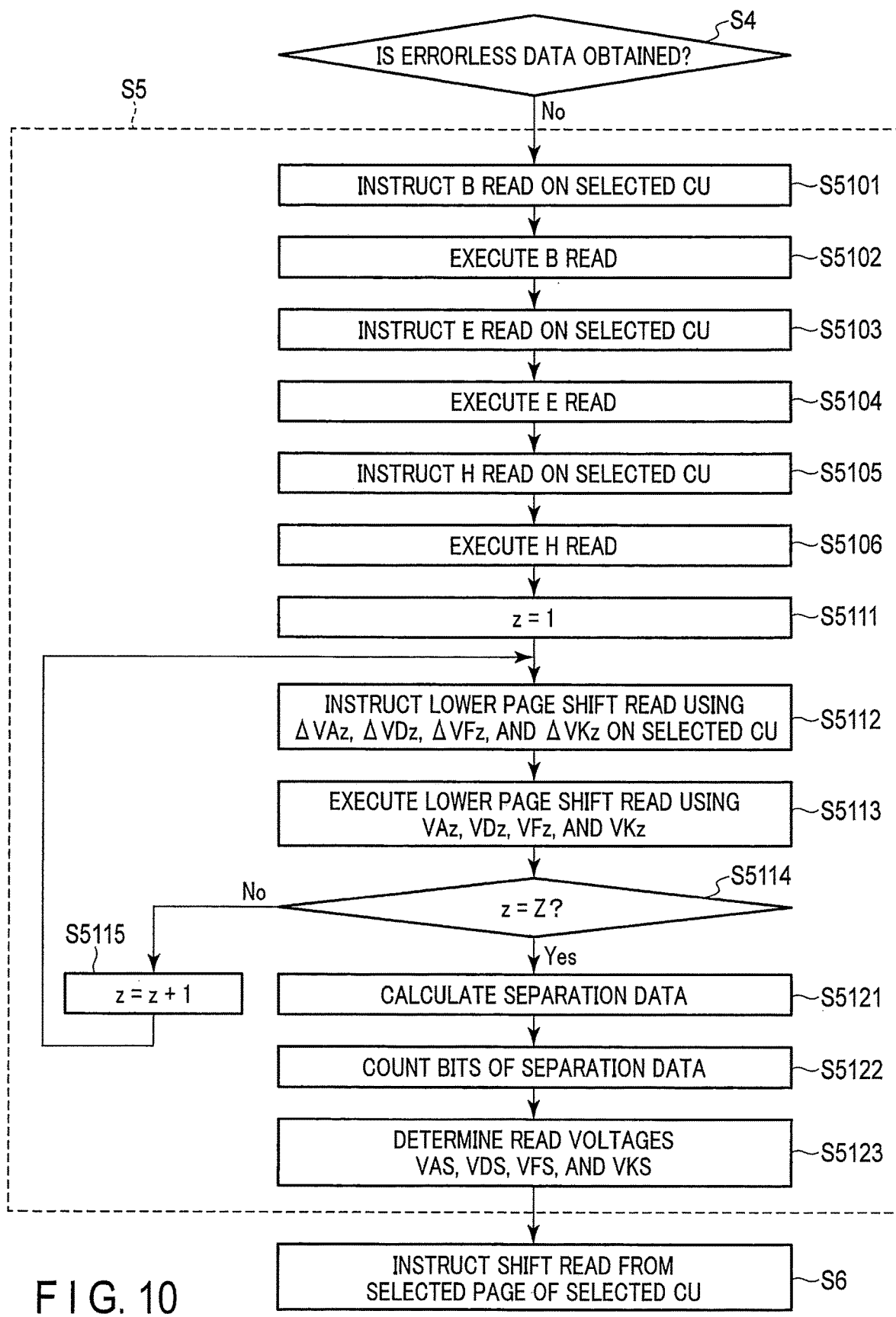
FIG. 10 is a sub-flowchart when a lower page is selected according to the first embodiment.

FIG. 10 is a sub-flowchart for step S5 when a lower page is selected according to the first embodiment. As shown in FIG. 10, the NO branch of step S4 goes to step S5101.

The memory controller 2 performs single state read several times on the selected page through several steps from step S5101. Single state read indicates the operation of obtaining X read data XD from the semiconductor memory 1 unlike data read from a page.

In step S5101, the memory controller 2 instructs B read on the selected cell unit CU. To this end, the memory controller 2 transmits, to the semiconductor memory 1, a command to instruct B read on the selected cell unit CU.

In step S5102, upon receiving the B read command, the semiconductor memory 1 performs B read on the selected cell unit CU to obtain B read data BD, and transmits the B read data BD to the memory controller 2. The memory controller 2 stores the B read data BD in the RAM 23.

In step S5103, the memory controller 2 transmits, to the semiconductor memory 1, a command to instruct E read on the selected cell unit CU.

In step S5104, upon receiving the E read command, the semiconductor memory 1 performs E read on the selected cell unit CU to obtain E read data ED, and transmits the E read data ED to the memory controller 2. The memory controller 2 stores the E read data ED in the RAM 23.

In step S5105, the memory controller 2 transmits, to the semiconductor memory 1, a command to instruct H read on the selected cell unit CU.

In step S5106, upon receiving the H read command, the semiconductor memory 1 performs H read on the selected cell unit CU to obtain H read data HD, and transmits the H read data HD to the memory controller 2. The memory controller 2 stores the H read data HD in the RAM 23.

Step S5106 continues at step S5111. The memory controller 2 performs shift read Z (where Z is a natural number) times from step S5111 to step S5115. For example, Z is 5. The following description is based on this example. In each shift read, the memory controller 2 specifies shift amounts $\Delta VA$, $\Delta VD$, $\Delta VF$, and $\Delta VK$. Shift amounts $\Delta VA$, $\Delta VD$, $\Delta VF$, and $\Delta VK$ in each shift read are different from shift amounts $\Delta VA$, $\Delta VD$, $\Delta VF$, and $\Delta VK$ in another shift read. The following is an example of executing each shift read with the shift amounts $\Delta VA$, $\Delta VD$, $\Delta VF$, and $\Delta VK$ which are different from those in another shift read.

In step S5111, the memory controller 2 sets a parameter z (where z is a natural number equal to or lower than Z) to 1.

In step S5112, the memory controller 2 instructs lower page read (lower page shift read) LSRz using shift read voltages in the zth loop on the selected cell unit CU. For the lower page shift read LSRz, the memory controller 2 transmits a shift read command set to the semiconductor memory 1. The shift read command set specifies a selected page and shift amounts $\Delta VAz$, $\Delta VDz$, $\Delta VFz$, and $\Delta VKz$. The shift amounts $\Delta VAz$, $\Delta VDz$, $\Delta VFz$, and $\Delta VKz$ are respectively added to standard read voltages VA, VD, VF, and VK in lower page shift read LSRz.

In step S5113, the semiconductor memory 1 performs lower page shift read LSRz on the selected cell unit CU with the shift amounts $\Delta VAz$, $\Delta VDz$, $\Delta VFz$, and $\Delta VKz$. That is, the semiconductor memory 1 performs lower page read with shift read voltages VAz, VDz, VFz, and VKz instead of the read voltages VA, VD, VF, and VK. The shift read voltage VAz is VA+$\Delta VAz$. The shift read voltage VDz is VD+$\Delta VDz$. The shift read voltage VFz is VF+$\Delta VFz$. The shift read voltage VKz is VK+$\Delta VKz$. The data obtained by lower page shift read LSRz is referred to as lower page shift read data LSDz. The semiconductor memory 1 transmits the lower page shift read data LSDz to the memory controller 2.

In step S5114, the memory controller 2 determines whether z is Z. When z≠Z (NO branch of step S5114), the memory controller 2 sets z=z+1 in step S5115. The process returns to step S5112. When z=Z (YES branch of step S5114), the process goes to step S5121. When the process goes to step S5121, the memory controller 2 should store lower page shift read data LSD1, LSD2, LSD3, LSD4, and LSD5.

In step S5121, the memory controller 2 masks particular bits of the lower page shift read data LSD1 to SLD5 with the B read data BD, the E read data ED, and the H read data HD. To this end, the memory controller 2 performs logical operations using the B read data BD, the E read data ED, the H read data HD, and the lower page shift read data LSD1 to LSD5. Performing the logical operations will produce separation data ADs such as ADs1, ADs2, ADs3, ADs4, and ADs5, separation data DDs such as DDs1, DDs2, DDs3, DDs4, and DDs5, separation data FDs such as FDs1, FDs2, FDs3, FDs4, and FDs5, and separation data KDs such as KDs1, KDs2, KDs3, KDs4, and KDs5. Separation data ADsz, DDsz, FDsz, and KDsz each are formed from part of the lower page shift read data LSDz. A method of obtaining the separation data ADs, DDs, FDs, and KDs will be described later. The memory controller 2 stores the obtained separation data ADs, DDs, FDs, and KDs in the RAM 23.

In step S5122, the memory controller 2 calculates bit counts BCA1, BCA2, BCA3, BCA4, BCA5, BCD1, BCD2, BCD3, BCD4, BCD5, BCF1, BCF2, BCF3, BCF4, BCF5, BCK1, BCK2, BCK3, BCF4, and BCK5 with the separation data ADs, DDs, FDs, and KDs. The method for the calculation will be described later.

In step S5123, the memory controller 2 determines boundary read voltages VAS, VDS, VFS, and VKS with the bit counts BCA1, BCA2, BCA3, BCA4, BCA5, BCD1, BCD2, BCD3, BCD4, BCD5, BCF1, BCF2, BCF3, BCF4, BCF5, BCK1, BCK2, BCK3, BCF4, and BCK5. The method for the determination will be described later.

The memory controller 2 then calculates shift amounts $\Delta VAS$, $\Delta VDS$, $\Delta VFS$, and $\Delta VKS$. The shift amount $\Delta VAS$ is VAS−VA. The shift amount $\Delta VDS$ is VDS−VD. The shift amount $\Delta VFS$ is VFS−VF. The shift amount $\Delta VKS$ is VKS−VK.

Step S5123 continues at step S6. When step S6 follows step S5123, the memory controller 2 specifies the shift amounts $\Delta VAS$, $\Delta VDS$, $\Delta VFS$, and $\Delta VKS$ in step S6. In step S6, the shifted boundary read voltages VAS, VDS, VFS, and VKS are used. A boundary read voltage VXS that is shifted is referred to as shifted boundary read voltage VXS.

The set of steps S5101 and S5102, the set of steps S5103 and S5104, and the set of steps S5105 and S5106 can be performed in any order differently from the order described with reference to FIG. 10.

The set of steps S5111, S5112, S5113, S5114, and S5115 may be performed before the set of steps S5101, S5102, S5103, S5104, S5105, and S5106. In this case, the NO branch of step S4 continues at step S5111, YES branch of step S5114 continues at step S5101, and step S5106 continues at step S5121.

<1.2.2.1.1. Shift Read>

Figure 11:
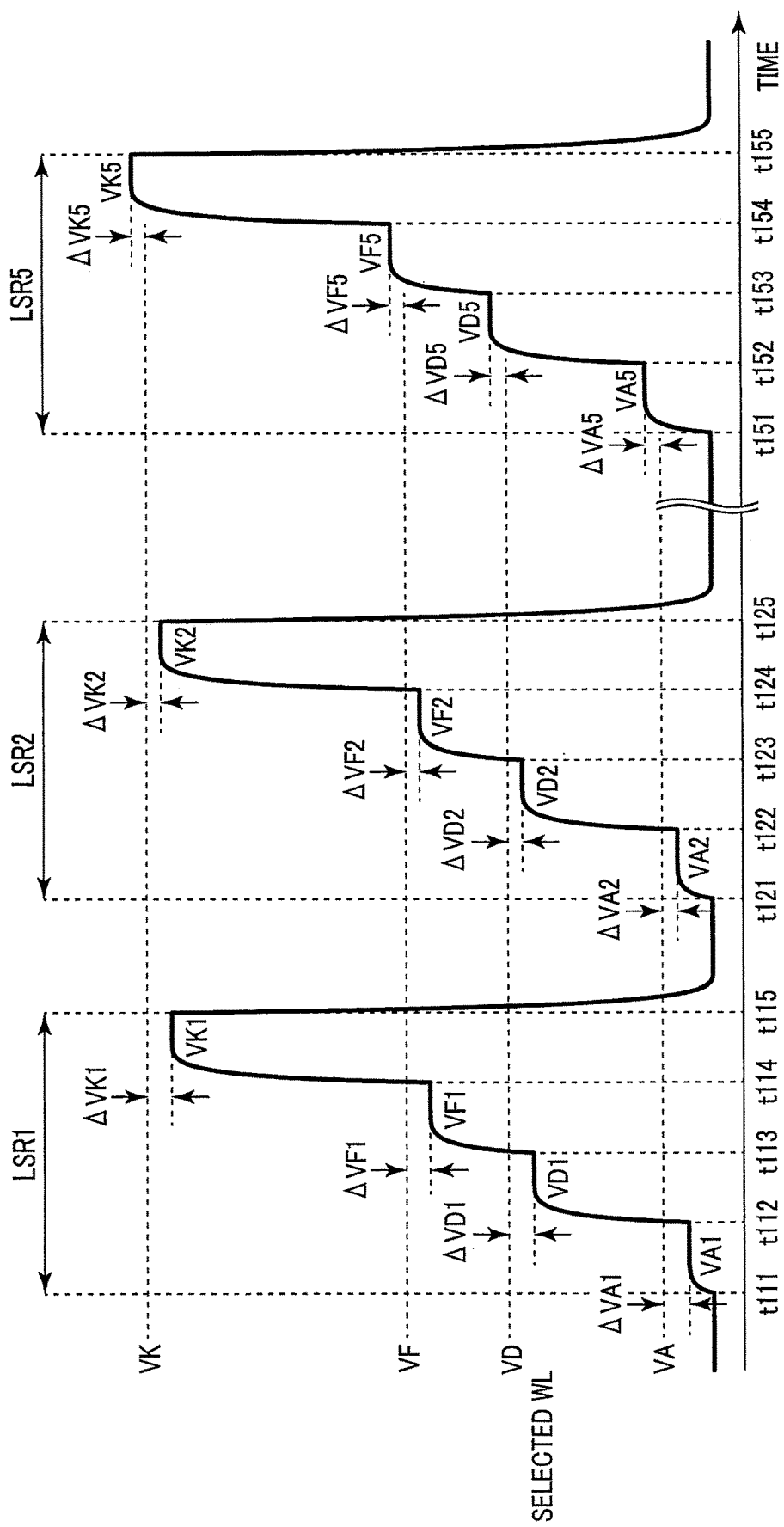
FIG. 11 shows voltages applied to a selected word line along the time during shift read from a lower page according to the first embodiment.

FIG. 11 shows voltages applied to the selected word line WL along the time in step S5113 according to the first embodiment.

As described with reference to FIG. 6, while the voltage is applied to the selected word line WL, for example, the voltage VSG is applied to the select gate line SGDL coupled to the selected string unit SU of the selected block BLK, and the voltage VREAD is applied to the unselected word lines WL.

As shown in FIG. 11, voltage application for lower page shift read LSR1 is performed in the period from time tl1 till to time t115, and voltage application for lower page shift read LSR2 is performed in the subsequent period from time t121 to time t125. Subsequently, voltage application for lower page shift read LSR3 is performed in the period from time t131 to time t135 (not shown), and voltage application for lower page shift read LSR4 is performed in the period from time t141 to time t145 (not shown). Voltage application for lower page shift read LSR5 is then performed in the period from time t151 to time t155.

In the example in FIG. 11, in each of cases in which z=1, 2, and 3, the shift amounts $\Delta VAz$, $\Delta VDz$, $\Delta VF$, and $\Delta VK$ have negative magnitudes.

In each of cases in which γ is natural numbers from 1 to 5, a read voltage VAγ is applied to the selected word line WL over the period from time t1γ1 to time t1γ2 to perform Aγ read. A read voltage VDγ is applied to the selected word line WL over the period from time t1γ2 to time t1γ3 to perform Dγ read. A read voltage VFγ is applied to the selected word line WL over the period from time t1γ3 to time t1γ4 to perform Fγ read. A read voltage VKγ is applied to the selected word line WL over the period from time t1γ4 to time t1γ5 to perform Kγ read.

<1.2.2.1.2. Data Read from Semiconductor Memory>

Figure 12:
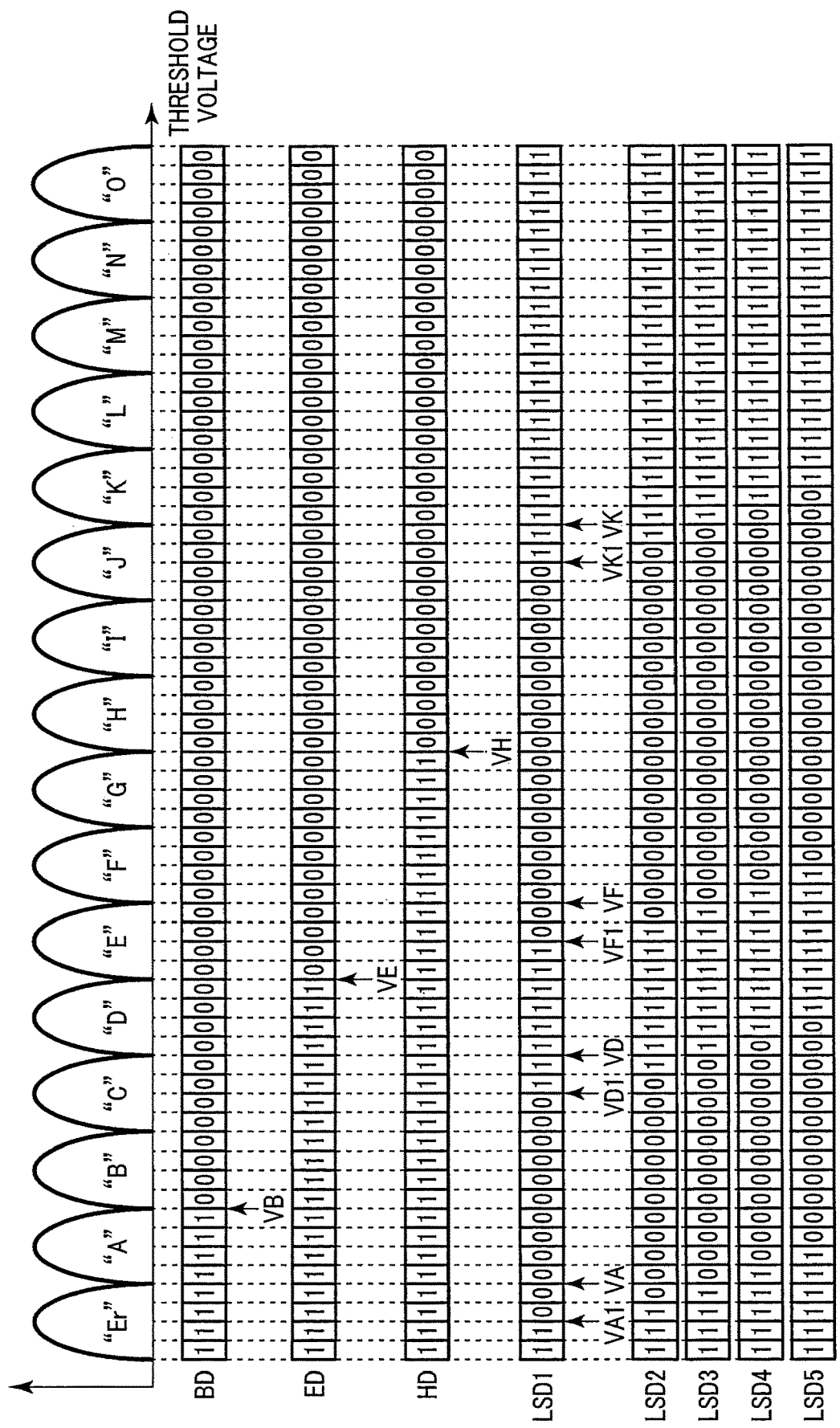
FIG. 12 shows an example of various data obtained by reads according to the first embodiment.

FIG. 12 shows an example of data obtained by steps S5102, S5104, S5106, and S5113. Each square in FIG. 12 indicates 1-bit data read from a selected memory cell transistor MT having a threshold voltage in the range corresponding to the square.

As shown in FIG. 12, the B read data BD has "1" data in each bit read from a memory cell transistor MT having a threshold voltage lower than the read voltage VB, and has "0" data in each bit read from a memory cell transistor MT having a threshold voltage equal to or higher than the read voltage VB.

The E read data ED has "1" data in each bit read from a memory cell transistor MT having a threshold voltage lower than the read voltage VE, and has "0" data in each bit read from a memory cell transistor MT having a threshold voltage equal to or higher than the read voltage VE.

The H read data HD has "1" data in each bit read from a memory cell transistor MT having a threshold voltage lower than the read voltage VH, and has "0" data in each bit read from a memory cell transistor MT having a threshold voltage equal to or higher than the read voltage VH.

The lower page shift read LSR1 uses read voltages VA1, VD1, VF1, and VK1 different from the read voltages VA, VD, VF, and VK. In performing read from a memory cell transistor MT having a threshold voltage, when different read voltages are used, bits obtained by the read can have different values. For this reason, the boundary (to be referred to as the boundary voltage hereinafter) between the threshold voltage of the memory cell transistor MT that reads out "1" data and the threshold voltage of the memory cell transistor MT that reads out "0" data in the lower page shift read data LSD1 is different from the boundary voltage in lower page read data LD0. More specifically, the boundary voltage in the lower page shift read data LSD1 is lower than that in the lower page read data LD0.

Likewise, the boundary voltages in the lower page shift read data LSD2, LSD3, LSD4, and LSD5 are different from those in the lower page shift read data LSD1. For example, the lower page shift read data LSD1, LSD2, LSD3, LSD4, and LSD5 have higher threshold voltages in the order named.

<1.2.2.1.3. Separation Data Operation>

FIGS. 13, 14, 15, and 16 each show an example of data obtained by step S5121 according to the first embodiment. FIGS. 13, 14, 15, and 16 respectively show examples of the separation data ADs, DDs, FDs, and KDs.

The memory controller 2 performs, for example, the following logical operations in the RAM 23 to generate the separation data ADs, DDs, FDs, and KDs.

<1.2.2.1.3.1. Separation Data ADs Calculation>

The separation data ADs can be obtained by equation (1).

$$ADs = LSD \ \& \ BD \qquad (1)$$

The operator "&" indicates an AND operation on two operands on both sides. In each of cases in which γ is natural numbers from 1 to 5, the memory controller 2 obtains separation data ADsγ by calculating ADsγ=LSDγ & BD.

Figure 13:
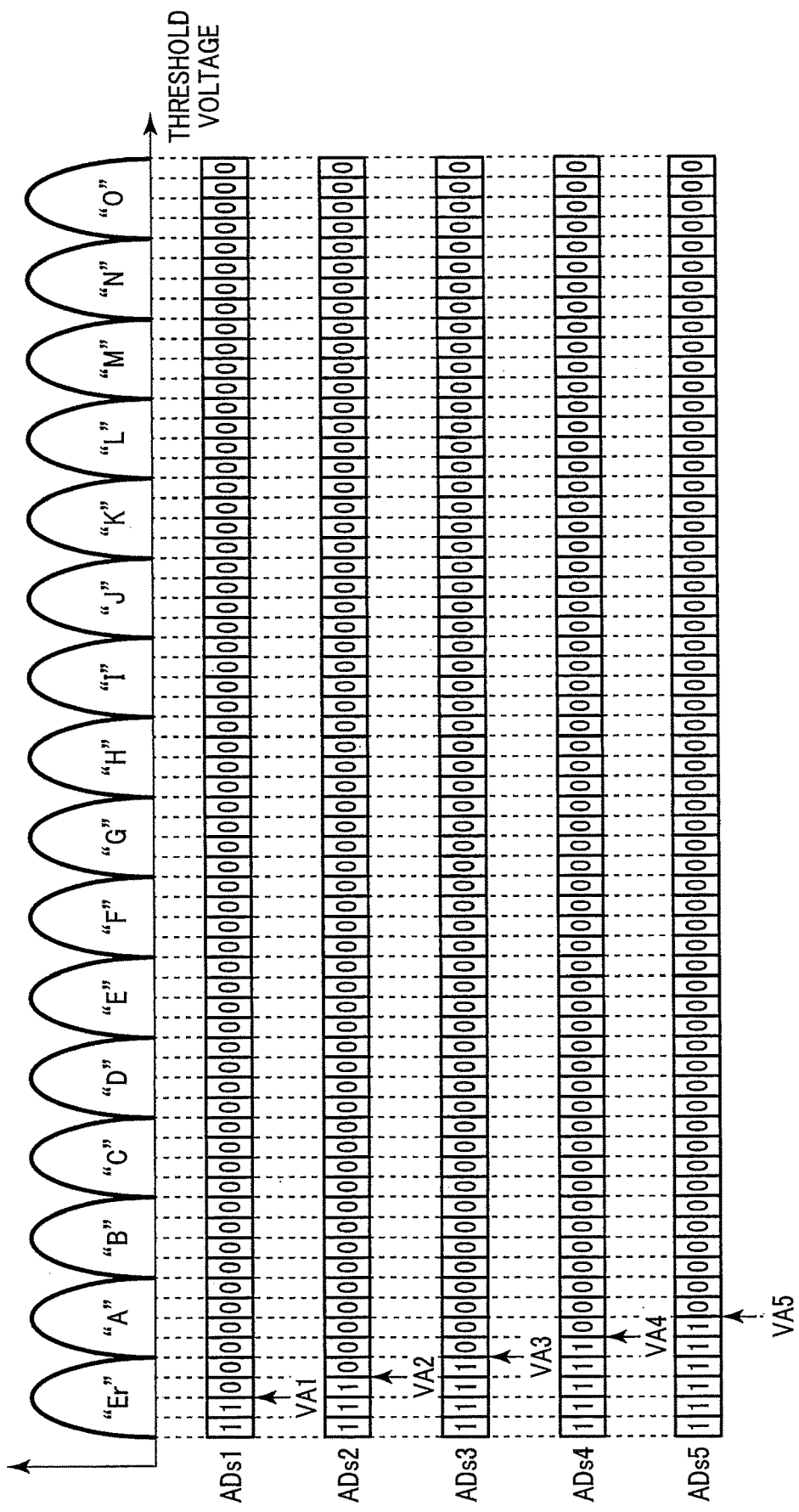
FIG. 13 shows an example of separation data obtained according to the first embodiment.

As shown in FIG. 13, the separation data ADs1, ADs2, ADs3, ADs4, and ADs5 respectively have different numbers of "1" data bits. When the numbers of "1" data bits differ, the numbers of "0" data bits also differ. In particular, the separation data ADs1, ADs2, ADs3, ADs4, and ADs5 differ in the number of "1" data bits read from the memory cell transistors MT having threshold voltages between the read voltage VA1 and the read voltage VA5. The separation data ADs1, ADs2, ADs3, ADs4, and ADs5 in each of the remaining bits have the same value.

The separation data ADs1 has no "1" data in bits read from memory cell transistors MT having threshold voltages between the read voltage VA1 and the read voltage VA5.

The separation data ADs2 has "1" data in a bit read from a memory cell transistor MT having a threshold voltage between the read voltage VA1 and the read voltage VA2.

The separation data ADs3 has "1" data in a bit read from a memory cell transistor MT having a threshold voltage between the read voltage VA1 and the read voltage VA3.

The separation data ADs4 has "1" data in a bit read from a memory cell transistor MT having a threshold voltage between the read voltage VA1 and the read voltage VA4.

The separation data ADs5 has "1" data in a bit read from a memory cell transistor MT having a threshold voltage between the read voltage VA1 and the read voltage VA5.

The number of "1" data bits in the bits read from the memory cell transistors MT having threshold voltages between the read voltage VA1 and the read voltage VA5 increases in the order of the separation data ADs1, ADs2, ADs3, ADs4, and ADs5. This makes it possible to use the separation data ADs1 to ADs5 to estimate the number of memory cell transistors MT having threshold voltages with the same magnitudes as those of the read voltages VA2 to VA5 in the selected cell unit CU.

<1.2.2.1.3.2. Separation Data DDs Calculation>

The separation data DDs can be obtained by equation (2).

$$DDs = (LSD \ \& \ ^{-}BD) \ \& \ ED \qquad (2)$$

The memory controller 2 obtains separation data DDsγ by calculating DDsγ=(LSDγ & ⁻BD) & ED in each of cases in which γ is natural numbers from 1 to 5.

Figure 14:
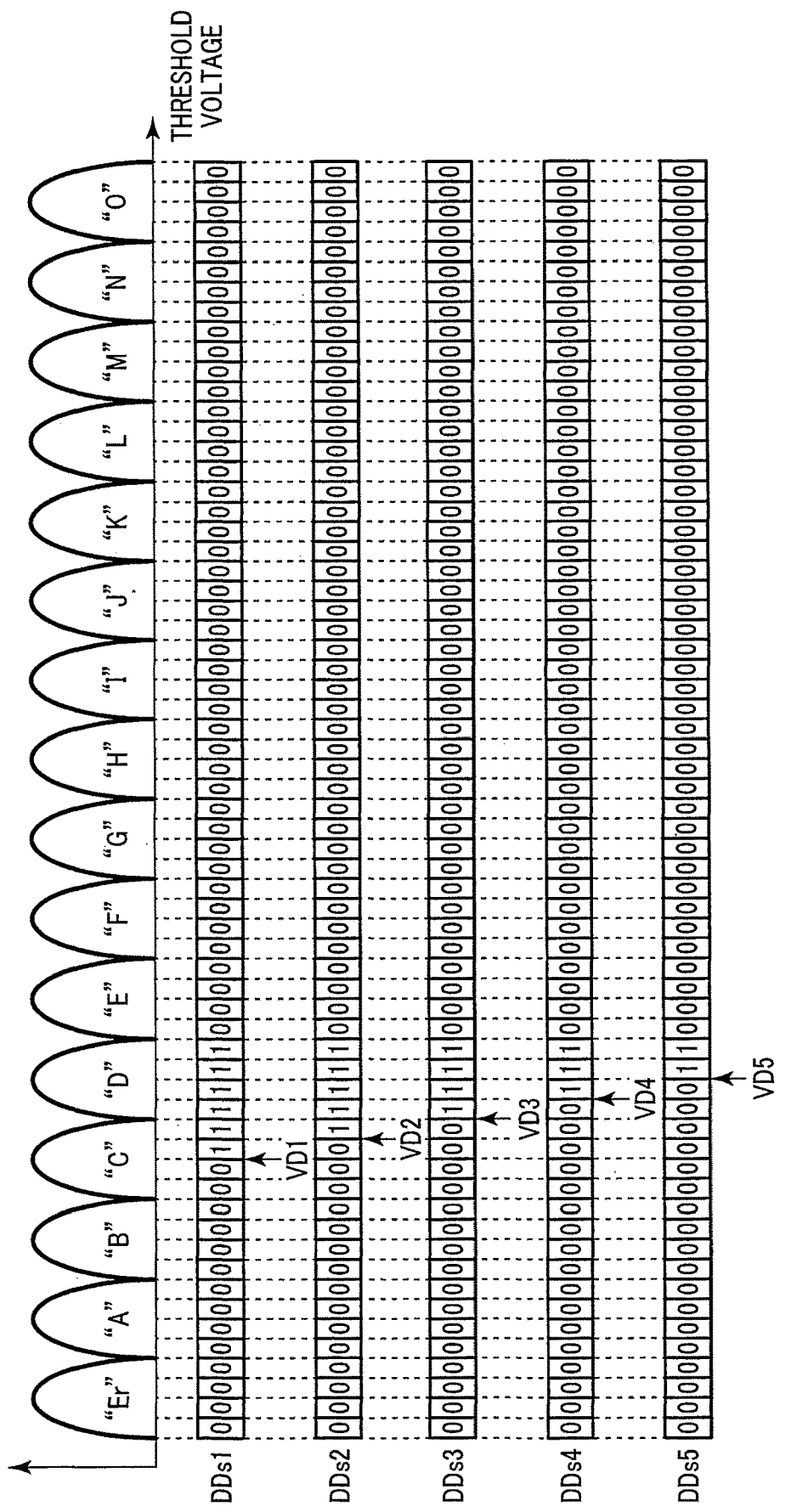
FIG. 14 shows an example of separation data obtained according to the first embodiment.

As shown in FIG. 14, the separation data DDs1, DDs2, DDs3, DDs4, and DDs5 respectively have different numbers of "1" data bits. In particular, the separation data DDs1, DDs2, DDs3, DDs4, and DDs5 differ in the number of "0" data bits read from the memory cell transistors MT having threshold voltages between the read voltage VD1 and the read voltage VDS. The separation data DDs1, DDs2, DDs3, DDs4, and DDs5 in each of the remaining bits have the same value.

The separation data DDs1 has no "0" data in bits read from memory cell transistors MT having threshold voltages between the read voltage VD1 and the read voltage VD5.

The separation data DDs2 has "0" data in a bit read from a memory cell transistor MT having a threshold voltage between the read voltage VD1 and the read voltage VD2.

The separation data DDs3 has "0" data in a bit read from a memory cell transistor MT having a threshold voltage between the read voltage VD1 and the read voltage VD3.

The separation data DDs4 has "0" data in a bit read from a memory cell transistor MT having a threshold voltage between the read voltage VD1 and the read voltage VD4.

The separation data DDs5 has "0" data in a bit read from a memory cell transistor MT having a threshold voltage between the read voltage VD1 and the read voltage VD5.

The number of "0" data bits in the bits read from the memory cell transistors MT having threshold voltages between the read voltage VD1 and the read voltage VD5 increases in the order of the separation data DDs1, DDs2, DDs3, DDs4, and DDs5. This makes it possible to use the separation data DDs1 to DDs5 to estimate the number of memory cell transistors MT having threshold voltages with the same magnitudes as those of the read voltages VD2 to VD5 in the selected cell unit CU.

<1.2.2.1.3.3. Separation Data FDs Calculation>

The separation data FDs can be obtained by equation (3).

$$FDs = (LSD \ \& \ ^{-}ED) \ \& \ HD \qquad (3)$$

The memory controller 2 obtains separation data FDsγ by calculating FDsγ=(LSDγ & ⁻ED) & HD in each of cases in which γ is natural numbers from 1 to 5.

Figure 15:
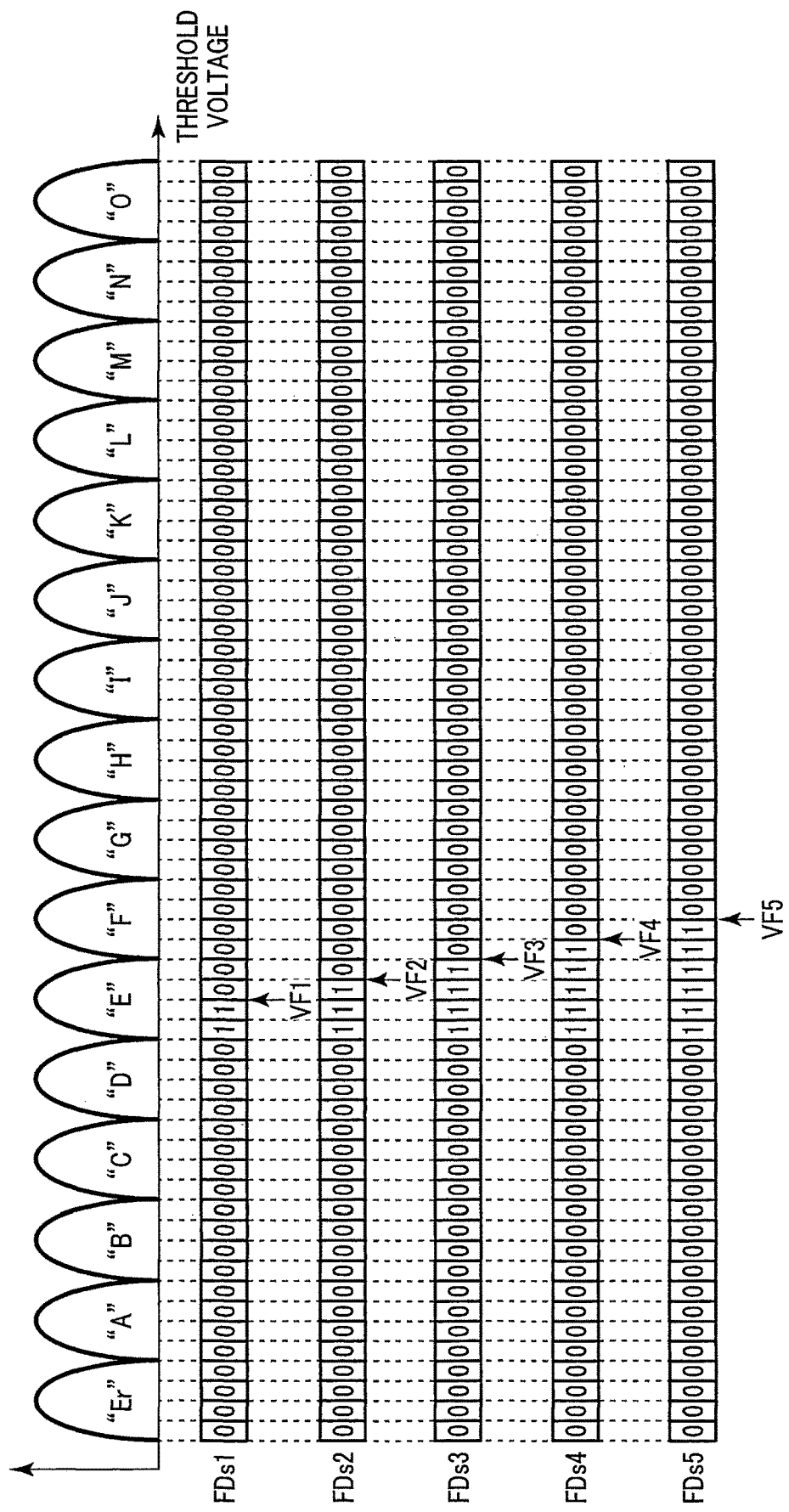
FIG. 15 shows an example of separation data obtained according to the first embodiment.

As shown in FIG. 15, the separation data FDs1, FDs2, FDs3, FDs4, and FDs5 respectively have different numbers of "1" data bits. In particular, the separation data FDs1, FDs2, FDs3, FDs4, and FDs5 differ in the number of "1" data bits read from the memory cell transistors MT having threshold voltages between the read voltage VF1 and the read voltage VF5. The separation data FDs1, FDs2, FDs3, FDs4, and FDs5 in each of the remaining bits have the same value.

The separation data FDs1 has no "1" data in bits read from memory cell transistors MT having threshold voltages between the read voltage VF1 and the read voltage VF5.

The separation data FDs2 has "1" data in a bit read from a memory cell transistor MT having a threshold voltage between the read voltage VF1 and the read voltage VF2.

The separation data FDs3 has "1" data in a bit read from a memory cell transistor MT having a threshold voltage between the read voltage VF1 and the read voltage VF3.

The separation data FDs4 has "1" data in a bit read from a memory cell transistor MT having a threshold voltage between the read voltage VF1 and the read voltage VF4.

The separation data FDs5 has "1" data in a bit read from a memory cell transistor MT having a threshold voltage between the read voltage VF1 and the read voltage VF5.

The number of "1" data bits in the bits read from the memory cell transistors MT having threshold voltages between the read voltage VF1 and the read voltage VF5 increases in the order of the separation data FDs1, FDs2, FDs3, FDs4, and FDs5. This makes it possible to use the separation data FDs1 to FDs5 to estimate the number of memory cell transistors MT having threshold voltages with the same magnitudes as those of the read voltages VF2 to VF5 in the selected cell unit CU.

<1.2.2.1.3.4. Separation Data KDs Calculation>

The separation data KDs can be obtained by equation (4).

$$KDs = LSD \ \& \ ^-HD \quad (4)$$

The memory controller 2 obtains separation data KDsγ by calculating KDsγ=LSDγ & ¯HD in each of cases in which γ is natural numbers from 1 to 5.

Figure 16:
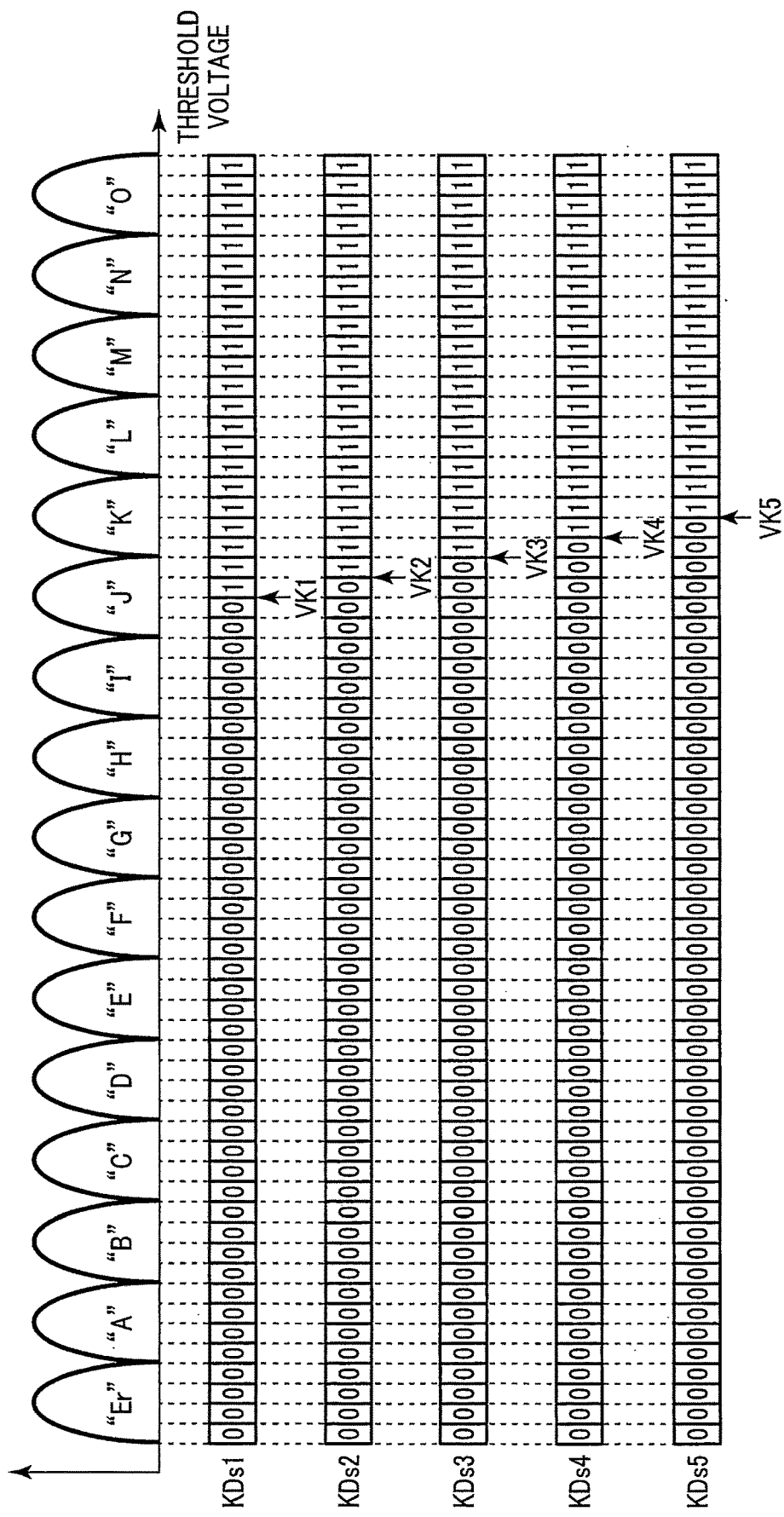
FIG. 16 shows an example of separation data obtained according to the first embodiment.

As shown in FIG. 16, the separation data KDs1, KDs2, KDs3, KDs4, and KDs5 respectively have different numbers of "0" data bits. In particular, the separation data KDs1, KDs2, KDs3, KDs4, and KDs5 differ in the number of "0" data bits read from the memory cell transistors MT having threshold voltages between the read voltage VK1 and the read voltage VKS. The separation data KDs1, KDs2, KDs3, KDs4, and KDs5 in each of the remaining bits have the same value.

The separation data KDs1 has no "0" data in bits read from memory cell transistors MT having threshold voltages between the read voltage VK1 and the read voltage VKS.

The separation data KDs2 has "0" data in a bit read from a memory cell transistor MT having a threshold voltage between the read voltage VK1 and the read voltage VK2.

The separation data KDs3 has "0" data in a bit read from a memory cell transistor MT having a threshold voltage between the read voltage VK1 and the read voltage VK3.

The separation data KDs4 has "0" data in a bit read from a memory cell transistor MT having a threshold voltage between the read voltage VK1 and the read voltage VK4.

The separation data KDs5 has "0" data in a bit read from a memory cell transistor MT having a threshold voltage between the read voltage VK1 and the read voltage VK5.

The number of "0" data bits in the bits read from the memory cell transistors MT having threshold voltages between the read voltage VK1 and the read voltage VK5 increases in the order of the separation data KDs1, KDs2, KDs3, KDs4, and KDs5. This makes it possible to use the separation data KDs1 to KDs5 to estimate the number of memory cell transistors MT having threshold voltages with the same magnitudes as those of the read voltages VK2 to VK5 in the selected cell unit CU.

<1.2.2.1. Four-Bit Count and Shifted Boundary Read Voltage Estimation>

Figure 17:
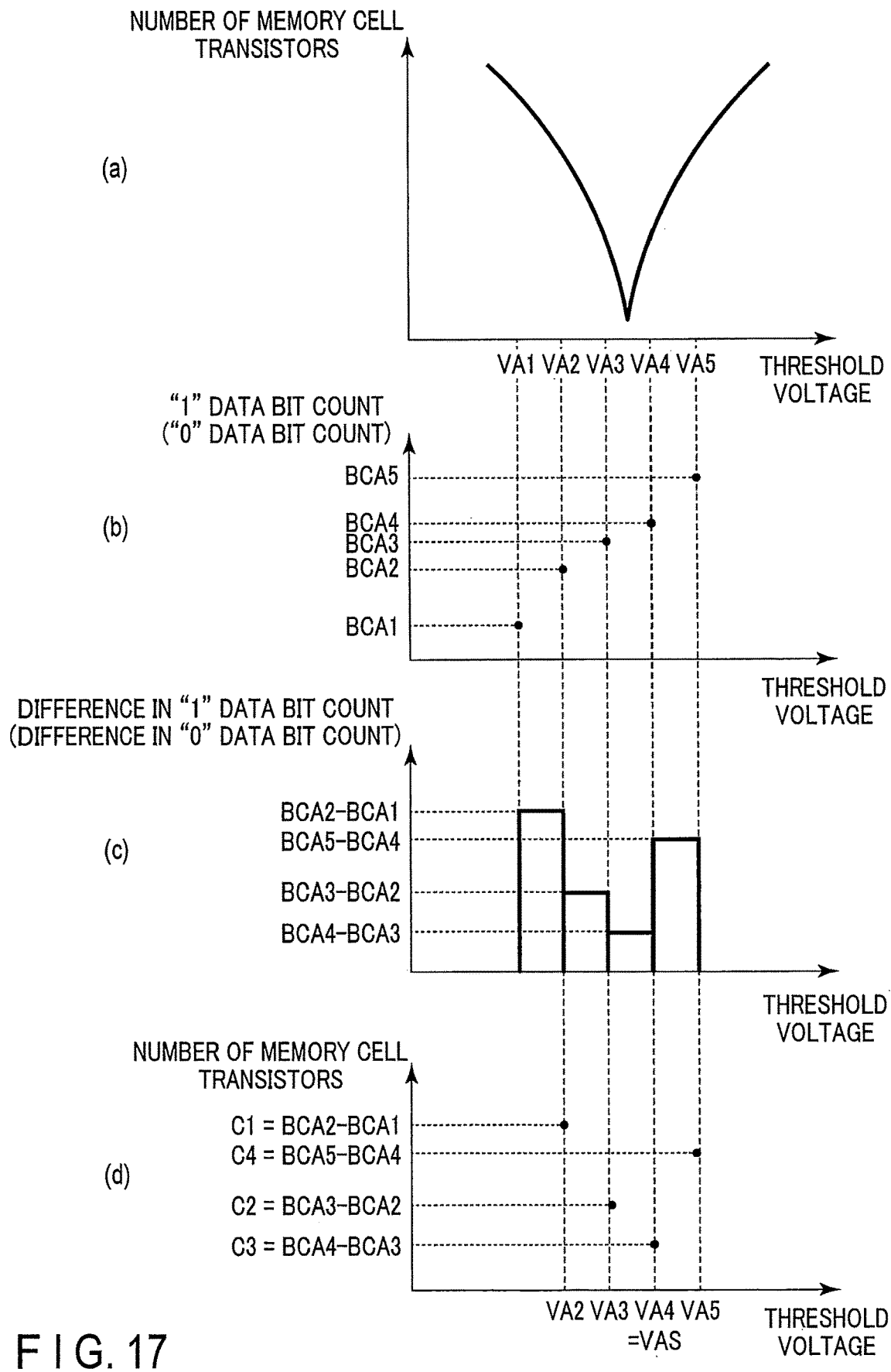
FIG. 17 shows processing according to the first embodiment.

FIG. 17 is a view for describing processing in steps S5122 and S5123 according to the first embodiment. FIG. 17 shows the processing for estimating shifted boundary read voltages VAS in steps S5122 and S5123.

Part (a) shows a range including a boundary between the distribution of the threshold voltages of the memory cell transistors MT which are written as Er state and the distribution of the threshold voltages of the memory cell transistors MT which are written as A state. Note, however, that the memory controller 2 does not know a distribution shown in part (a).

The memory controller 2 counts "0" data bits or "1" data bits in each of the separation data ADs1 to ADs5. The memory controller 2 can count, for example, the number of "0" data bits or the number of "1" data bits which increases in ascending order of the separation data ADs1 to ADs5. When counting in the separation data ADs1 to ADs5, the memory controller 2 can count "1" data in each of the separation data ADs1 to ADs5.

Part (b) shows an example of the counts. The bit count BCA1 is the number of "1" data bits in the separation data based on VA1 read data, i.e., the separation ADs1. The bit count BCA2 is the number of "1" data bits in the separation data ADs2. The bit count BCA3 is the number of "1" data bits in the separation data ADs3. The bit count BCA4 is the number of "1" data bits in the separation data ADs4. The bit count BCA5 is the number of "1" data bits in the separation data ADs5.

The memory controller 2 then calculates the differences between specific pairs of the bit counts BCA1, BCA2, BCA3, BCA4, and BCA5. More specifically, the memory controller 2 calculates BCA2−BCA1, BCA3−BCA2, BCA4−BCA3, and BCA5−BCA4. Part (c) shows an example of the calculation result.

Each difference represents the number of memory cell transistors MT that are turned on first at corresponding threshold voltages. For example, BCA2−BCA1 represents the number of memory cell transistors MT that are not turned on at the read voltage VA1 but turned on at the read voltage VA2. Based on this, the memory controller 2 regards each difference as the number of corresponding memory cell transistors MT. For example, BCA2−BCA1 is regarded as the number of memory cell transistors MT having a threshold voltage with the same magnitude as that of the read voltage VA2. The relationships between such differences and threshold voltages equivalently represent the numbers of memory cell transistors MT respectively having threshold voltages with the same magnitudes as those of the read voltages VA2, VA3, VA4, and VAS. Part (d) shows these relationships.

The number of memory cell transistors MT having a threshold voltage with the same magnitude as that of the read voltage VA2 is BCA2−BCA1=C1. Likewise, the number of memory cell transistors MT having a threshold voltage with the same magnitude as that of the read voltage VA3 is BCA3−BCA2=C2. The number of memory cell transistors MT having a threshold voltage with the same magnitude as that of the read voltage VA4 is BCA4−BCA3=C3. The number of memory cell transistors MT having a threshold voltage with the same magnitude as that of the read voltage VA5 is BCA5−BCA4=C4.

The memory controller 2 then detects the smallest one of the counts C1 to C4 as a valley position (a local minimum position), and determines to use a threshold voltage corresponding to the valley position as the shifted boundary read voltage VAS.

The processing described with reference to FIG. 17 is performed on a set of the separation data DDs1 to DDs5, a set of the separation data FDs1 to FDs5, and a set of the separation data KDs1 to KDs5. As a result, the shifted boundary read voltages VDS, VFS, and VKS can be determined in the same manner of determining the shifted boundary read voltage VAS.

<1.2.2.2. When Selected Page is Middle Page>

Figure 18:
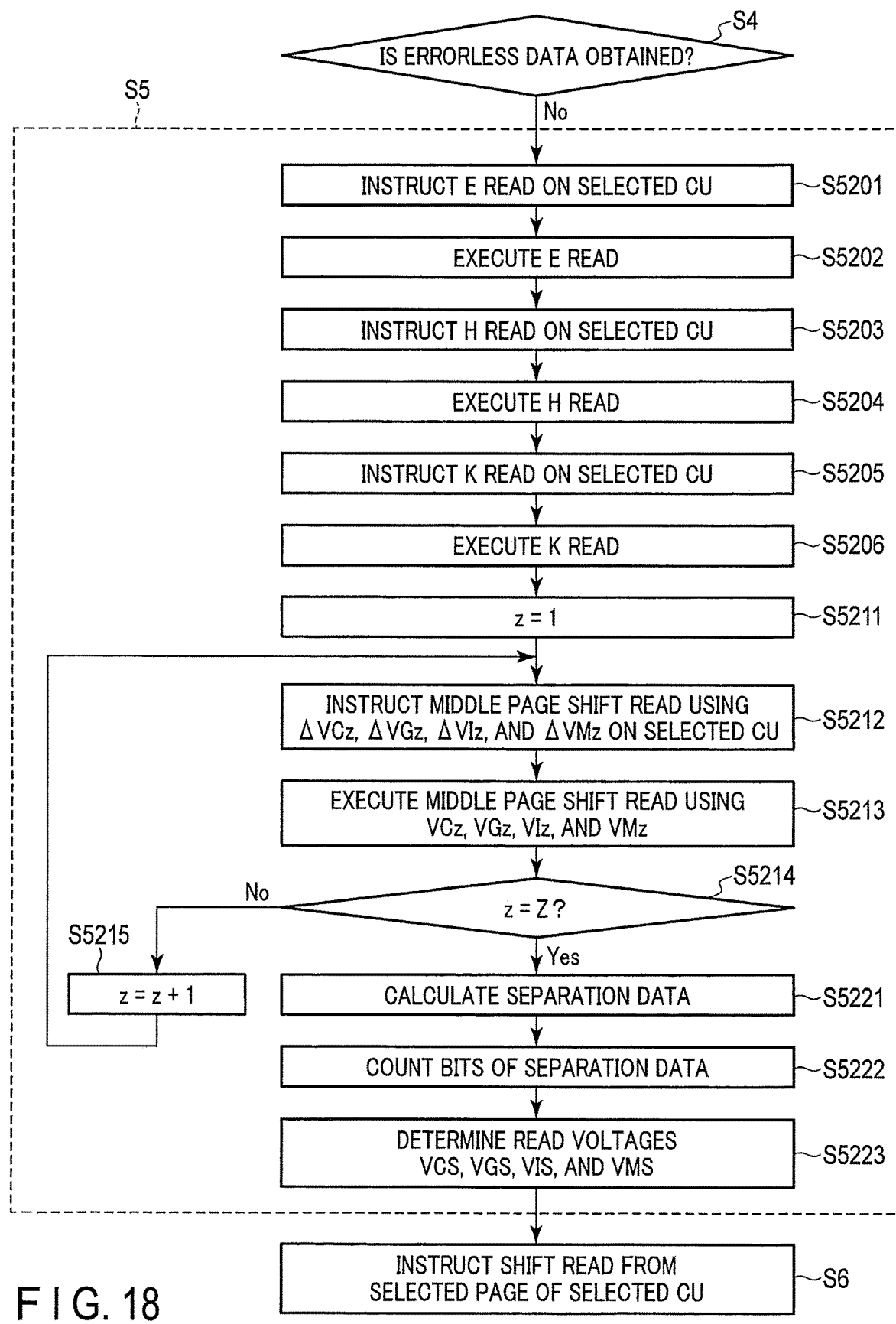
FIG. 18 is a sub-flowchart when a middle page is selected according to the first embodiment.

FIG. 18 is a sub-flowchart for step S5 when a middle page is selected according to the first embodiment. As shown in FIG. 18, the NO branch of step S4 goes to step S5201. A procedure for determining shifted boundary read voltages when a middle page is selected is almost the same as the procedure for determining the shifted boundary read voltages when the lower page is selected. Accordingly, differences from the processing shown in FIG. 10 will be mainly described below.

The memory controller 2 obtains the E read data ED, the H read data HD, and the K read data KD in steps S5201 to S5206. Steps S5201, S5202, S5203, and S5204 are respectively the same as steps S5103, S5104, S5105, and S5106 in FIG. 10. In step S5205, the memory controller 2 instructs K read instead of E read in step S5201. In step S5206, the memory controller 2 executes K read and transmits the K read data KD instead of executing E read and transmitting the E read data ED in step S5202.

The memory controller 2 performs shift read Z times in steps S5211 to S5215 as in steps S5111 to S5115 in FIG. 10. Shift amounts $\Delta VC$, $\Delta VG$, $\Delta VI$, and $\Delta VM$ in each shift read are different from shift amounts $\Delta VC$, $\Delta VG$, $\Delta VI$, and $\Delta VM$ in another shift read.

In step S5211, the memory controller 2 sets z to 1 as in step S5111 in FIG. 10.

Step S5212 is similar to step S5112 in FIG. 10. In step S5212, the memory controller 2 instructs middle page read (middle page shift read) MSRz using shift read voltages in the zth loop on the selected cell unit CU. In middle page shift read MSRz, the memory controller 2 specifies shift amounts $\Delta VCz$, $\Delta VGz$, $\Delta VIz$, and $\Delta VMz$.

Step S5213 is similar to step S5113 in FIG. 10. In step S5213, the semiconductor memory 1 performs middle page shift read MSRz on the selected cell unit CU with the shift amounts $\Delta VCz$, $\Delta VGz$, $\Delta VIz$, and $\Delta VMz$. That is, the semiconductor memory 1 performs middle page shift read with shift read voltages $\Delta VCz$, $\Delta VGz$, $\Delta VIz$, and $\Delta VMz$ instead of the read voltages VC, VG, VI, and VM. The shift read voltage VCz is $VC+\Delta VCz$. The shift read voltage VGz is $VG+\Delta VGz$. The shift read voltage VIz is $VI+\Delta VIz$. The shift read voltage VMz is $VM+\Delta VMz$. The data obtained by middle page shift read MSRz is referred to as middle page shift read data MSDz.

Steps S5214 and S5215 are the same as steps S5114 and S5115 in FIG. 10. When z≠Z (NO branch of step S5214), the memory controller 2 sets z=z+1 in step S5215. The process then returns to step S5212. When z=Z (YES branch of step S5214), the process goes to step S5221. When the process goes to step S5221, the memory controller 2 should store middle page shift read data MSD1, MSD2, MSD3, MSD4, and MSD5.

Step S5221 is similar to step S5121 in FIG. 10. In step S5221, the memory controller 2 masks particular bits of the middle page shift read data MSD1 to MSD5 with the E read data ED, the H read data HD, and the K read data KD as in step S5121. To this end, the memory controller 2 performs logical operations using the E read data ED, the H read data HD, the K read data KD, and the middle page shift read data MSD1 to MSD5. Performing the logical operations will produce separation data CDs such as CDs1, CDs2, CDs3, CDs4, and CDs5, GDs such as GDs1, GDs2, GDs3, GDs4, and GDs5, IDs such as IDs1, IDs2, IDs3, IDs4, and IDs5, and MDs such as MDs1, MDs2, MDs3, MDs4, and MDs5. Separation data CDsz, GDsz, IDsz, and MDsz each are formed from part of the middle page shift read data MSDz. A method of obtaining the separation data CDs, GDs, IDs, and MDs will be described later. The memory controller 2 stores the obtained separation data CDs, GDs, IDs, and MDs in the RAM 23.

Step S5222 is similar to step S5122 in FIG. 10. In step S5222, the memory controller 2 calculates bit counts BCC1, BCC2, BCC3, BCC4, BCC5, BCG1, BCG2, BCG3, BCG4, BCG5, BCI1, BCI2, BCI3, BCI4, BCI5, BCM1, BCM2, BCM3, BCM4, and BCM5 with the separation data CDs, GDs, IDs, and MDs as in step S5122.

Step S5223 is similar to step S5123 in FIG. 10. In step S5223, the memory controller 2 determines shifted boundary read voltages VCS, VGS, VIS and VMS with the bit counts BCC1, BCC2, BCC3, BCC4, BCC5, BCG1, BCG2, BCG3, BCG4, BCG5, BCI1, BCI2, BCI3, BCI4, BCI5, BCM1, BCM2, BCM3, BCM4, and BCM5 as in step S5123.

The memory controller 2 then calculates shift amounts $\Delta VCS$, $\Delta VGS$, $\Delta VIS$, and $\Delta VMS$. The shift amount $\Delta VCS$ is VCS−VC. The shift amount $\Delta VGS$ is VGS−VG. The shift amount $\Delta VIS$ is VIS−VI. The shift amount $\Delta VMS$ is VMS−VM.

Step S5223 continues at step S6. When step S6 follows step S5223, the memory controller 2 specifies the shift amounts $\Delta VCS$, $\Delta VGS$, $\Delta VIS$, and $\Delta VMS$ in step S6.

The set of steps S5201 and S5202, the set of steps S5203 and S5204, and the set of steps S5205 and S5206 can be performed in any order differently from the order described with reference to FIG. 18.

The set of steps S5211, S5212, S5213, S5214, and S5215 may be performed before the set of steps S5201, S5202, S5203, S5204, S5205, and S5206. In this case, N0 branch of step S4 continues at step S5211, YES branch of step S5214 continues at step S5201, and step S5206 continues at step S5221.

<1.2.2.2.1. Shift Read>

FIG. 19 shows voltages applied to the selected word line WL along the time in step S5213 according to the first embodiment.

As described with reference to FIG. 6, while the voltage is applied to the selected word line WL, for example, the voltage VSG is applied to the select gate line SGDL coupled to the selected string unit SU of the selected block BLK, and the voltage VREAD is applied to the unselected word lines WL.

As shown in FIG. 19, voltage application for middle page shift read MSR1 is performed in the period from time t211 to time t215, and voltage application for middle page shift read MSR2 is performed in the subsequent period from time t221 to time t225. Subsequently, voltage application for middle page shift read MSR3 is performed in the period from time t231 to time t235 (not shown), and voltage application for middle page shift read MSR4 is performed in the period from time t241 to time t245 (not shown). Voltage application for middle page shift read MSR5 is then performed in the period from time t251 to time t255.

In the example in FIG. 19, in each of cases in which z=1, 2, and 3, the shift amounts $\Delta VCz$, $\Delta VGz$, $\Delta VI$, and $\Delta VM$ have negative magnitudes.

Likewise, in each of cases in which γ is natural numbers from 1 to 5 (inclusive), a read voltage VCγ is applied to the selected word line WL over the period from time t2γ1 to time t2γ2 to perform Cy read. A read voltage VGγ is applied to the selected word line WL over the period from time t2γ2 to time t2γ3 to perform Gγ read. A read voltage VIγ is applied to the selected word line WL over the period from time t2γ3 to time t2γ4 to perform Iγ read. A read voltage VMγ is applied to the selected word line WL over the period from time t2γ4 to time t2γ5 to perform Mγ read.

<1.2.2.2.2. Separation Data Calculation>

In step S5221, the memory controller 2 performs, for example, the following logical operations in the RAM 23 to generate the separation data CDs, GDs, IDs, and MDs.

The separation data CDs can be obtained by equation (5).

$$CDs\gamma = MSD \ \& \ ED \qquad (5)$$

The memory controller 2 obtains separation data CDsγ by calculating CDsγ=MSDγ & ED in each of cases in which γ is natural numbers from 1 to 5. The separation data CDs1, CDs2, CDs3, CDs4, and CDs5 have different numbers of "1" data (and "0" data) bits.

The separation data GDs can be obtained by equation (6).

$$GDs = (MSD \ \& \ ^-ED) \ \& \ HD \qquad (6)$$

The memory controller 2 obtains separation data GDsγ by calculating GDsγ=(MSDγ & ¯ED) & HD in each of cases in which γ is natural numbers from 1 to 5. The separation data GDs1, GDs2, GDs3, GDs4, and GDs5 have different numbers of "1" data (and "0" data) bits.

The separation data IDs can be obtained by equation (7).

$$IDs = (MSD \text{ \& } {}^-HD) \text{ \& } KD \quad (7)$$

The memory controller 2 obtains separation data IDsγ by calculating IDsγ=(MSDγ & ⁻HD) &KD in each of cases in which γ is natural numbers from 1 to 5. The separation data IDs1, IDs2, IDs3, IDs4, and IDs5 have different numbers of "1" data (and "0" data) bits. The separation data MDs can be obtained by equation (8).

$$MDs = MSD \text{ \& } {}^-KD \quad (8)$$

The memory controller 2 obtains separation data MDsγ by calculating MDsγ=MSDγ & ⁻KD in each of cases in which γ is natural numbers from 1 to 5. The separation data MDs1, MDs2, MDs3, MDs4, and MDs5 have different numbers of "1" data (and "0" data) bits.

In each of cases in which δ is C, G, I, and M, the numbers of "1" data (or "0" data) bits read from memory cell transistors MT having threshold voltages between a read voltage Vol and a read voltage Vδ5 increase in the order of separation data δDs1, δDs2, δDs3, δDs4, and δDs5. Accordingly, the separation data δDs1 to δDs5 can be used to estimate the numbers of memory cell transistors MT having threshold voltages with the same magnitudes as those of read voltages Vδ2 to Vδ5 in the selected cell unit CU.

<1.2.2.2.3. Identification of Bit Counts and Shifted Boundary Read Voltages>

The memory controller 2 performs the processing described with reference to FIG. 17 on a set of the separation data CDs1 to CDs5, a set of the separation data GDs1 to GDs5, a set of the separation data IDs1 to IDs5, and a set of the separation data MDs1 to MDs5. As a result, the shifted boundary read voltages VCS, VGS, VIS, and VMS can be determined in the same manner as determining the shifted boundary read voltage VAS.

<1.2.2.3. When Selected Page is Upper Page>

Figure 20:
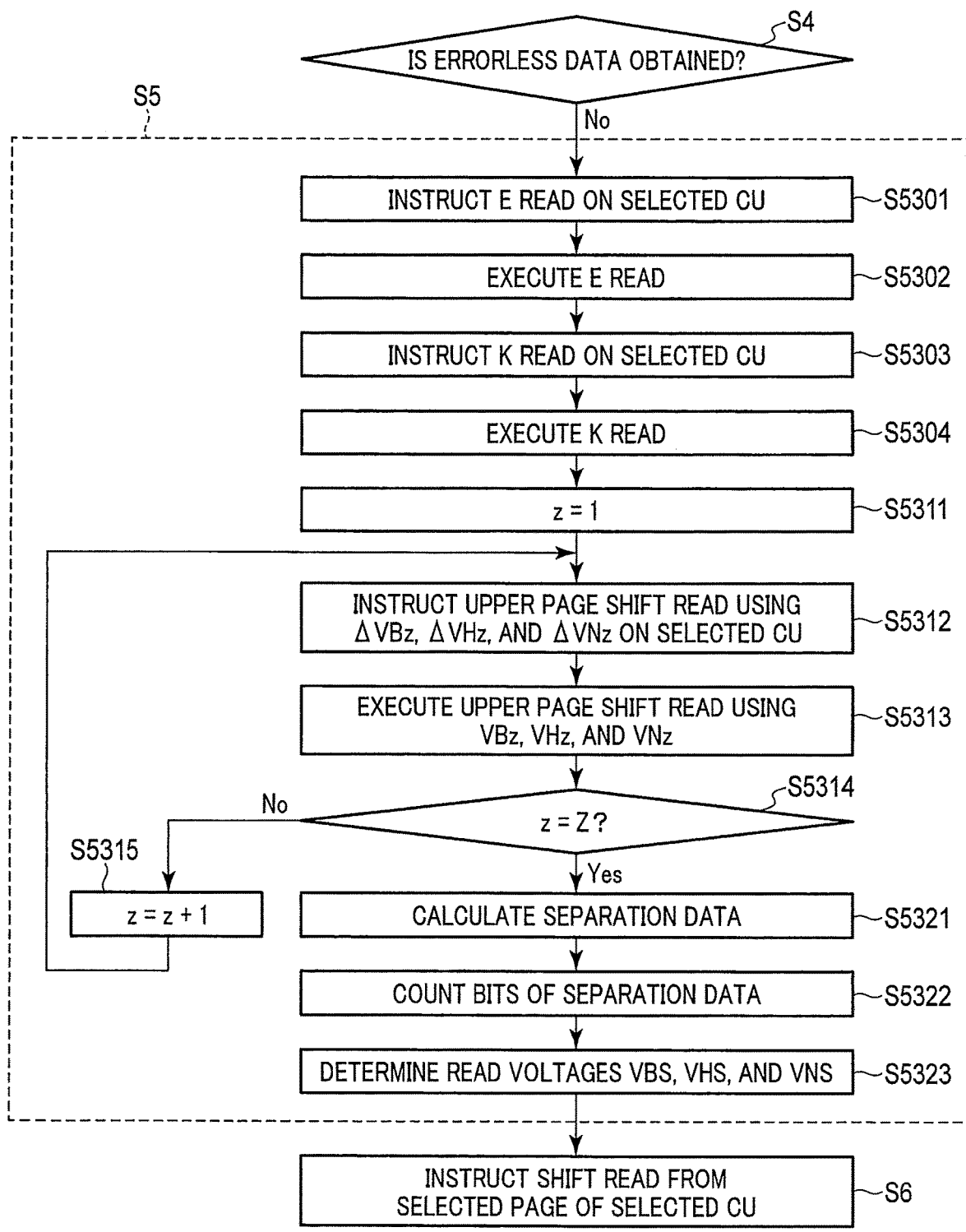
FIG. 20 is a sub-flowchart when an upper page is selected according to the first embodiment.

FIG. 20 is a sub-flowchart for step S5 when an upper page is selected according to the first embodiment. As shown in FIG. 20, the NO branch of step S4 goes to step S5301. A procedure for determining shifted boundary read voltages when an upper page is selected is almost the same as the procedure for determining the shifted boundary read voltages when the lower page is selected. Accordingly, differences from the processing shown in FIG. 10 will be mainly described below.

The memory controller 2 obtains the E read data ED and the K read data KD in steps S5301 to S5304. Steps S5301 and S5302 are respectively the same as steps S5103 and S5104 in FIG. 10. In step S5303, the memory controller 2 instructs K read instead of E read in step S5301. In step S5304, the memory controller 2 executes K read and transmits the K read data KD instead of executing E read and transmitting the E read data ED in step S5302.

The memory controller 2 performs shift read Z times in steps S5311 to S5315 as in steps S5111 to S5115 in FIG. 10. Shift amounts ΔVB, ΔVH, and ΔVN in each shift read are different from shift amounts ΔVB, ΔVH, and ΔVN in another shift read.

In step S5311, the memory controller 2 sets z to 1 as in step S5111 in FIG. 10.

Step S5312 is similar to step S5112 in FIG. 10. In step S5312, the memory controller 2 instructs upper page read (upper page shift read) USRz using shift read voltages in the zth loop on the selected cell unit CU. In upper page shift read USRz, the memory controller 2 specifies shift amounts ΔVBz, ΔVHz, and ΔVNz.

Step S5313 is similar to step S5113 in FIG. 10. In step S5313, the semiconductor memory 1 performs upper page shift read USRz on the selected cell unit CU with the shift amounts ΔVBz, ΔVHz, and ΔVNz. That is, the semiconductor memory 1 performs upper page shift read with shift read voltages VBz, VHz, and VNz instead of the read voltages VB, VH, and VN. The shift read voltage VBz is VB+ΔVBz. The shift read voltage VHz is VH+ΔVHz. The shift read voltage VNz is VN+ΔVNz. The data obtained by upper page shift read USRz is referred to as upper page shift read data USDz.

Steps S5314 and S5315 are the same as steps S5114 and S5115 in FIG. 10. When z≠Z (NO branch of step S5314), the memory controller 2 sets z=z+1 in step S5315. The process then returns to step S5312. When z=Z (YES branch of step S5314), the process goes to step S5321. When the process goes to step S5321, the memory controller 2 should store upper page shift read data USD1, USD2, USD3, USD4, and USD5.

Step S5321 is similar to step S5121 in FIG. 10. In step S5321, the memory controller 2 masks particular bits of the upper page shift read data USD1 to USD5 with the E read data ED, and the K read data KD as in step S5121. To this end, the memory controller 2 performs logical operations using the E read data ED, the K read data KD, and the upper page shift read data USD1 to USD5. Performing the logical operations will produce separation data BDs such as BDs1, BDs2, BDs3, BDs4, and BDs5, HDs such as HDs1, HDs2, HDs3, HDs4, and HDs5, and NDs such as NDs1, NDs2, NDs3, NDs4, and NDs5. Separation data BDsz, HDsz, and NDsz each are formed from part of the upper page shift read data USDz. A method of obtaining the separation data BDs, HDs, and NDs will be described later. The memory controller 2 stores the obtained separation data BDs, HDs, and NDs in the RAM 23.

Step S5322 is similar to step S5122 in FIG. 10. In step S5322, the memory controller 2 calculates bit counts BCB1, BCB2, BCB3, BCB4, BCB5, BCH1, BCH2, BCH3, BCH4, BCH5, BCN1, BCN2, BCN3, BCN4, and BCN5 with the separation data BDs, HDs, and NDs as in step S5122.

Step S5323 is similar to step S5123 in FIG. 10. In step S5323, the memory controller 2 determines shifted boundary read voltages VBS, VHS, and VNS with the bit counts BCB1, BCB2, BCB3, BCB4, BCB5, BCH1, BCH2, BCH3, BCH4, BCH5, BCN1, BCN2, BCN3, BCN4, and BCN5 as in step S5123.

The memory controller 2 then calculates shift amounts ΔVBS, ΔVHS, and ΔVMS. The shift amount ΔVBS is VBS−VB. The shift amount ΔVHS is VHS−VH. The shift amount ΔVMS is VNS−VN.

Step S5323 continues as step S6. When step S6 follows step S5323, the memory controller 2 specifies the shift amounts ΔVBS, ΔVHS, and ΔVMS in step S6.

The set of steps S5301 and S5302 and the set of steps S5303 and S5304 can be performed in any order differently from the order described with reference to FIG. 20.

The set of steps S5311, S5312, S5313, S5314, and S5315 may be performed before the set of steps S5301, S5302, S5303, and S5304. In this case, NO branch of step S4 continues at step S5311, YES branch of step S5314 continues at step S5301, and step S5304 continues at step S5321.

<1.2.2.3.1. Shift Read>

Figure 21:
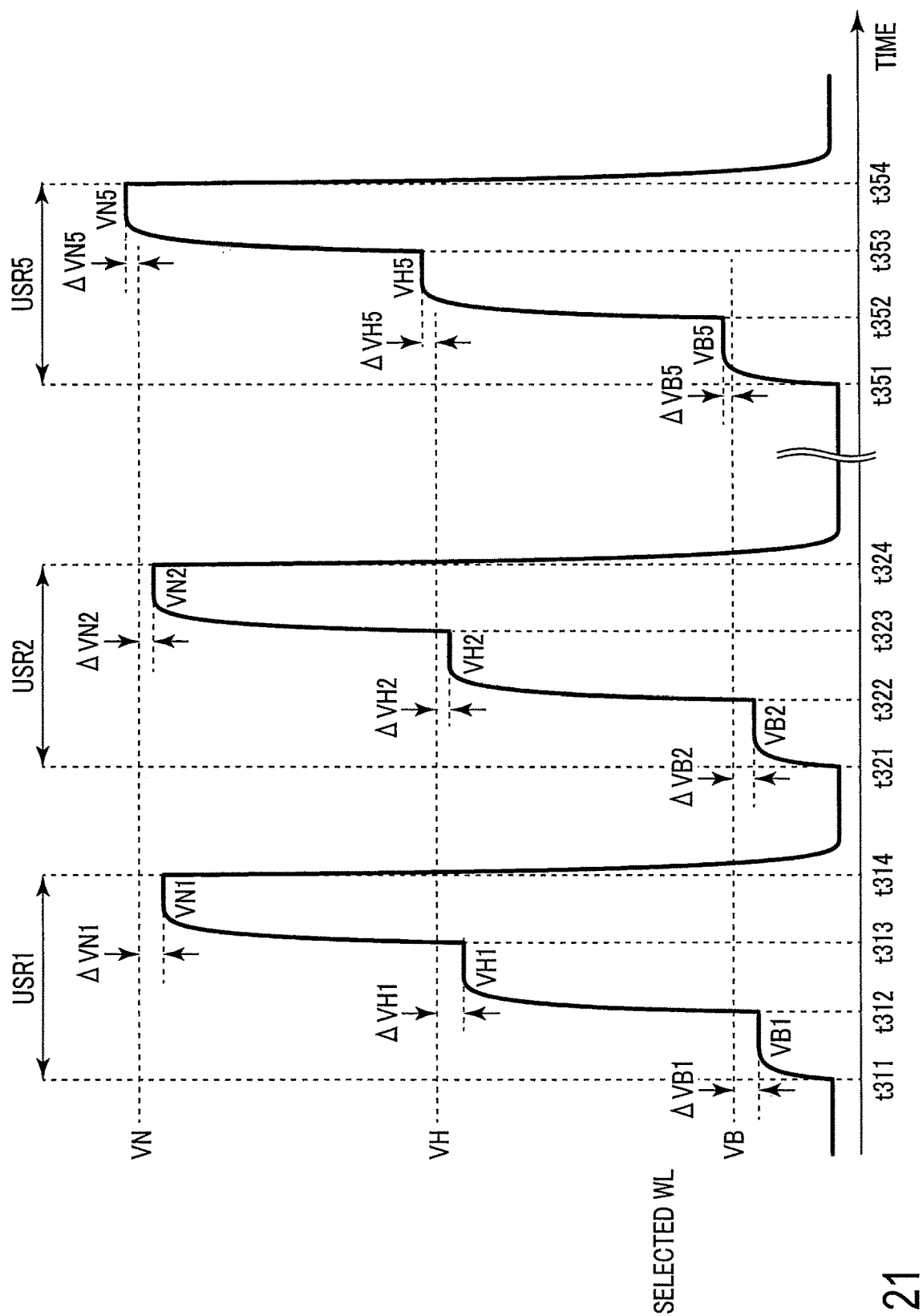
FIG. 21 shows voltages applied to a selected word line along the time during shift read from an upper page according to the first embodiment.

FIG. 21 shows voltages applied to the selected word line WL along the time in step S5313 according to the first embodiment.

As described with reference to FIG. 6, while the voltage is applied to the selected word line WL, for example, the voltage VSG is applied to the select gate line SGDL coupled to the selected string unit SU of the selected block BLK, and the voltage VREAD is applied to the unselected word lines WL.

As shown in FIG. 21, voltage application for upper page shift read USR1 is performed in the period from time t311 to time t314, and voltage application for upper page shift read USR2 is performed in the subsequent period from time t321 to time t324. Subsequently, voltage application for upper page shift read USR3 is performed in the period from time t331 to time t334 (not shown), and voltage application for upper page shift read USR4 is performed in the period from time t341 to time t344 (not shown). Voltage application for upper page shift read USR5 is then performed in the period from time t351 to time t354.

In the example in FIG. 11, in each of cases in which z=1, 2, and 3, the shift amounts $\Delta$VBz, $\Delta$VHz, and $\Delta$VN have negative magnitudes.

Likewise, in each of cases in which $\gamma$ is natural numbers from 1 to 5 (inclusive), a read voltage VB$\gamma$ is applied to the selected word line WL over the period from time t3$\gamma$1 to time t3$\gamma$2 to perform B$\gamma$ read. A read voltage VH$\gamma$ is applied to the selected word line WL over the period from time t3$\gamma$2 to time t3$\gamma$3 to perform H$\gamma$ read. A read voltage VN$\gamma$ is applied to the selected word line WL over the period from time t3$\gamma$3 to time t3$\gamma$4 to perform N$\gamma$ read.

<1.2.2.3.2. Separation Data Calculation>

In step S5321, the memory controller 2 performs, for example, the following logical operations in the RAM 23 to generate the separation data BDs, HDs, and NDs.

The separation data BDs can be obtained by equation (9).

$$BDs = USD \,\&\, ED \qquad (9)$$

The memory controller 2 obtains separation data BDs$\gamma$ by calculating BDs$\gamma$=USD$\gamma$ & ED in each of cases in which $\gamma$ is natural numbers from 1 to 5. The separation data BDs1, BDs2, BDs3, BDs4, and BDs5 have different numbers of "1" data (and "0" data) bits.

The separation data HDs can be obtained by equation (10).

$$HDs = (USD \,\&\, {}^-ED) \,\&\, KD \qquad (10)$$

The memory controller 2 obtains separation data HDs$\gamma$ by calculating HDs$\gamma$=(USD$\gamma$ & $^-$ED) & KD in each of cases in which $\gamma$ is natural numbers from 1 to 5. The separation data HDs1, HDs2, HDs3, HDs4, and HDs5 have different numbers of "1" data bits.

The separation data NDs can be obtained by equation (11).

$$NDs = USD \,\&\, {}^-KD \qquad (11)$$

The memory controller 2 obtains separation data NDs$\gamma$ by calculating NDs$\gamma$=USD$\gamma$ & $^-$KD in each of cases in which $\gamma$ is natural numbers from 1 to 5. The separation data BDs1, BDs2, BDs3, BDs4, and BDs5 have different numbers of "1" data (and "0" data) bits.

In each of cases in which $\delta$ is B, H, and N, the numbers of "1" data (or "0" data) bits read from memory cell transistors MT having threshold voltages between a read voltage Vo1 and a read voltage V$\delta$5 increase in the order of separation data $\delta$Ds1, $\delta$Ds2, $\delta$Ds3, $\delta$Ds4, and $\delta$Ds5. Accordingly, the separation data $\delta$Ds1 to $\delta$Ds5 can be used to estimate the numbers of memory cell transistors MT having threshold voltages with the same magnitudes as those of read voltages V$\delta$2 to V$\delta$5 in the selected cell unit CU.

<1.2.2.3.3. Identification of Bit Counts and Shifted Boundary Read Voltages>

The memory controller 2 performs the processing described with reference to FIG. 17 on a set of the separation data BDs1 to BDs5, a set of the separation data HDs1 to HDs5, and a set of the separation data MDs1 to MDs5. As a result, the shifted boundary read voltages VBS, VHS, and VNS can be determined in the same manner as determining the shifted boundary read voltage VAS.

<1.2.2.4. When Selected Page is Top Page>

Figure 22:
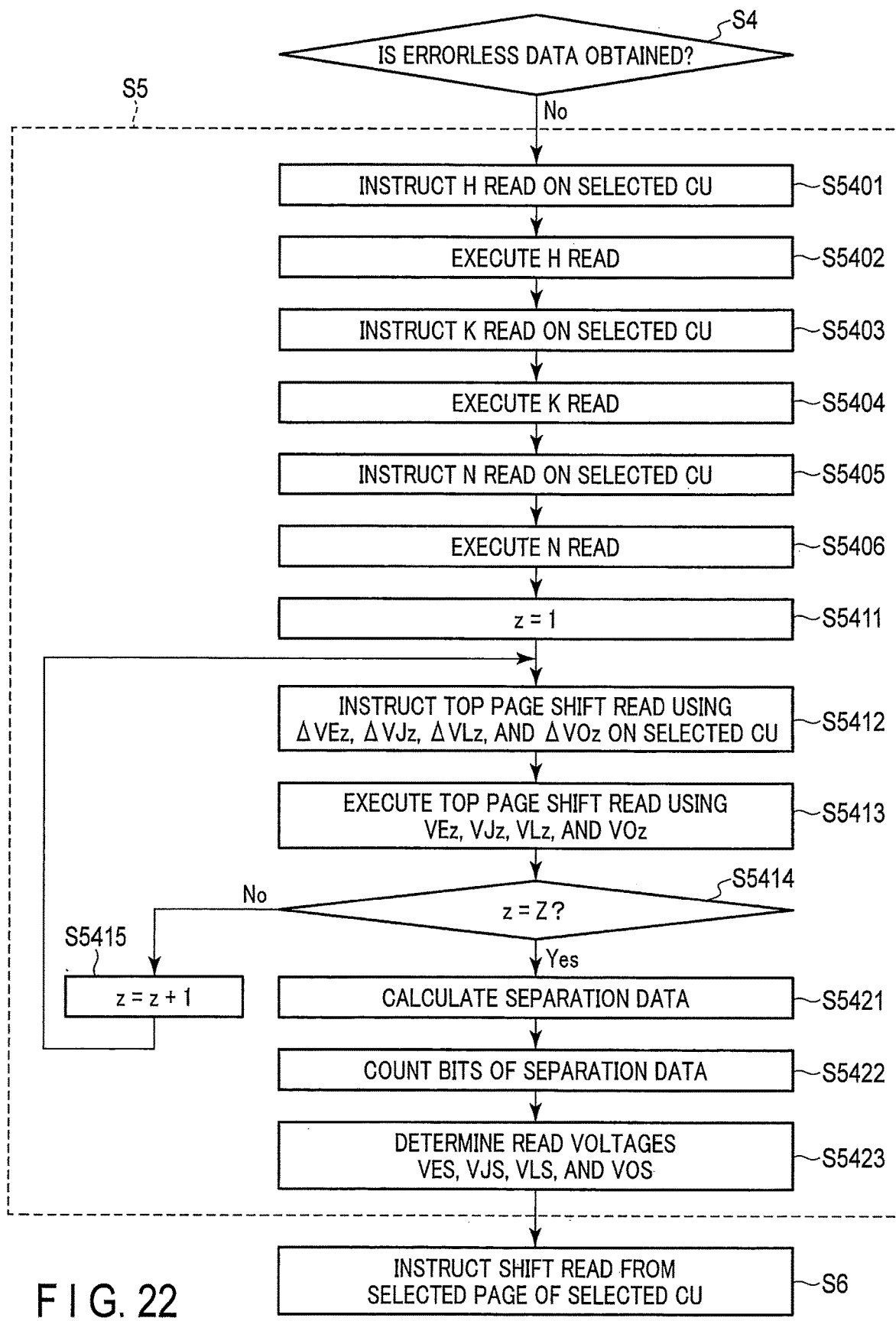
FIG. 22 is a sub-flowchart when a top page is selected according to the first embodiment.

FIG. 22 is a sub-flowchart for step S5 when a top page is selected according to the first embodiment. As shown in FIG. 22, if the NO branch of step S4 goes to step S5401. A procedure for determining shifted boundary read voltages when a top page is selected is almost the same as the procedure for determining the shifted boundary read voltages when the lower page is selected. Accordingly, differences from the processing shown in FIG. 10 will be mainly described below.

The memory controller 2 obtains the H read data HD, the K read data KD, and the N read data ND in steps S5401 to S5406. Steps S5401 and S5402 are respectively the same as steps S5105 and S5106 in FIG. 10. In step S5403, the memory controller 2 instructs K read instead of H read in step S5401. In step S5404, the memory controller 2 executes K read and transmits the K read data KD instead of executing H read and transmitting the H read data HD in step S5402. In step S5405, the memory controller 2 instructs N read instead of H read in step S5401. In step S5406, the memory controller 2 executes N read and transmits the N read data ND instead of executing H read and transmitting the H read data HD in step S5402.

The memory controller 2 performs shift read Z times in steps S5411 to S5415 as in steps S5111 to S5115 in FIG. 10. Shift amounts $\Delta$VE, $\Delta$VJ, $\Delta$VL, and $\Delta$VO in each shift read are different from shift amounts $\Delta$VE, $\Delta$VJ, $\Delta$VL, and $\Delta$VO in another shift read.

In step S5411, the memory controller 2 sets z to 1 as in step S5111 in FIG. 10.

Step S5412 is similar to step S5112 in FIG. 10. In step S5412, the memory controller 2 instructs top page read (top page shift read) TSRz using shift read voltages in the zth loop on the selected cell unit CU. In top page shift read TSRz, the memory controller 2 specifies shift amounts $\Delta$VEz, $\Delta$VJz, $\Delta$VLz, and $\Delta$VOz.

Step S5413 is similar to step S5113 in FIG. 10. In step S5413, the semiconductor memory 1 performs top page shift read TSRz on the selected cell unit CU with the shift amounts $\Delta$VEz, $\Delta$VJz, $\Delta$VLz, and $\Delta$VOz. That is, the semiconductor memory 1 performs top page shift read with shift read voltages VEz, VJz, VLz, and VOz instead of the read voltages VE, VJ, VL, and VO. The shift read voltage VEz is VE+$\Delta$VEz. The shift read voltage VJz is VJ+$\Delta$VJz. The shift read voltage VLz is VL+$\Delta$VLz. The shift read voltage VOz is VO+$\Delta$VOz. The data obtained by top page shift read TSRz is referred to as top page shift read data TSDz.

Steps S5414 and S5415 are the same as steps S5114 and S5115 in FIG. 10. When z≠Z (NO branch of step S5414), the memory controller 2 sets z=z+1 in step S5415. The process then returns to step S5412. When z=Z (YES branch of step S5414), the process goes to step S5421. When the process goes to step S5421, the memory controller 2 should store top page shift read data TSD1, TSD2, TSD3, TSD4, and TSD5.

Step S5421 is similar to step S5121 in FIG. 10. In step S5421, the memory controller 2 masks particular bits of the top page shift read data TSD1 to TSD5 with the H read data HD, the K read data KD, and the N read data ND as in step S5121. To this end, the memory controller 2 performs logical operations using the H read data HD, the K read data KD, the N read data ND and the top page shift read data TSD1 to TSD5. Performing these logical operations will produce separation data EDs such as EDs1, EDs2, EDs3, EDs4, and EDs5, JDs such as JDs1, JDs2, JDs3, JDs4, and JDs5, LDs such as LDs1, LDs2, LDs3, LDs4, and LDs5, and ODs such as ODs1, ODs2, ODs3, ODs4, and ODs5. Separation data EDsz, JDsz, LDsz, and ODsz each are formed from part of the top page shift read data TSDz. A method of obtaining the separation data EDs, JDs, LDs, and ODs will be described later. The memory controller 2 stores the obtained separation data EDs, JDs, LDs, and ODs in the RAM 23.

Step S5422 is similar to step S5122 in FIG. 10. In step S5422, the memory controller 2 calculates bit counts BCE1, BCE2, BCE3, BCE4, BCE5, BCJ1, BCJ2, BCJ3, BCJ4, BCJ5, BCL1, BCL2, BCL3, BCL4, BCL5, BCO1, BCO2, BCO3, BCO4, and BCO5 with the separation data EDs, JDs, LDs, and ODs as in step S5122.

Step S5423 is similar to step S5123 in FIG. 10. In step S5423, the memory controller 2 determines shifted boundary read voltages VES, VJS, VLS, and VOS with the bit counts BCE1, BCE2, BCE3, BCE4, BCE5, BCJ1, BCJ2, BCJ3, BCJ4, BCJ5, BCL1, BCL2, BCL3, BCL4, BCL5, BCO1, BCO2, BCO3, BCO4, and BCO5 as in step S5123.

The memory controller 2 then calculates shift amounts $\Delta$VES, $\Delta$VJS, $\Delta$VLS and $\Delta$VOS. The shift amount $\Delta$VES is VES−VE. The shift amount $\Delta$VJS is VJS−VJ. The shift amount $\Delta$VLS is VLS−VL. The shift amount $\Delta$VOS is VOS−VO.

Step S5423 continues at step S6. When step S6 follows step S5423, the memory controller 2 specifies the shift amounts $\Delta$VES, $\Delta$VJS, $\Delta$VLS, and $\Delta$VOS in step S6.

The set of steps S5401 and S5402, the set of steps S5403 and S5404, and the set of steps S5405 and S5406 can be performed in any order differently from the order described with reference to FIG. 22.

The set of steps S5411, S5412, S5413, S5414, and S5415 may be performed before the set of steps S5401, S5402, S5403, S5404, S5405, and S5406. In this case, N0 branch of step S4 continues at step S5411, YES branch of step S5414 continues at step S5401, and step S5406 continues at S5421.

<1.2.2.4.1. Shift Read>

Figure 23:
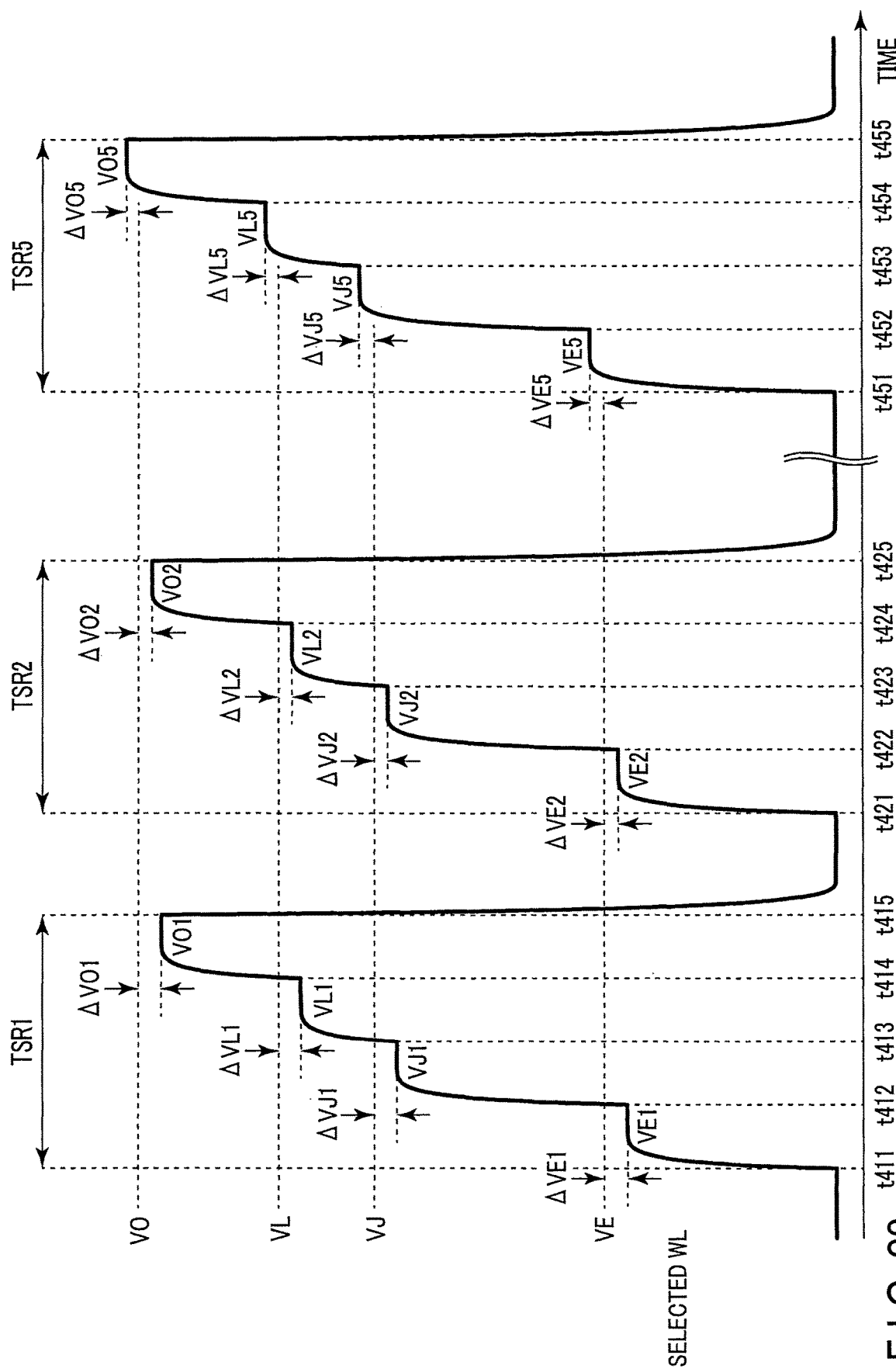
FIG. 23 shows voltages applied to a selected word line along the time during shift read from a top page according to the first embodiment.

FIG. 23 shows voltages applied to the selected word line WL along the time in step S5413 according to the first embodiment.

As described with reference to FIG. 6, while the voltage is applied to the selected word line WL, for example, the voltage VSG is applied to the select gate line SGDL coupled to the selected string unit SU of the selected block BLK, and the voltage VREAD is applied to the unselected word lines WL.

As shown in FIG. 23, voltage application for top page shift read TSR1 is performed in the period from time t411 to time t415, and voltage application for top page shift read TSR2 is performed in the subsequent period from time t421 to time t425. Subsequently, voltage application for top page shift read TSR3 is performed in the period from time t431 to time t435 (not shown), and voltage application for top page shift read TSR4 is performed in the period from time t441 to time t445 (not shown). Voltage application for top page shift read TSR5 is then performed in the period from time t451 to time t455.

In the example in FIG. 23, in each of cases in which z=1, 2, and 3, the shift amounts $\Delta$VEz, $\Delta$VJz, $\Delta$VL, and $\Delta$VO have negative magnitudes.

Likewise, in each of cases in which γ is natural numbers from 1 to 5 (inclusive), a read voltage VEγ is applied to the selected word line WL over the period from time t4γ1 to time t4γ2 to perform Eγ read. A read voltage VJγ is applied to the selected word line WL over the period from time t4γ2 to time t4γ3 to perform Jγ read. A read voltage VLγ is applied to the selected word line WL over the period from time t4γ3 to time t4γ4 to perform Lγ read. A read voltage VOγ is applied to the selected word line WL over the period from time t4γ4 to time t4γ5 to perform Oγ read.

<1.2.2.4.2. Separation Data Calculation>

In step S5421, the memory controller 2 performs, for example, the following logical operations in the RAM 23 to generate the separation data EDs, JDs, LDs, and ODs.

The separation data EDs can be obtained by equation (12).

$$EDs = TSD \,\&\, HD \tag{12}$$

The memory controller 2 obtains separation data EDsγ by calculating EDsγ=TSDγ & HD in each of cases in which γ is natural numbers from 1 to 5. The separation data EDs1, EDs2, EDs3, EDs4, and EDs5 have different numbers of "1" data (and "0" data) bits.

The separation data JDs can be obtained by equation (13).

$$JDs = (TSD \,\&\, {}^{-}HD) \,\&\, KD \tag{13}$$

The memory controller 2 obtains separation data JDsγ by calculating JDsγ=(TSDγ & ⁻HD) & KD in each of cases in which γ is natural numbers from 1 to 5. The separation data JDs1, JDs2, JDs3, JDs4, and JDs5 have different numbers of "1" data (and "0" data) bits.

The separation data LDs can be obtained by equation (14).

$$LDs = (TSD \,\&\, {}^{-}KD) \,\&\, ND \tag{14}$$

The memory controller 2 obtains separation data LDsγ by calculating LDsγ=(TSD & KD) & ND in each of cases in which γ is natural numbers from 1 to 5. The separation data LDs1, LDs2, LDs3, LDs4, and LDs5 have different numbers of "1" data (and "0" data) bits.

The separation data ODs can be obtained by equation (15).

$$ODs = TSD \,\&\, {}^{-}ND \tag{15}$$

The memory controller 2 obtains separation data ODsγ by calculating ODsγ=TSDγ & ⁻ND in each of cases in which γ is natural numbers from 1 to 5. The separation data ODs1, ODs2, ODs3, ODs4, and ODs5 have different numbers of "1" data (and "0" data) bits.

In each of cases in which δ is E, J, L, and O, the numbers of "1" data (or "0" data) bits read from memory cell transistors MT having threshold voltages between a read voltage Voltage Voltage Vδ5 increase in the order of separation data ODs1, ODs2, ODs3, ODs4, and δDs5. Accordingly, the separation data δDs1 to δDs5 can be used to estimate the numbers of memory cell transistors MT having threshold voltages with the same magnitudes as those of read voltages Vδ2 to Vδ5 in the selected cell unit CU.

<1.2.2.4.3. Identification of Bit Counts and Shifted Boundary Read Voltages>

The memory controller 2 performs the processing described with reference to FIG. 17 on a set of the separation data EDs1 to EDs5, a set of the separation data JDs1 to JDs5, a set of the separation data LDs1 to LDs5, and a set of the separation data ODs1 to ODs5. As a result, the shifted boundary read voltages VES, VJS, and VLS, and VOS can be determined in the same manner as determining the shifted boundary read voltage VAS.

<1.3. Advantages (Effects)>

According to the first embodiment, necessary shifted boundary read voltages VCGRS can be determined in a short period of time, as will be described below.

For comparison, when errorless data is not obtained from data read from a selected page, the shifted boundary read voltage VCGRS can be determined in the following manner. That is, a plurality of shifted boundary read voltages VCGRS required for the selected page are determined by individual tracking. For example, when a lower page is a read target with four-bit allocation in a state like that shown in FIG. 3, estimating the shifted boundary read voltage VAS requires performing single state read Z (for example, five) times using a plurality of read voltages VCGR having different magnitudes near the read voltage VA. The data obtained by such single state reads are transmitted from the semiconductor memory to the memory controller. The memory controller determines the shifted boundary read voltage VAS from the received data. It is necessary to perform such Z single state reads, the transmission of the single state read data from the semiconductor memory to the memory controller, and the determination of the shifted boundary read voltage VCGRS, in order to determine the remaining shifted boundary read voltages VDS, VFS, and VKS. It is, therefore, necessary to transfer page-size data from the semiconductor memory to the memory controller 4×Z (=20) times. This requires a long time.

The same applies to other pages. In each of the cases of a middle page and a top page, data transfer needs to be performed 4×Z (=20) times. In the case of an upper page, data transfer needs to be performed 3×Z (=15) times.

When other pages are read targets or bit allocation differs from that shown in FIG. 3, the necessary number of times of data transfer can vary. Based on any bit allocation, even if the number of times of data transfer in a first page is small, the number of times of data transfer is accordingly large in a second page. That is, in the method according to the comparative example, the average of the numbers of times of data transfer required for read from pages is large.

According to the first embodiment, shift read is performed a plurality of times with all the boundary read voltages VCGR in a selected page shifted, shift read data is masked based on the results obtained by single state read performed several times to obtain separation data, and the shifted boundary read voltages VCGRS are determined from the separation data. Accordingly, the number of times 1-page size data is transmitted from the semiconductor memory 1 to the memory controller 2 for the estimation of the shifted boundary read voltages VCGRS is smaller than that in the case described above for comparison. The maximum number of times of transmission of page-size data occurs in the cases of a lower page, a middle page, and a top page, and it is total of 3+Z (=8), including three times of transmission of single state read data and Z times of transmission of lower page shift read data. Therefore, the shifted boundary read voltages VCGRS can be determined based on the number of times of transmission of page-size data which is smaller than that in the method according to the comparative example. This makes it possible to determine the shifted boundary read voltages VCGRS in a shorter time than in the method according to the comparative example.

<1.4. Modification>

Equations (1) to (15) each are merely an example of a logical operation. Any logical operation can be used as long as separation data having the above characteristics can be obtained.

Second Embodiment

The second embodiment is similar to the first embodiment and concerns an example in which shifted boundary read voltages VCGRS like those in the first embodiment are determined for all four pages of a selected cell unit CU together.

<2.1. Structure (Configuration)>

A memory system 5 according to the second embodiment has the same components and connections as those in the memory system 5 according to the first embodiment. A memory controller 2 according to the second embodiment is configured to perform the operation described below. More specifically, firmware in the ROM 24 is configured to cause the memory controller 2 to perform the operation described below.

<2.2. Operation>

Figure 24:
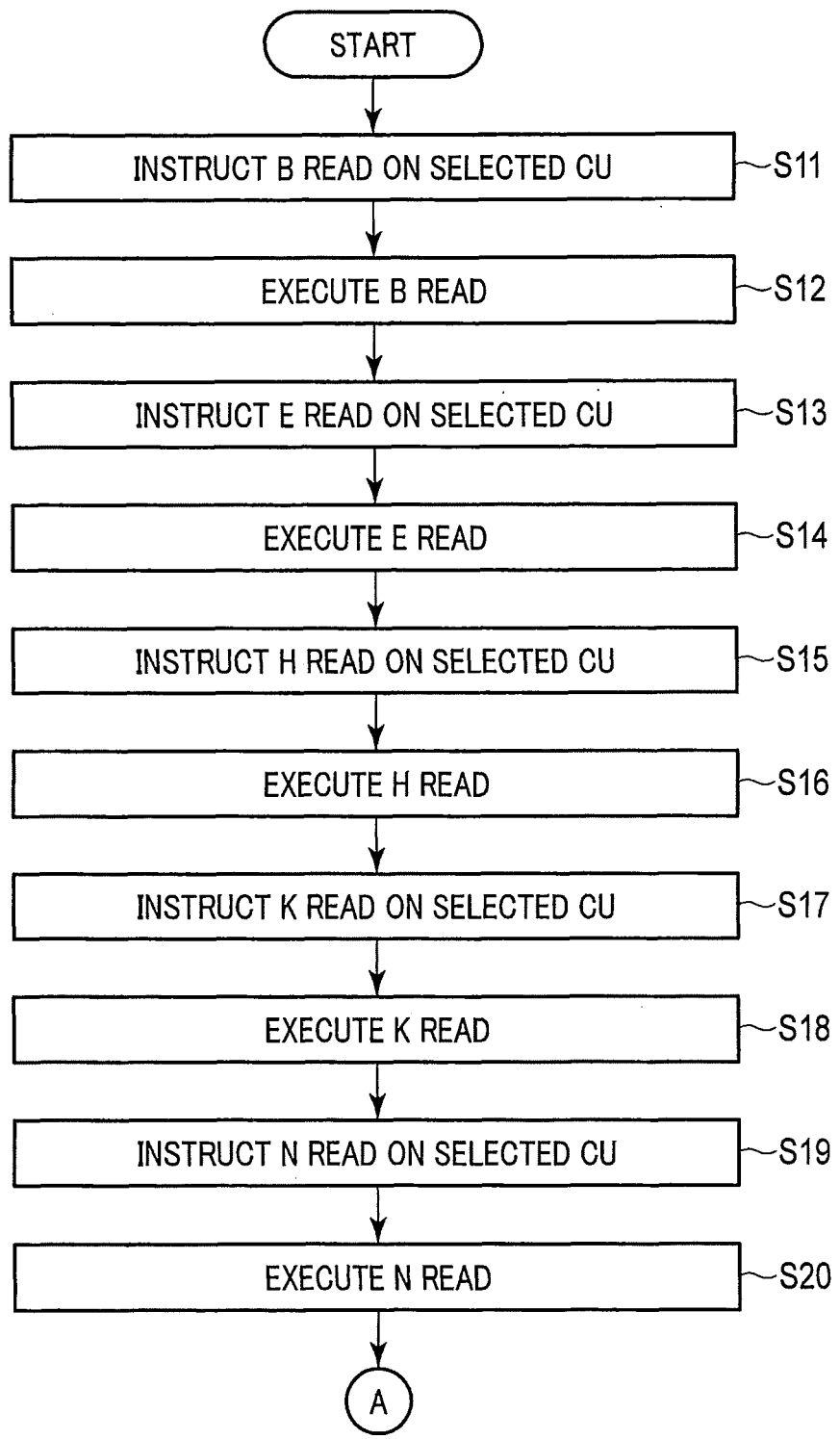
FIG. 24 is a flowchart showing an operation according to the second embodiment.

FIG. 24 shows a flowchart for an operation of the memory system according to the second embodiment. FIG. 24, in particular, shows a flowchart for the estimation of all shifted boundary read voltages VCGRS for all the four pages in one selected cell unit CU. The flowchart shown in FIG. 24 can be performed when, for example, read from all the pages in the selected cell unit CU is to be performed, but errorless data fails to be obtained by read from one page in the selected cell unit CU. That is, the flowchart shown in FIG. 24 can be performed as a sub-flowchart for step S5 when, for example, read from the four pages in the selected cell unit CU based on FIG. 5 of the first embodiment is planned to be performed.

Figure 25:
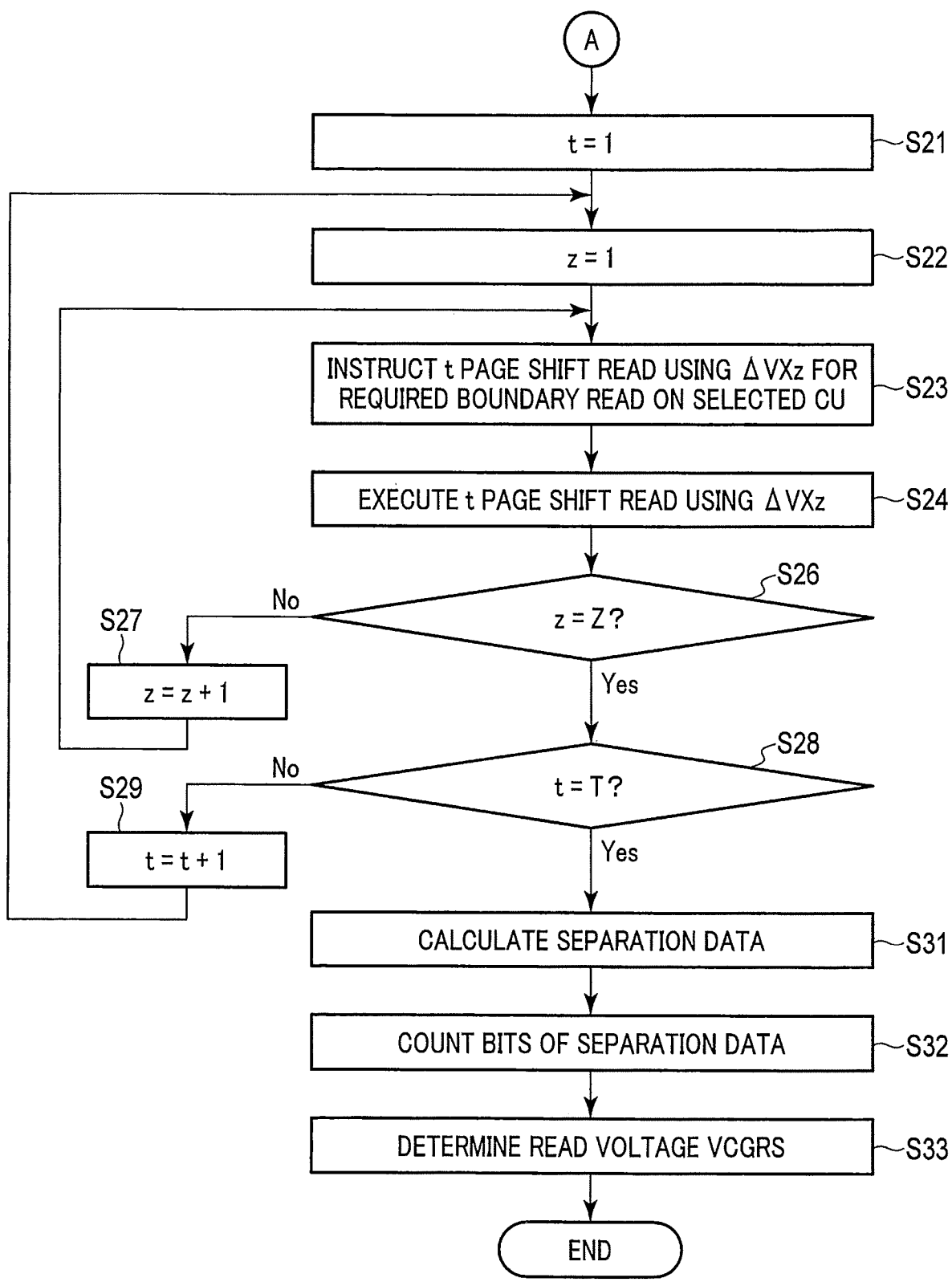
FIG. 25 is a flowchart showing an operation according to the second embodiment.

As shown in FIGS. 24 and 25, the memory controller 2 obtains B read data BD, E read data ED, H read data HD, N read data ND, and K read data KD in steps S11 to S20. Steps S11, S12, S13, S14, S15, and S16 are respectively the same as steps S5101, S5102, S5103, S5104, S5105, and S5106 in FIG. 10. In step S17, the memory controller 2 instructs K read instead of B read in step S11. In step S18, the memory controller 2 executes K read and transmits the K read data KD instead of executing B read and transmitting the B read data BD in step S12. In step S19, the memory controller 2 instructs N read instead of B read in step S11. In step S20, the memory controller 2 executes N read and transmits the N read data ND instead of executing B read and transmitting the B read data BD in step S12.

The memory controller 2 performs shift read Z times on all the selected pages in steps S21 to S28 as in steps S5111 to S5115 in FIG. 10. The memory controller 2 can perform shift read on selected pages in any order. An example of this operation will be described below.

In step S21, the memory controller 2 sets a parameter t to 1. The parameter t specifies a page as a shift read target. For example, the memory controller 2 performs shift read on a lower page, a middle page, an upper page, and a top page when t is 1, 2, 3, and 4, respectively.

Steps S22, S23, and S24 are respectively similar to steps S5111, S5112, and S5113 in FIG. 10. The flowchart differs from that in FIG. 10 in that the memory controller 2 specifies a shift amount $\Delta VXz$ for boundary read depending on which page is selected in step S23 and the semiconductor memory 1 executes shift read with on a selected page in step S24. Operations in step S23 while a lower page, a middle page, an upper page, and a top page are selected are respectively the same as those in step S5112 in FIG. 10, step S5212 in FIG. 18, step S5312 in FIG. 20, and step S5412 in FIG. 22. Operations in step S24 while a lower page, a middle page, an upper page, and a top page are selected are respectively the same as those in step S5113 in FIG. 10, step S5213 in FIG. 18, step S5313 in FIG. 20, and step S5413 in FIG. 22.

Steps S26 and S27 are respectively the same as steps S5114 and S5115 in FIG. 10. When z≠Z, the memory controller 2 sets z=z+1 in step S27. The process then returns to step S23. When z=Z, the process goes to step S28.

In step S28, the memory controller 2 determines whether t is a maximum value T. T is 4. When t ≠T (NO branch of step S28), the memory controller 2 sets t=t+1 in step S29. The process then goes to step S22. When t=T (YES branch of step S28), the process goes to step S31. When the process goes to step S31, the memory controller 2 should store lower page shift read data LSDγ, middle page shift read data MSDγ, upper page shift read data USDγ, and top page shift read data TSDγ in cases in which γ is natural numbers from 1 to 5.

Step S31 is similar to step S5121 in FIG. 10. In step S31, the memory controller 2 performs step S5121 in FIG. 10, step S5221 in FIG. 18, step S5321 in FIG. 20, and step S5421 in FIG. 22. As a result, separation data ADsγ, BDsγ, CDsγ, DDsγ, EDsγ, FDsγ, GDsγ, HDsγ, IDsγ, JDsγ, KDsγ, LDsγ, MDsγ, NDsγ, and ODsγ are obtained in each of cases in which γ is natural numbers from 1 to 5. The memory controller 2 can calculate the separation data ADsγ, BDsγ, CDsγ, DDsγ, EDsγ, FDsγ, GDsγ, HDsγ, IDsγ, JDsγ, KDsγ, LDsγ, MDsγ, NDsγ, and ODsγ in any order.

Step S32 is similar to step S5122 in FIG. 10. In step S32, the memory controller 2 performs step S5122 in FIG. 10, step S5222 in FIG. 18, step S5322 in FIG. 20, and step S5422 in FIG. 22. As a result, bit counts BCAγ, BCBγ, BCCγ, BCDγ, BCEγ, BCFγ, BCGγ, BCHγ, BCIγ, BCJγ, BCKγ, BCLγ, and BCOγ are obtained in each of the cases in which γ is natural numbers from 1 to 5.

Step S33 is similar to step S5123 in FIG. 10. In step S33, the memory controller 2 performs step S5123 in FIG. 10, step S5223 in FIG. 18, step S5323 in FIG. 20, and step S5423 in FIG. 22. As a result, shifted boundary read voltages VAS, VBS, VCS, VDS, VES, VFS, VGS, VHS, VIS, VJS, VKS, VLS, VMS, VNS, and VOS are determined.

Subsequently, the memory controller 2 can perform lower page shift read while specifying the shifted boundary read voltages VAS, VDS, VFS, and VKS specified, middle page shift read while specifying the shifted boundary read voltages VCS, VGS, VIS, and VMS, upper page shift read while specifying the shifted boundary read voltages VBS, VHS, and VNS, and top page shift read while specifying the shifted boundary read voltages VES, VJS, VLS, and VOS.

According to the second embodiment, as in the first embodiment, the memory controller 2 performs shift read a plurality of times with all the boundary read voltages VCGR for the selected string unit SU shifted, masks shift read data based on the result of single state read performed several times to obtain separation data, and determines the shifted boundary read voltages VCGRS from the separation data. Accordingly, the same advantages as those of the first embodiment can be obtained.

Third Embodiment

The third embodiment is similar to the second embodiment but differs from the second embodiment in a method of obtaining shift read data from all the four pages of a selected cell unit CU.

<3.1. Structure (Configuration)>

A memory system 5 according to the third embodiment has the same components and connections as those in the memory system 5 according to the first embodiment. A memory controller 2 according to the third embodiment is configured to perform the operation described below.

<3.2. Operation>

FIG. 26 shows a flowchart for an operation of the memory system according to the third embodiment.

FIG. 26, in particular, shows a flowchart for the estimation of all shifted boundary read voltages VCGRS for all the four pages in one selected cell unit CU. As in the second embodiment, the flowchart shown in FIG. 26 can be performed when, for example, read from all the pages in the selected cell unit CU is to be performed, but errorless data fails to be obtained by read from one page in the selected cell unit CU.

The flowchart in FIG. 26 includes steps S22, S41, S42, S43, and S44 instead of steps S21, S22, S23, S24, S25, S26, S27, S28, and S29 in the flowchart in FIG. 25 according to the second embodiment.

In step S41, the memory controller 2 instructs sequential read (shift sequential read) SSRz using shift read voltages in the zth loop on a selected cell unit CU. The memory controller 2 specifies shift amounts ΔVAz, ΔVBz, ΔVCz, ΔVDz, ΔVEz, ΔVFz, ΔVGz, ΔVHz, ΔVIz, ΔVJz, ΔVKz, ΔVLz, ΔVMz, ΔVNz, and ΔVOz in shift sequential read SSRz.

In step S42, a semiconductor memory 1 performs shift sequential read SSRz on the selected cell unit CU with the shift amounts ΔVAz, ΔVBz, ΔVCz, ΔVDz, ΔVEz, ΔVFz, ΔVGz, ΔVHz, ΔVIz, ΔVJz, ΔVKz, ΔVLz, ΔVMz, ΔVNz, and ΔVOz. Shift sequential read SSRz will be described later. As a result of the shift sequential read SSRz, lower page shift read data LSDz, middle page shift read data MSDz, upper page shift read data USDz, and top page shift read data TSDz are obtained.

Steps S43 and S44 are respectively the same as steps S5114 and S5115 in FIG. 10. When z≠Z (NO branch of step S43), the memory controller 2 sets z=z+1 in step S44. The process then returns to step S41. When z=Z (YES branch of step S43), the process goes to step S31.

Figure 27:
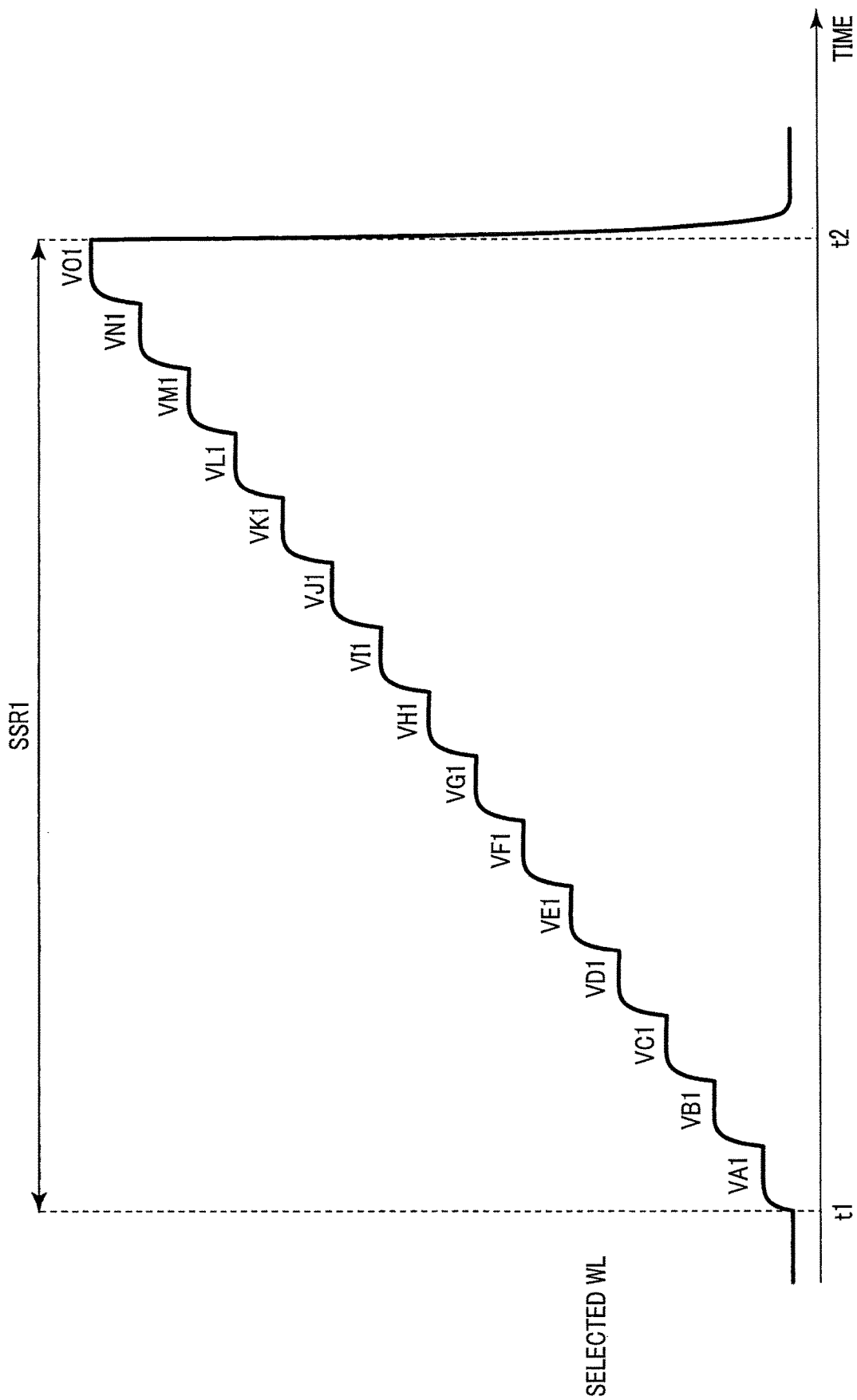
FIG. 27 shows voltages applied to a selected word line along the time during an operation according to the third embodiment.

FIG. 27 shows voltages applied to the selected word line WL along the time in an operation of the semiconductor memory 1 according to the third embodiment. FIG. 27 shows voltages in step S42 in FIG. 26 in the first loop, that is, during shift sequential read SSR1.

As shown in FIG. 27, the semiconductor memory 1 applies read voltages VA1, VB1, VC1, VD1, VE1, VF1, VG1, VH1, VI1, VJ1, VK1, VL1, VM1, VN1, and VO1 to the selected word line WL in the period from time t1 to time t2 in this order. While applying the read voltages VA1, VB1, VC1, VD1, VE1, VF1, VG1, VH1, VI1, VJ1, VK1, VL1, VM1, VN1, and VO1, the semiconductor memory 1 respectively performs A1 read, B1 read, C1 read, D1 read, E1 read, F1 read, G1 read, H1 read, I1 read, J1 read, K1 read, L1 read, M1 read, N1 read, and O1 read. As a result, A1 read data, B1 read data, C1 read data, D1 read data, E1 read data, F1 read data, G1 read data, H1 read data, I1 read data, J1 read data, K1 read data, L1 read data, M1 read data, N1 read data, and O1 read data are obtained.

Subsequently, the semiconductor memory 1 obtains lower page shift read data LSD1, middle page shift read data MSD1, upper page shift read data USD1, and top page shift read data TSD1 by logical operations of the A1 read data, the B1 read data, the C1 read data, the D1 read data, the E1 read data, the F1 read data, the G1 read data, the H1 read data, the I1 read data, the J1 read data, the K1 read data, the L1 read data, the M1 read data, the N1 read data, and the O1 read data. The same applies to shift sequential reads SSR1 to SSR5. In shift sequential read SSRz, shift read voltages VAz, VBz, VCz, VDz, VEz, VFz, VGz, VHz, VIz, VJz, VKz, VLz, VMz, VNz, and VOz are applied in this order.

According to the third embodiment, as in the first embodiment, shift read data is masked based on the result of single state read performed several times to obtain separation data, and shifted boundary read voltages are estimated from the separation data. Accordingly, the third embodiment produces the same advantages as those of the first embodiment.

According to the third embodiment, all shifted boundary read voltages VCGRS for four pages in one cell unit CU are estimated by shift sequential read. Accordingly, all the shifted boundary read voltages VCGRS for four pages in a cell unit CU can be estimated in a shorter time than in the first embodiment.

Fourth Embodiment

The fourth embodiment differs from the first embodiment in the method of generating separation data and the method of determining shifted boundary read voltages VCGRS. More specifically, the fourth embodiment differs from the first embodiment in the sub-flowchart for step S5 in FIG. 5.

<4.1. Structure (Configuration)>

A memory system 5 according to the fourth embodiment has the same components and connections as those in the memory system 5 according to the first embodiment. A memory controller 2 according to the fourth embodiment is configured to perform the operation described below.

<4.2. Operation>

The memory controller 2 generates each write data of page size through randomization of data. Randomization means generating data so as to equalize the occurrence frequencies of the values of bits in page-size data and the biased arrangement of the respective values. As a result, the number of "1" data is almost equal to the number of "0" data in the page-size data, and the bits of the "1" data are almost uniformly distributed so are the bits of the "0" data.

Writing such randomized data in a semiconductor memory 1 can equalize the number of "1" data bits to the number of "0" data bits in all the four bits stored in each selected memory cell transistor MT and uniformize the numbers of "1" data bits and the numbers of "0" data bits throughout all selected memory cell transistors MT. That is, the numbers of memory cell transistors MT in Er state to O state in each cell unit CU in which data are written are almost equal. The number of memory cell transistors MT in any state of Er state to O state in each cell unit CU with data written is p/16. Note that p is the number of memory cell transistors MT in one cell unit CU.

<4.2.1. Read Voltage Estimation>

Flowcharts for step S5 differ depending on which one of a lower page, a middle page, an upper page, and a top page is selected. A case in which a selected page is a lower page will be described first with reference to FIG. 28.

<4.2.1.1. When Selected Page is Lower Page>

<4.2.1.1.1. Read Voltage Estimation>

Figure 28:
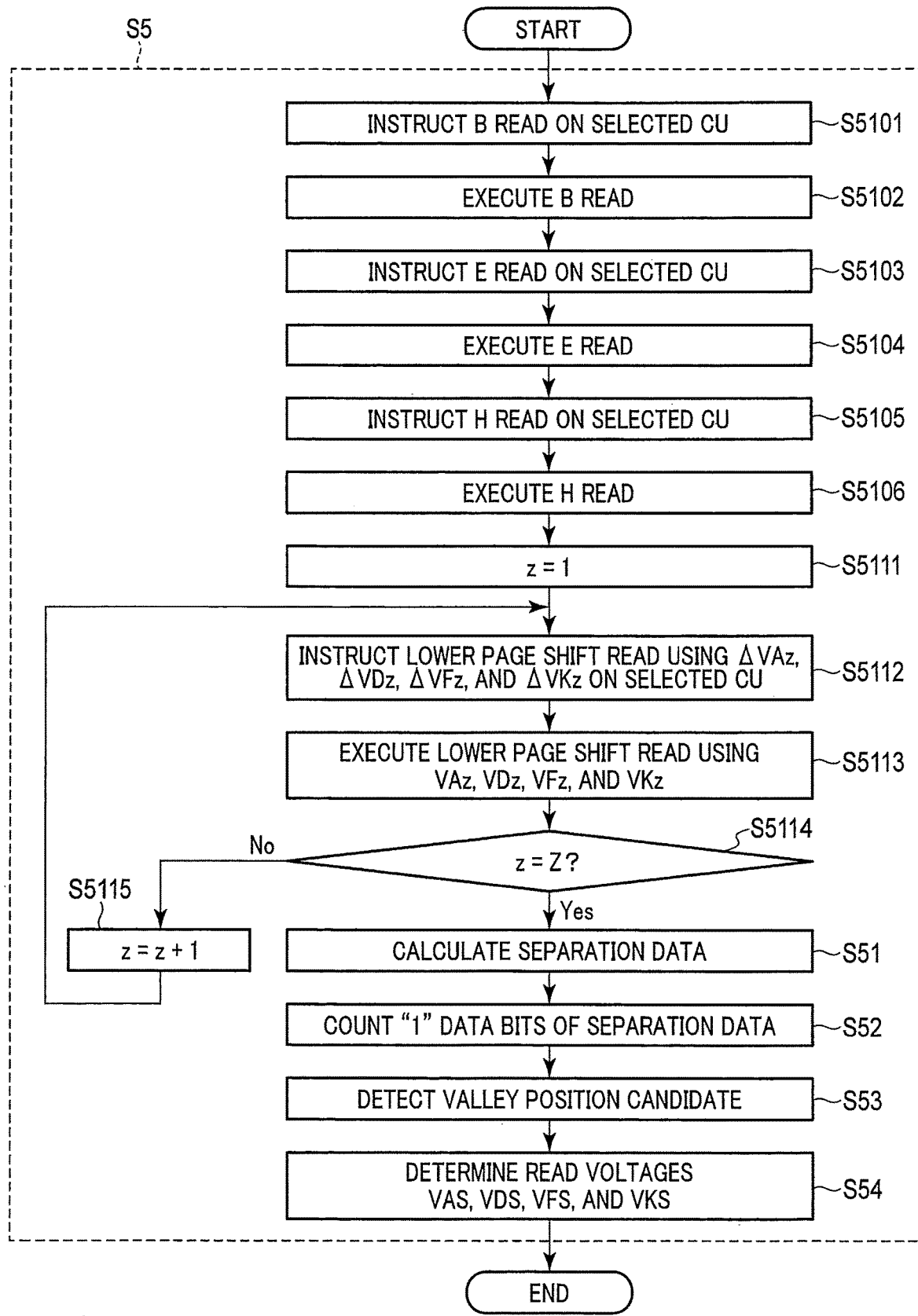
FIG. 28 is a flowchart showing an operation according to the fourth embodiment.

FIG. 28 shows a flowchart for an operation of the memory system according to the fourth embodiment. This flowchart is a sub-flowchart for step S5 in FIG. 5. As shown in FIG. 28, the YES branch of step S5114 continues at step S51.

In step S51, as in step S5121 in FIG. 10 according to the first embodiment, the memory controller 2 masks particular bits of lower page shift read data LSD1 to LSD5 with B read data BD, E read data ED, and H read data HD. To this end, the memory controller 2 performs logical operations using B read data BD, E read data ED, H read data HD, and lower page shift read data LSD1 to LSD5. Performing the logical operations will produce separation data ADr such as ADr1, ADr2, ADr3, ADr4, and ADr5, DDr such as DDr1, DDr2, DDr3, DDr4, and DDr5, FDr such as FDr1, FDr2, FDr3, FDr4, and FDr5, and KDr such as KDr1, KDr2, KDr3, KDr4, and KDr5. The logical operations differ from those in the first embodiment and will be described later.

In step S52, the memory controller 2 calculates bit counts OCA such as OCA1, OCA2, OCA3, OCA4, and OCA5, OCD such as OCD1, OCD2, OCD3, OCD4, and OCD5, OCF such as OCF1, OCF2, OCF3, OCF4, and OCF5, and OCK such as OCK1, OCK2, OCK3, OCK4, and OCK5 with the separation data ADr, DDr, FDr, and KDr. OCA1, OCA2, OCA3, OCA4, OCA5, OCD1, OCD2, OCD3, OCD4, OCD5, OCF1, OCF2, OCF3, OCF4, OCF5, OCK1, OCK2, OCK3, OCK4, and OCK5 respectively represent the numbers of "1" data bits in the separation data ADr1, ADr2, ADr3, ADr4, ADr5, DDr1, DDr2, DDr3, DDr4, DDr5, FDr1, FDr2, FDr3, FDr4, FDr5, KDr1, KDr2, KDr3, KDr4, and KDr5.

In step S53, the memory controller 2 detects a candidate of the valley (local minimum) position corresponding to the voltage that can be selected as a shifted boundary read voltage VAS using the "1" data bit counts OCA1, OCA2, OCA3, OCA4, and OCA5. Likewise, the memory controller 2 detects a candidate of the valley position corresponding to the voltage that can be selected for a shifted boundary read voltage VDS using the "1" data bit counts OCD1, OCD2, OCD3, OCD4, and OCD5. The memory controller 2 detects a candidate of the valley position corresponding to the voltage that can be selected for a shifted boundary read voltage VFS using the "1" data bit counts OCF1, OCF2, OCF3, OCF4, and OCF5. The memory controller 2 detects a candidate of the valley position corresponding to the voltage that can be selected for a shifted boundary read voltage VKS by using the "1" data bit counts OCK1, OCK2, OCK3, OCK4, and OCK5.

In step S54, the memory controller 2 selects a valley position to be used from the valley position candidates detected for the shifted boundary read voltage VAS. A method of selecting a valley position will be described later. A read voltage VCGR corresponding to the selected valley position is used as the shifted boundary read voltage VAS. Likewise, the memory controller 2 selects a valley position to be used from the valley position candidates detected for the shifted boundary read voltage VDS, and determines the shifted boundary read voltage VDS. The memory controller 2 selects a valley position to be used from the valley position candidates detected for the shifted boundary read voltage VFS, and determines the shifted boundary read voltage VFS. The memory controller 2 selects a valley position to be used from the valley position candidates detected for the shifted boundary read voltage VKS, and determines the shifted boundary read voltage VKS.

<4.2.1.1.2. Separation Data Calculation>

The separation data ADs can be obtained by equation (16).

$$ADr = LSD \; \& \; BD \tag{16}$$

The memory controller 2 obtains separation data ADrγ by calculating ADrγ=LSDγ & BD in each of cases in which γ is natural numbers from 1 to 5. The separation data ADrγ has "1" data in a bit of a selected memory cell transistor MT having a threshold voltage lower than a read voltage VAγ and has "0" data in a bit of a selected memory cell transistor MT having a threshold voltage equal to or higher than the read voltage VAγ.

The separation data DDr can be obtained by equation (17).

$$DDr\gamma = (^-LSD|BD) \& ED \quad (17)$$

The operator "|" indicates an OR operation on two operands on both sides.

The memory controller 2 obtains separation data DDrγ by calculating DDrγ=($^-$LSDγ|BD) & ED in each of cases in which γ is natural numbers from 1 to 5.

Figure 29:
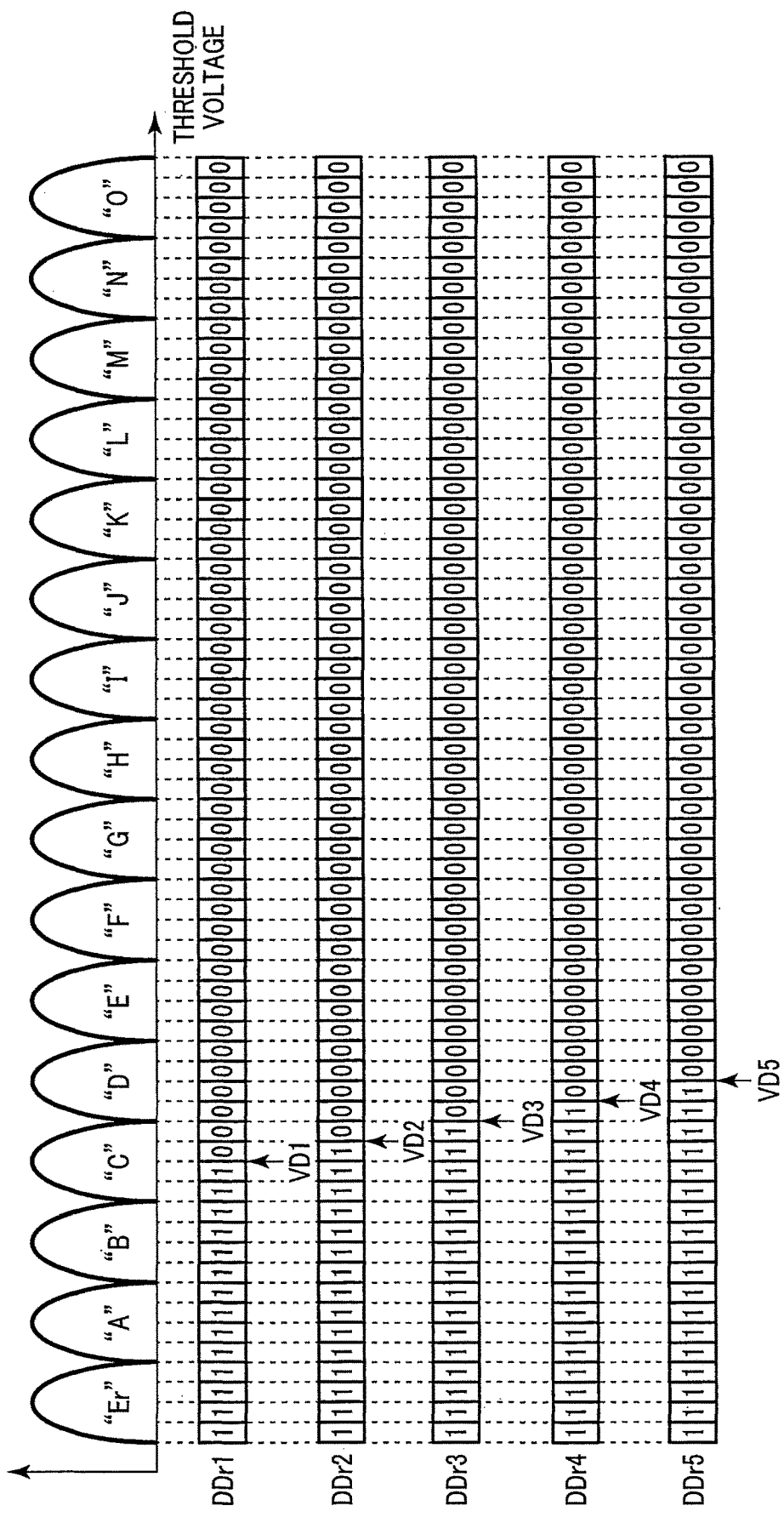
FIG. 29 shows an example of separation data obtained according to the fourth embodiment.

FIG. 29 shows an example of data obtained by step S51 according to the fourth embodiment. FIG. 29 shows an example of the separation data DDr. As shown in FIG. 29, the separation data DDrγ has "1" data in a bit of a selected memory cell transistor MT having a threshold voltage lower than a read voltage VDγ and has "0" data in a bit of a selected memory cell transistor MT having a threshold voltage equal to or higher than the read voltage VDγ.

The separation data FDr can be obtained by equation (18).

$$FDr\gamma = (LSD|ED) \& HD \quad (18)$$

The memory controller 2 obtains separation data FDrγ by calculating FDrγ=(LSDγ|ED) & HD in each of cases in which γ is natural numbers from 1 to 5.

The separation data KDr can be obtained by equation (19).

$$KDr = ^-LSD|HD \quad (19)$$

The memory controller 2 obtains separation data KDrγ by calculating KDrγ=$^-$LSDγ|HD in each of cases in which γ is natural numbers from 1 to 5.

With regard to all combinations of cases in which γ is natural numbers from 1 to 5 and cases in which δ are F and K, like the separation data ADr and DDr, separation data δDrγ has "1" data in a bit of a selected memory cell transistor MT having a threshold voltage lower than a read voltage Vδγ and has "0" data in a bit of a selected memory cell transistor MT having a threshold voltage equal to or higher than the read voltage VDγ.

<4.2.1.2. When Selected Page is Page Other than Lower Page>

<4.2.1.2.1. Read Voltage Estimation>

A flowchart for a middle page, upper page, or top page selected is the same as that described with reference to FIG. 28. These flowcharts differ in single state read executed in steps S5101 to S5106, shift read executed in steps S5112 and S5113, and calculation of separation data in step S51. In addition, in steps S53 and S54, the memory controller 2 detects valley position candidates and selects a valley position for the shifted boundary read voltages VCGRS corresponding to a selected page.

When a middle page is selected, the memory controller 2 obtains E read data ED, H read data HD, and K read data KD by performing E read, H read, and K read instead of B read, E read, and H read in steps S5101 to S5106. The memory controller 2 performs middle page shift read using shift read voltages VCz, VGz, VIz, and VMz instead of lower page shift read using shift read voltages VAz, VDz, VFz, and VKz in steps S5112 and S5113.

When an upper page is selected, the memory controller 2 obtains E read data ED and K read data KD by performing E read and K read instead of B read, E read, and H read in steps S5101 to S5106. The memory controller 2 performs upper page shift read using shift read voltages VBz, VHz, and VNMz instead of lower page shift read using shift read voltages VAz, VDz, VFz, and VKz in steps S5112 and S5113.

When a top page is selected, the memory controller 2 obtains H read data HD, K read data KD, and N read data ND by performing H read, K read, and N read instead of B read, E read, and H read in steps S5101 to S5106. The memory controller 2 performs top page shift read using shift read voltages VEz, VJz, VLz, and VOz instead of lower page shift read using shift read voltages VAz, VDz, VFz, and VKz in steps S5112 and S5113.

<4.2.1.1.2. Separation Data Calculation>

Separation data when a page other than a lower page is selected can be calculated by a method described below. Descriptions in chapter <4.2.1.1.2. Separation Data Calculation> apply to points other than those described below.

Separation data CDr, GDr, IDr, and MDr when a middle page is selected can be calculated by the following equations.

The separation data CDr can be obtained by equation (20).

$$CDr = MSD \& ED \quad (20)$$

The separation data GDr can be obtained by equation (21).

$$GDr = (^-MSD|ED) \& HD \quad (21)$$

The separation data IDr can be obtained by equation (22).

$$IDr = (MSD|HD) \& KD \quad (22)$$

The separation data MDr can be obtained by equation (23).

$$MDr = ^-MSD|KD \quad (23)$$

The memory controller 2 obtains separation data CDr1, CDr2, CDr3, CDr4, CDr5, GDr1, GDr2, GDr3, GDr4, GDr5, IDr1, IDr2, IDr3, IDr4, IDr5, MDr1, MDr2, MDr3, MDr4, and MDr5 in the same manner as in the case of a lower page.

Separation data BDr, HDr, and NDr when an upper page is selected can be calculated by the following equations.

The separation data BDr can be obtained by equation (24).

$$BDr = USD \& ED \quad (24)$$

The separation data HDr can be obtained by equation (25).

$$HDr = (^-USD|ED) \& KD \quad (25)$$

The separation data NDr can be obtained by equation (26).

$$NDr = USD|KD \quad (26)$$

The memory controller 2 obtains separation data BDr1, BDr2, BDr3, BDr4, BDr5, HDr1, HDr2, HDr3, HDr4, HDr5, NDr1, NDr2, NDr3, NDr4, and NDr5 in the same manner as in the case of a lower page.

Separation data EDr, JDr, LDr, and ODr when a top page is selected can be calculated by the following equations.

The separation data EDr can be obtained by equation (27).

$$EDr = TSD \& HD \quad (27)$$

The separation data JDr can be obtained by equation (28).

$$JDr = (^-TSD|HD) \& KD \quad (28)$$

The separation data LDr can be obtained by equation (29).

$$LDr = (TSD|KD) \& ND \quad (29)$$

The separation data ODr can be obtained by equation (30).

$$ODr = {}^-TSD|ND \tag{30}$$

The memory controller 2 obtains separation data EDr1, EDr2, EDr3, EDr4, EDr5, JDr1, JDr2, JDr3, JDr4, JDr5, LDr1, LDr2, LDr3, LDr4, LDr5, ODr1, ODr2, ODr3, ODr4, and ODr5 in the same manner as in the case of a lower page.

With regard to all combinations of cases in which γ is natural numbers from 1 to 5 and cases in which δ are B, C, E, G, H, I, J, L, M, N, and O, separation data δDrγ has "1" data in a bit of a selected memory cell transistor MT having a threshold voltage lower than a read voltage Vδγ and has "0" data in a bit of a selected memory cell transistor MT having a threshold voltage equal to or higher than the read voltage VDγ.

<4.2.1.3. Valley Position Candidate Detection>

Figure 30:
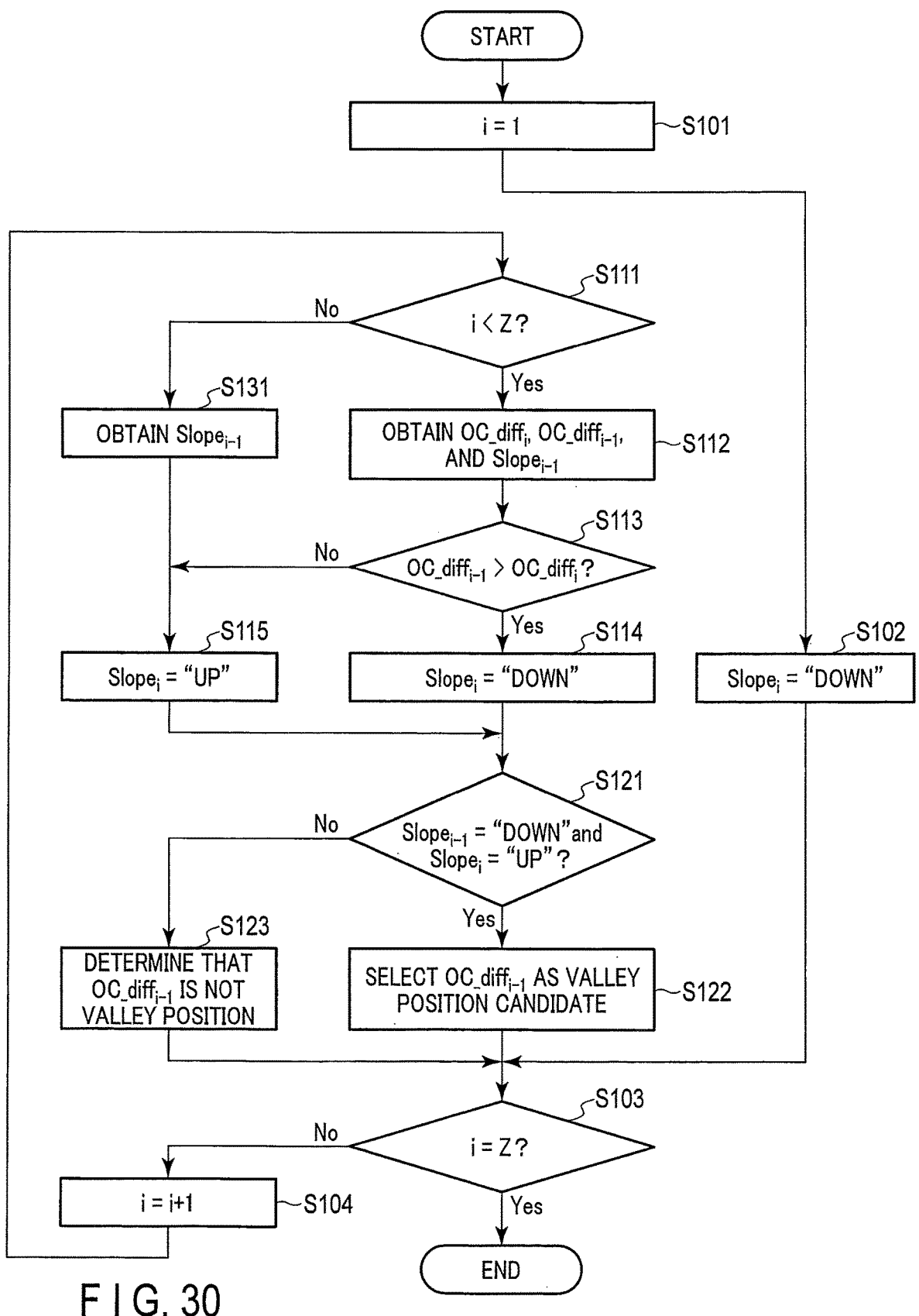
FIG. 30 is a sub-flowchart showing an operation of a memory system according to the fourth embodiment.

FIG. 30 shows a flowchart for an operation of the memory system according to the fourth embodiment. This flowchart is a sub-flowchart for step S53 in FIG. 28. FIG. 30 shows an example in which shift read is performed ten times for the estimation of one shifted boundary read voltage VCGRS (for example, a shifted boundary read voltage VAS), i.e., an example in which Z=10. The following description and FIG. 30 concern a boundary read voltage VX that is estimated in a manner that can apply to not only a case for the estimation of the shifted boundary read voltage VAS but also a case for the estimation of another shifted boundary read voltage VXS.

FIG. 31 shows differences between the adjacent twos of "1" data bit counts OCX1 to OCX10 of ten separation data XDr1 to XDr10 based on the ten shift read data obtained for the estimation of one boundary read voltage VX, i.e., OCXw (where w is a natural number between 2 and 10 (inclusive))−OCX(w−1), according to the fourth embodiment.

As shown in FIG. 30, in step S101, the memory controller 2 sets a parameter i (where i is a natural number) to 1. In step S102, the memory controller 2 sets a parameter $Slope_i$ to "DOWN". As a more specific example, $Slope_i$ has one bit, and the value "DOWN" is "0" data.

In step S103, the memory controller 2 determines whether i=Z. Z represents the number of times of shift read to be executed. That is, Z is 10 in this case. When i=Z (YES branch of step S103), the processing is terminated. When i ≠Z, the process goes to step S104. In step S104, the memory controller 2 sets i=i+1.

In step S111, the memory controller 2 determines whether i is lower than Z. When i is lower than Z (YES ranch of step S111), the process goes to step S112.

In step S112, the memory controller 2 obtains $OC\_diff_i$, $OC\_diff_{i-1}$, and $Slope_{i-1}$. $OC\_diff_i$ is the value obtained by subtracting "1" data bit count OCXi in separation data $XDr_i$ from "1" data bit count OCX(i+1) in separation data $XDr_{i+1}$.

In step S113, the memory controller 2 determines whether $OC\_diff_{i-1}$ exceeds $OC\_diff_i$. When $OC\_diff_{i-1}$ exceeds $OC\_diff_i$ (YES branch of step S113), it indicates that the amount of change from the "1" data bit count at the read voltage VX(i−1) to the "1" data bit count at the read voltage VXi is larger than the amount of change from the "1" data bit count at the read voltage VXi to the "1" data bit count at the read voltage VX(i+1), and the amount of change in "1" data bit count decreases from that at the read voltage VXi to that at the read voltage VX(i+1). Accordingly, in step S114, the memory controller 2 sets $Slope_i$ to "DOWN".

When $OC\_diff_{i-1}$ does not exceed $OC\_diff_i$ (NO branch of step S113), it indicates that the amount of change from the "1" data bit count at the read voltage VX(i−1) to the "1" data bit count at the read voltage VXi is equal to or lower than the amount of change from the "1" data bit count at the read voltage VXi to the "1" data bit count at the read voltage VX(i+1), and the amount of change in "1" data bit count increases from that at the read voltage VXi to that at the read voltage VX(i+1). Accordingly, in step S115, the memory controller 2 sets $Slope_i$ to "UP". Step S121 follows steps S114 and S115.

When i≥Z (NO branch of step S111) in step S111, the process goes to step S131. In step S131, the memory controller 2 obtains $Slope_{i-1}$. Step S131 continues at step S115, and $Slope_i$ is set to "UP". That is, when i=10, the memory controller 2 sets $Slope_i$ to "UP" regardless of the magnitudes of $OC\_diff_{i-1}$ and $OC\_diff_i$.

In step S121, the memory controller 2 determines whether $Slope_{i-1}$="DOWN" and $Slope_i$="UP". When they hold (YES ranch of step S121), it indicates that $OC\_diff_{i-1}$ is smaller than both $OC\_diff_{i-2}$ and $OC\_diff_i$. Accordingly, $OC\_diff_{i-1}$ can be determine as a candidate of a valley position in the threshold voltage distribution of the memory cell transistors MT. Based on this, in step S122, the memory controller 2 selects $OC\_diff_{i-1}$ as a valley position candidate. Step S122 continues at step S103.

When i=10, because $Slope_i$ is unconditionally set to "UP" in step S115, the memory controller 2 determines $OC\_diff_9$ as a valley position candidate as long as $Slope_9$ is "DOWN". Likewise, when i=1, because $Slope_1$ is unconditionally set to "DOWN" in step S102, the memory controller 2 determines $OC\_diff_1$ as a valley position candidate as long as $Slope_2$ is "UP".

When the conditions in step S121 do not hold, the memory controller 2 determines in step S123 that $OC\_diff_{i-1}$ is not a valley position. Step S123 continues at step S103.

In this manner, the memory controller 2 determines whether $OC\_diff_i$ is a valley position candidate in each of cases in which i ranges from 1 to Z−1 (=9), and selects one or more valley candidate positions. In the example shown in FIG. 31, $OC\_diff_3$, $OC\_diff_7$, and $OC\_diff_9$ enclosed by the dotted lines are selected as valley position candidates.

<4.2.1.4. Valley Position Decision>

Figure 32:
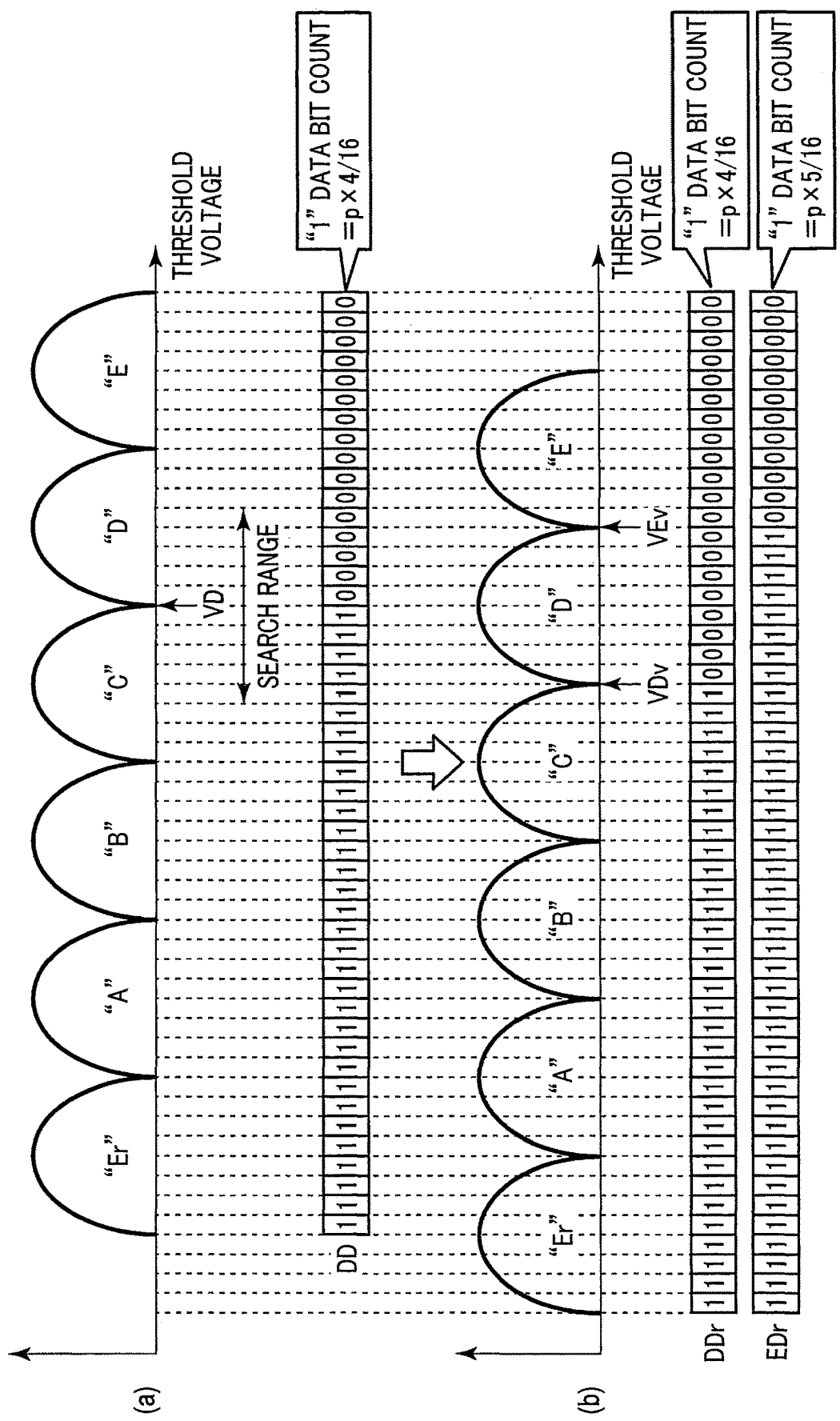
FIG. 32 shows a concept of a method of determining a valley position according to the fourth embodiment.

FIG. 32 shows a concept of a method of determining a valley position in step S54 according to the fourth embodiment. FIG. 32 shows the relationships between the threshold voltages of the memory cell transistors MT in a cell unit CU and the numbers of memory cell transistors MT, and the data read from the respective memory cell transistors MT by several reads. FIG. 32 shows only several states. Part (a) indicates a state immediately after write. Part (b) indicates a state a time lapse after the write.

As indicated by part (a) in FIG. 32, the boundary (valley) between the distribution for C state and the distribution for D state almost coincides with the default read voltage VD. For this reason, when data is read from the cell unit CU in the state indicated by part (a) with the read voltage VD, the read data DD has "1" data in all the bits in the memory cell transistors MT having threshold voltages lower than the read voltage VD. That is, the memory cell transistors MT in Er, A, B, or C state output "1" data. The read voltage VD has the fourth smallest magnitude among the (state count (=16)−1) read voltages VA, VB, VC, VD, VE, VF, VG, VH, VI, VJ, VK, VL, VM, VN, and VO required for data read. Accordingly, the number of "1" data bits is about p×4/16.

As indicated by part (b) in FIG. 32, assume that all the distribution curves of threshold voltages move in the negative direction. In order to estimate the shifted boundary read voltage VDS at the boundary between D state and E state, shift read is performed with a plurality of read voltages VCGR in a search window extending from the read voltage VD in both the positive and negative directions. As indicated by part (b), depending on the displacement of the threshold voltage distributions, two read voltages VDv and VEv corresponding to valley positions are detected as valley position candidates in the search range. However, the read voltage VEv is not located at the boundary between D state and E state and hence cannot be the shifted boundary read voltage VDS.

The separation data DDr obtained by read with the read voltage VDv has about p×4/16 "1" data bits, as described above. In contrast, the separation data EDr obtained by read with the read voltage VEv has about p×5/16 "1" data bits. Using such difference, the memory controller 2 determines one valley position from several position candidates. The details are as follows.

First of all, the memory controller 2 obtains "1" data bit counts in the separation data respectively corresponding to valley position candidates. Based on the example shown in FIG. 31, valley position candidates are OC_diff$_3$, OC_diff$_7$, and OC_diff$_9$. The memory controller 2 obtains the "1" data bit counts OCX4, OCX8, and OCX10 respectively corresponding to OC_diff$_3$, OC_diff$_7$, and OC_diff$_9$. The "1" data bit count OCX4 corresponds to the number of "1" data bits in the separation data XDr for the read data obtained with the read voltage VX4. The same applies to the "1" data bit counts OCX8 and OCX10. The memory controller 2 then selects one of the "1" data bit counts OCX4, OCX8, and OCX10 which is nearest to p×Y/16. Y has a value determined based on X, and is 1, 2, 3, 4, 5, 6, 7, 8, 9, 10, 11, 12, 13, 14, or 15 when X is A, B, C, D, E, F, G, H, I, J, K, L, M, N, or O. The memory controller 2 determines OC_diff corresponding to one "1" data bit count OCX selected in this manner as a valley position. Referring to FIG. 31, the memory controller 2 determines, for example, OC_diff$_3$ as a valley position, and determines to use the corresponding read voltage VX4.

<4.3. Advantages (Effects)>

According to the fourth embodiment, as in the first embodiment, shift read is performed a plurality of times with all the boundary read voltages VCGR for a selected page shifted, shift read data is masked based on the result of single state read performed several times to obtain separation data, and shifted boundary read voltages VCGRS are estimated from the separation data. Accordingly, the fourth embodiment produces the same advantages as those of the first embodiment.

According to the fourth embodiment, a plurality of valley position candidates are detected for the estimation of each shifted boundary read voltage VCGRS, and one shifted boundary read voltage VCGRS is selected from the valley position candidates based on the "1" data bit counts determined based on the shifted boundary read voltages VCGRS. This improves the accuracy of selection of a valley position and inhibits erroneous selection of another shifted boundary read voltage VCGRS. It is, therefore, possible to estimate a more reliable shifted boundary read voltage VCGRS.

<4.4. Modification>

Equations (16) to (30) each are merely an example of a logical operation. Any logical operation can be used as long as separation data having the above characteristics can be obtained.

The fourth embodiment is applicable to the second embodiment or the third embodiment. In this case, steps S51, S52, S53, and S54 in FIG. 28 according to the fourth embodiment are performed instead of a set of steps S31, S32, and S33 in FIG. 25 according to the second embodiment or in FIG. 26 according to the third embodiment. In step S51, the memory controller 2 uses equations (16) to (30) to obtain separation data ADr, BDr, CDr, DDr, EDr, FDr, GDr, HDr, IDr, JDr, KDr, LDr, MDr, NDr, or ODr. In steps S52 and S53, the memory controller 2 detects valley position candidates based on the "1" data bit count for each of all the shifted boundary read voltages VCGRS using the separation data ADr, BDr, CDr, DDr, EDr, FDr, GDr, HDr, IDr, JDr, KDr, LDr, MDr, NDr, or ODr. In step S54, the memory controller 2 selects one valley position from the valley position candidates for each of all the boundary read voltages VCGR, and decides the corresponding shifted boundary read voltage VCGRS.

The separation data XDr may be obtained by a method different from the logical operation between shift read data and single state read for a page as in step S5121. That is, in order to estimate one boundary read voltage VX, shift read is performed a plurality of times using shift read voltage VXz with different magnitudes for different parameters z. Using the shift read data obtained by each shift read as the separation data XDr can estimate the shift read voltages VCGRS, as described with reference to FIGS. 30, 31, and 32.

Fifth Embodiment

The fifth embodiment can be additionally applied to any one of the first to fourth embodiments.

A memory system 5 according to the fifth embodiment has the same components and connections as those of the memory system 5 according to the first embodiment. In contrast, a memory controller 2 according to the fifth embodiment is configured to perform the following operations.

The characteristics of memory cell transistors MT inevitably differ from each other. For this reason, according to the fifth embodiment, memory cell transistors MT are classified into a plurality of groups such that memory cell transistors MT having similar characteristics constitute one group.

For example, the memory cell transistors MT are classified according to word lines WL to which they are coupled. That is, the word lines WL are divided into a plurality of groups WLG. Each word line group WLG is constituted by a plurality of word lines WL having consecutive addresses. For example, word lines WL0 to WLa (where a is a natural number) belong to a word line group WLG0. Word lines WL(a+1) to WLb (where b is a natural number larger than a+1) belong to a word line group WLG1. Word lines WL(b+1) to WLc (where c is a natural number larger than b+1) belong to a word line group WLG2. Word lines WL(c+1) to WLd (where d is a natural number larger than c+1) belong to a word line group WLG3. The word lines WL may be classified into four or less or five or more groups.

Cell units CU respectively coupled to word lines WL included in each word line group WLG are assumed to have similar characteristics, and in particular, have similar data retention characteristics. In contrast to this, the cell units CU respectively coupled to word lines WL included in a different word line group WLG are assumed to have different characteristics (data retention characteristics in particular).

<5.1. Basic Operation>

The memory controller 2 uses different values for one or more parameters used in step S5 for different word line groups WLG. An example is as follows.

Figure 33:
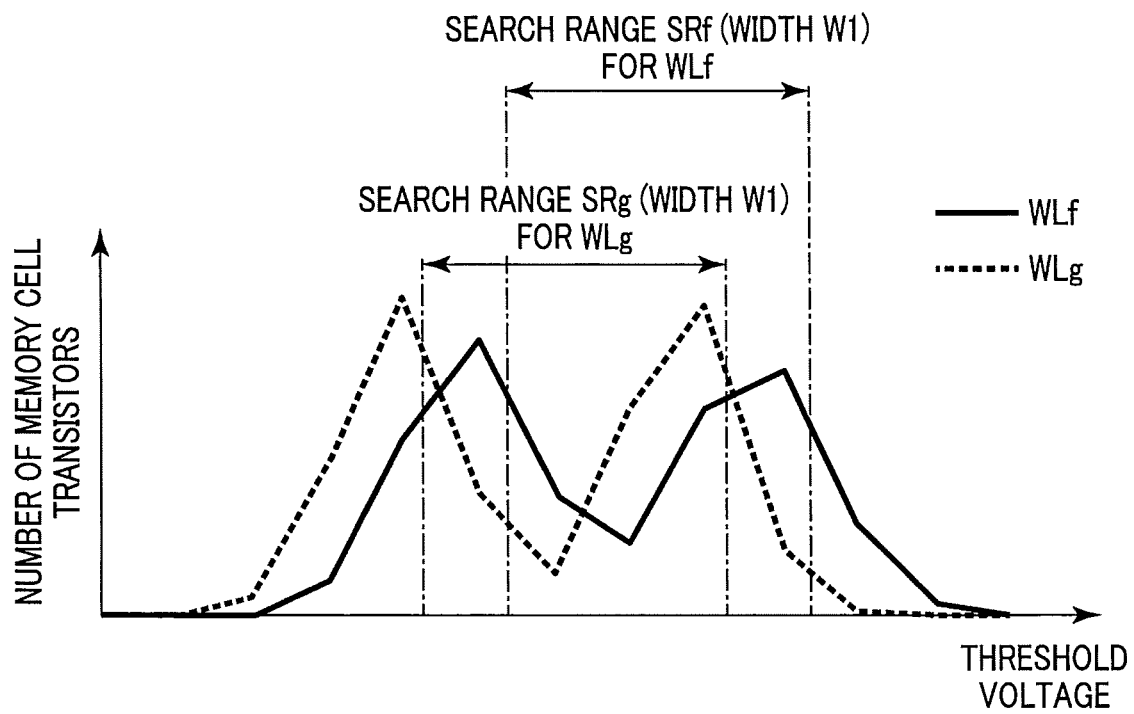
FIG. 33 shows a distribution of threshold voltages concerning two adjacent states according to a fifth embodiment.

The memory controller 2 can use different search ranges for different word line groups WLG. That is, the memory controller 2 uses different sets of values of ΔVXz for different word line groups WLG. FIG. 33 indicates such an example, and shows distributions of threshold voltages for two adjacent states according to the fifth embodiment.

FIG. 33 shows distribution of threshold voltages for cell units CU coupled to a word line WLf (where f is a natural number) belonging to a particular word line group WLG and distribution of threshold voltages for cell units CU coupled to a word line WLg (where g is a natural number other than f) belonging to another word line group WLG. As shown in FIG. 33, the overall distribution for the word lines WLg is located at a lower position in terms of threshold voltages than the overall distribution for the word lines WLf.

Based on such positional difference between distributions, shift read is performed with read voltages VCGR in a range SRf for the word line WLf, and shift read is performed with read voltages VCGR in a range SRg for the word line WLg. The range SRf extends over a width W1 centered on a default read voltage VE. The range SRg extends over the width W1 centered on a read voltage VEg lower than the default read voltage VE.

The position of a search range to be applied can be determined in advance by, for example, a simulation or experiment, and information on the search range position can be stored in a ROM 24 of the memory controller 2. The memory controller 2 can store the information on the search range position in a RAM 23 during an operation and refer to the information when performing read. The memory controller 2 determines ΔVXz in shift read in step S5 and notifies the semiconductor memory 1 of determined ΔVXz while referring to search range position information.

Such adjustment for search range for each word line group WLG is applicable to one or more boundary read voltages.

<5.2. Applied Operation>

The following applied operation can be additionally performed in addition to the basic operation.

Figure 34:
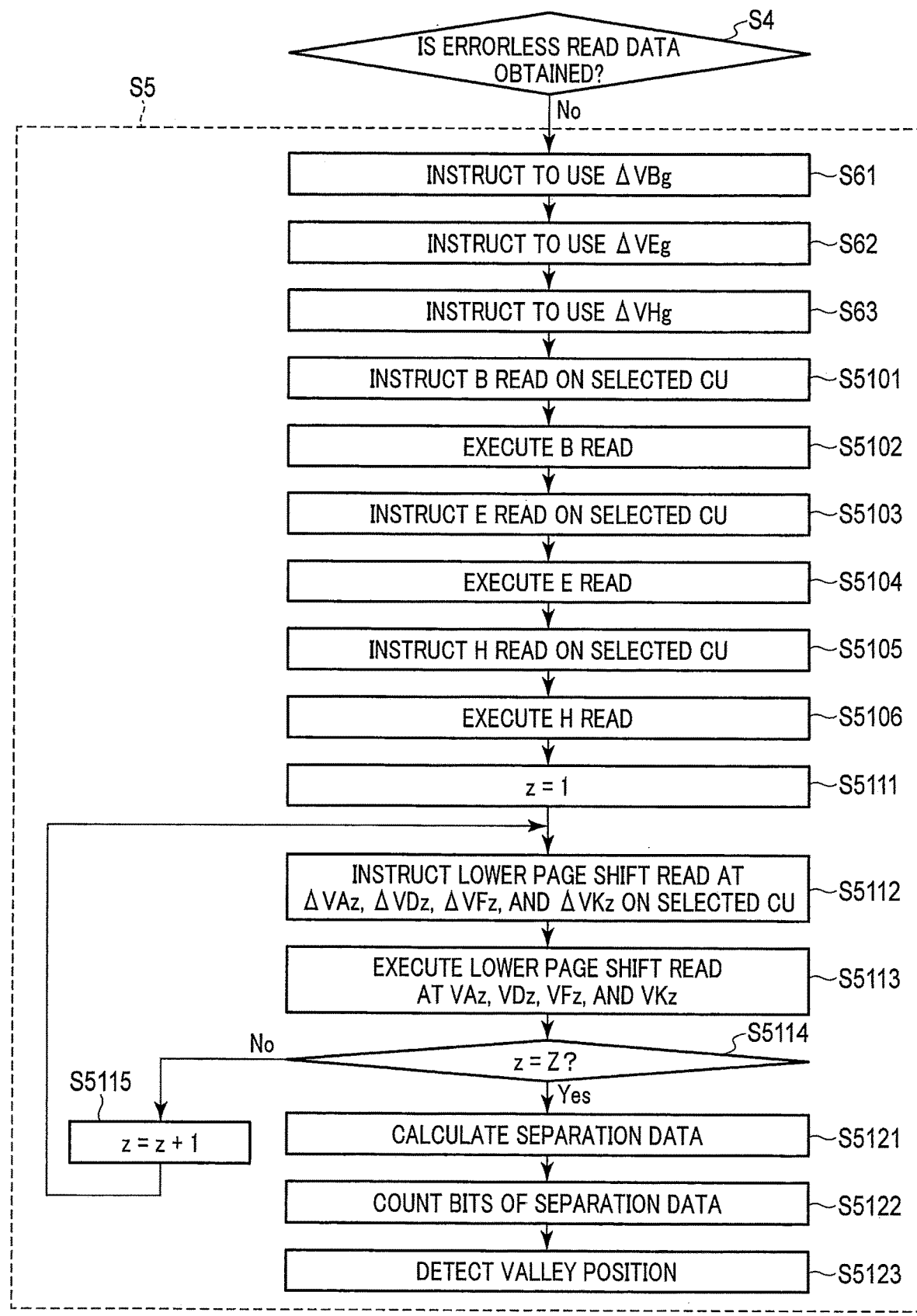
FIG. 34 shows a flowchart for an operation according to the fifth embodiment.

The memory controller 2 performs different single state reads for the different word line groups WLG. FIG. 34 is a flowchart for such an exemplary operation, showing a case in which the fifth embodiment is applied, as a representative embodiment, to the estimation of shifted boundary read voltages VCGRS for a lower page of the first embodiment, i.e., the flowchart in FIG. 10. In order to execute the flowchart in FIG. 34, the memory controller 2 stores set of data associated with each other in the form shown in FIG. 35.

As shown in FIG. 35, ΔVBg, ΔVEg, and ΔVHg are prepared for each word line group WLG. That is, ΔVBg0, ΔVEg0, and ΔVHg0 are prepared for the word line group WLG0. ΔVBg0, ΔVEg0, and ΔVHg0 may be equal to or different from each other. Likewise, ΔVBg1, ΔVEg1, and ΔVHg1, which may be equal to or different from each other, are prepared for the word line group WLG1. ΔVBg2, ΔVEg2, and ΔVHg2, which may be equal to or different from each other, are prepared for the word line group WLG2. ΔVBg3, ΔVEg3, and ΔVHg3, which may be equal to or different from each other, are prepared for the word line group WLG3.

As shown in FIG. 34, step S4 continues at step S61. In step S61, the memory controller 2 instructs the semiconductor memory 1 to use ΔVBg determined based on the address of the selected cell unit CU. More specifically, the memory controller 2 instructs one of ΔVBg0, ΔVBg1, ΔVBg2, and ΔVBg3 for the word line group WLG to which the selected word lines WL belong.

In step S62, the memory controller 2 instructs the semiconductor memory 1 to use ΔVEg determined based on the selected word line WL as in step S61.

In step S63, the memory controller 2 instructs the semiconductor memory 1 to use ΔVHg determined based on the selected word line WL as in step S61. Step S63 continues at step S5101.

Steps S61, S62, and S63 may be performed in an order different from that in the flowchart in FIG. 34. In addition, only one command may be used to perform instruction in the set of steps S61 to S63.

After step S5101, the semiconductor memory 1 uses the sum (=VB+ΔVBg) of the read voltage VB and a specified adjustment instead of the read voltage VB, uses the sum (=VE+ΔVEg) of the read voltage VE and a specified adjustment instead of the read voltage VE, and uses the sum (=VH+ΔVHg) of the read voltage VH and a specified adjustment instead of the read voltage VH.

Different single state reads for different word line groups WLG for the estimation of boundary read voltages in each of a middle page, an upper page, and a top page are the same as those described with reference to FIG. 35. That is, the read voltages VCGR for one or more single state reads required to calculate separation data required for the estimation of the shifted boundary read voltages VCGRS are specified for each selected page in steps like steps S61 to S63. In the case of a middle page, ΔVEg, ΔVHg, and ΔVKg are specified. Subsequently, VE+ΔVEg, VH+ΔVHg, and VK+ΔVKg are used instead of the read voltages VE, VH, and VK. In the case of an upper page, ΔVEg and ΔVKg are specified, and VE+ΔVEg and VK+ΔVKg are then used instead of the read voltages VE and VK. In the case of a top page, ΔVHg, ΔVKg, and ΔVNg are specified, and VH+ΔVHg, VK+ΔVKg, and VN+ΔVNg are then used instead of the read voltages VH, VK, and VN.

A case in which different sets of single state reads for different word line groups WLG for the estimation of the shifted boundary read voltages VCGRS are applied to the fourth embodiment is the same as a case in which they are applied to the first embodiment.

In a case in which different sets of single state reads for different word line groups WLG for the estimation of boundary read voltages are applied to the second or third embodiment, ΔVBg, ΔVEg, ΔVHg, ΔVKg, and ΔVNg are specified before steps S11 to S20 in FIG. 24 or 26. Thereafter, VB+ΔVBg, VE+ΔVEg, VH+ΔVHg, VK+ΔVKg, and VN+ΔVNg are used instead of the read voltages VB, VE, VH, VK, and VN.

According to the basic operation of the fifth embodiment, in addition to the advantages obtained through one or more of the first to fourth embodiments applied, the following advantages can be obtained. That is, using different search ranges for the different word line groups WLG allows for estimation of the read voltages VCGR from ranges more matched with inevitable characteristic variations of the memory cell transistors MT. This makes it possible to more accurately detect valleys between threshold distributions of the memory cell transistors MT.

Additionally performing the applied operation will produce the following advantages.

FIG. 36 shows the relationships between the threshold voltages of the memory cell transistors MT in a cell unit CU and the numbers of memory cell transistors MT immediately after write and after a lapse of time, and search ranges. Assume that the overall threshold voltage distribution curves have moved in the negative direction with a lapse of time, as indicated by the lower part in FIG. 36. Consider the cases of respectively generating the separation data FDr immediately after write and a time after the write.

In a state immediately after write, the read voltage VF and the default search range SR1 are used. In this case, the search range SR1 is sufficiently separated from the read voltage VE for masking. For this reason, in any of the separation data FDr obtained with shift read voltages VCGR in the search range SR1, bit information useful for the detection of a valley position is not masked by the E read data ED. That is, the search range SR1 is not narrowed.

In contrast, when a search range SR2 moved from the search range SR1 to the negative side due to lapse of time after write is used, part of the search range SR2 can overlap the read voltage VE. In such case, in the separation data FDr obtained with the shift read voltages VCGR equal to or lower than the read voltage VE in the search range SR2, bit information useful for the detection of a valley position can be masked by the E read data ED and lost. Such separation data FDr is not useful for the detection of a valley position. That is, the search range SR2 is narrower than the search range SR1.

Figure 37:
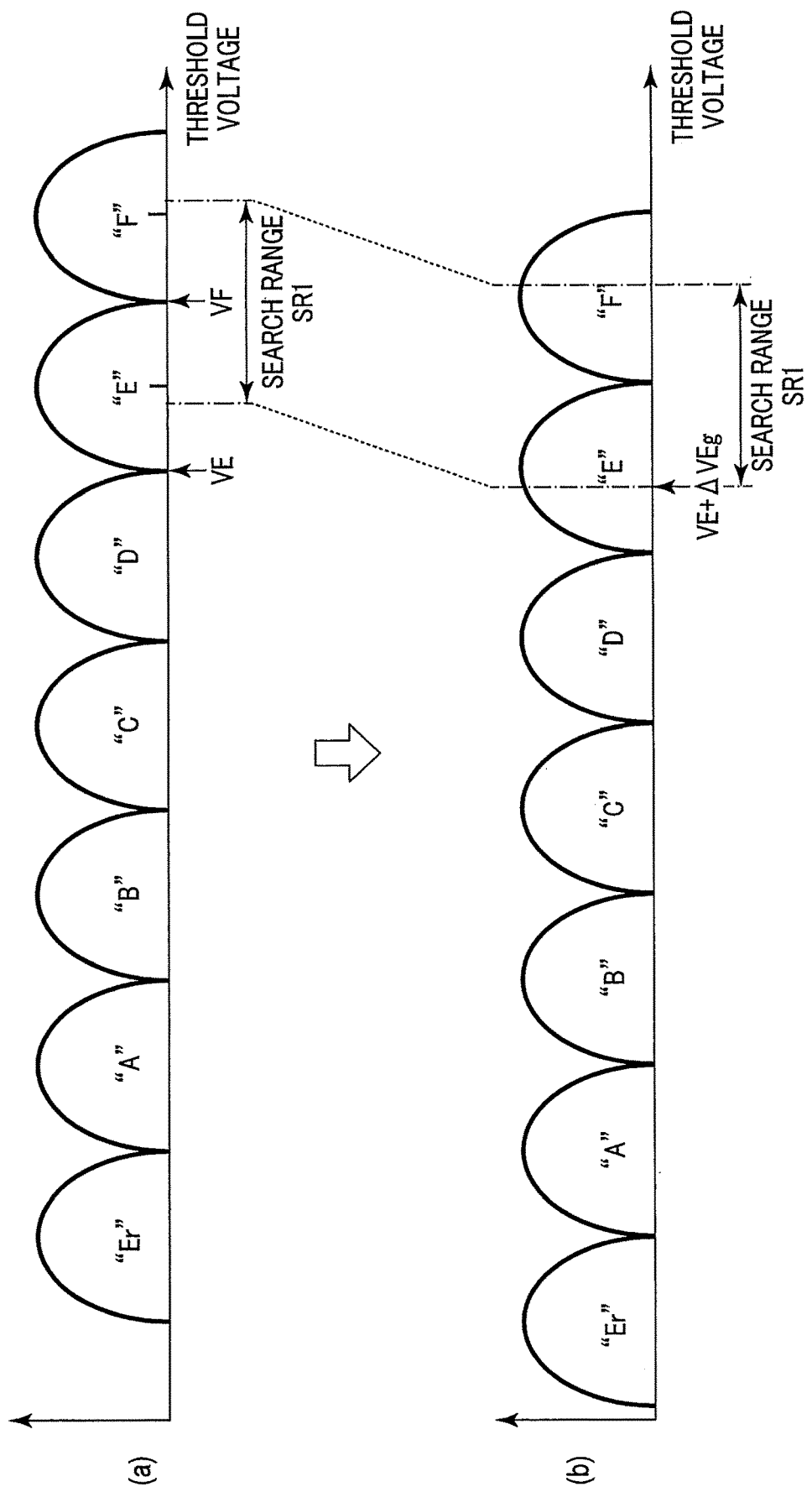
FIG. 37 shows search ranges according to the fifth embodiment.

According to the fifth embodiment, single read data used for valley position detection is obtained using the read voltage VCGR different from, in particular lower than the default read voltage VCGR. For example, like FIG. 36, FIG. 37 shows the relationships between the threshold voltages of the memory cell transistors MT in a cell unit CU and the numbers of memory cell transistors MT immediately after write and after a lapse of time, and search ranges. According to the example shown in FIG. 37, E read is performed with a read voltage VE+ΔVEg. This inhibits the search range SR1 from overlapping the read voltage VE+ΔVEg for single state read even when the search range SR1 for the estimation of the boundary read voltage VCGR between E state and F state is adjusted. This inhibits the loss of bits useful for valley position search in several separation data FDr obtained via several read voltages VCGR in the search range SR1. That is, the size of the search range SR1 is maintained. This makes it possible to estimate a valley position with higher accuracy than when a search range is narrowed as shown in FIG. 36.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a semiconductor memory including memory cells and a word line coupled to the memory cells, each of the memory cells being capable of storing four-bit data, and
a controller configured to:
read a first data item from the memory cells through application of a first voltage to the word line;
repeat a first operation to read first bit data in each of the memory cells, the first operation including applying a second voltage to the word line, the first operation including applying a third voltage to the word line after applying the second voltage, the third voltage having a magnitude different from that of the second voltage, the second voltage being changed within a first range every time the first operation is repeated, the third voltage being changed within a second range every time the first operation is repeated;
read a plurality of second data items by the repeating of the first operation; and
mask part of each of the second data items using the first data item.

2. The system of claim 1, wherein:
the first voltage has a magnitude between a magnitude of the second voltage and a magnitude of the third voltage.

3. The system of claim 2, wherein:
the controller is further configured to:
obtain a plurality of third data items through the masking with the first data item; and
determine a first read voltage within the first range and a second read voltage within the second range based on the third data items.

4. The system of claim 3, wherein:
the controller is further configured to apply a first read voltage and a second read voltage to the word line to read data stored in the memory cells.

5. The system claim 1, wherein:
the controller is further configured to determine the first range based on the word line.

6. The system claim 5, wherein:
the controller is further configured to determine the second range based on the word line.

7. The system of claim 1, wherein:
the controller is further configured to:
determine in which one of two states each of the memory cells is, based on the first voltage, to obtain the first data item; and
determine in which one of sixteen states each of the memory cells is to obtain one of the second data items.

8. The system of claim 7, wherein:
the first data item includes a plurality of first bits,
each of the first bits is based on in which one of two states one of the memory cells is, based on the first voltage,
each of the memory cells is capable of storing data in a first digit bit, a second digit bit, a third digit bit, and a fourth digit bit,
each of the second data items includes a plurality of second bits, and
each of the second bits of one of the second data items includes a data stored in the first digit bit of one of the memory cells.

9. The system of claim 1, wherein:
the controller is further configured to perform a logical operation on one of the second data items and the first data item to mask the one of the second data items.

10. The system of claim 1, wherein:
the controller is further configured to:
obtain a plurality of third data items through the masking with the first data item;
determine a plurality of first counts of memory cells estimated to have threshold voltages respectively corresponding to a plurality of voltages within the first range based on the third data items; and
detect, from the first counts, one or two or more second counts that are local minimum within the first range.

11. The system of claim 10, wherein
the controller is further configured to:
select, when the two or more second counts are detected, a third count from the two or more second counts that are nearest to a number of the memory cells×Y/16 (wherein Y is a natural number not larger than 16), and use a voltage corresponding to the third count to determine whether a threshold voltage of one of the memory cells is higher than a Yth lowest boundary voltage of fifteen boundary voltages.

12. The system of claim 5, wherein:
the controller is further configured to select the first voltage based on the first range.

* * * * *